US006839269B2

(12) United States Patent
Iwata et al.

(10) Patent No.: US 6,839,269 B2
(45) Date of Patent: Jan. 4, 2005

(54) MAGNETIC RANDOM ACCESS MEMORY

(75) Inventors: Yoshihisa Iwata, Yokohama (JP);
Tomoki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 10/180,517

(22) Filed: Jun. 27, 2002

(65) Prior Publication Data

US 2003/0123281 A1 Jul. 3, 2003

(30) Foreign Application Priority Data

Dec. 28, 2001 (JP) ........................................ 2001-401850

(51) Int. Cl.[7] ........................... G11C 11/14; G11C 7/14;
G11C 7/12; G11C 8/08
(52) U.S. Cl. ...................... 365/158; 365/171; 365/173;
365/203; 365/210; 365/189.09; 365/230.07
(58) Field of Search ................................ 365/130, 158,
365/171, 173, 203, 189.09, 210, 230.07

(56) References Cited

U.S. PATENT DOCUMENTS

| | | | |
|---|---|---|---|
| 5,282,104 A | | 1/1994 | Coutellier et al. |
| 5,894,447 A | | 4/1999 | Takashima |
| 6,169,686 B1 | | 1/2001 | Brug et al. |
| 6,259,644 B1 | | 7/2001 | Tran et al. |
| 6,317,375 B1 | | 11/2001 | Perner |
| 6,317,376 B1 | * | 11/2001 | Tran et al. ................... 365/158 |
| 6,341,084 B2 | * | 1/2002 | Numata et al. ............. 365/158 |
| 6,462,979 B2 | * | 10/2002 | Schlosser et al. ........... 365/158 |
| 6,490,190 B1 | * | 12/2002 | Ramcke et al. ............. 365/158 |
| 6,512,689 B1 | | 1/2003 | Naji et al. ................... 365/158 |
| 6,614,681 B2 | * | 9/2003 | Hidaka ........................ 365/171 |

FOREIGN PATENT DOCUMENTS

| | | |
|---|---|---|
| WO | WO 99/14760 | 3/1999 |
| WO | WO 99/18578 | 4/1999 |
| WO | WO 00/19441 | 4/2000 |
| WO | WO 00/42614 | 7/2000 |
| WO | WO 00/60600 | 10/2000 |

OTHER PUBLICATIONS

R. Scheuerlein, et al., ISSCC 2000/Session 7/TD:Emerging Memory & Device Technologies/Paper TA 7.2, pp. 128–129, 94–95, and 409–410, "A 10ns Read and Write Non–Volatile Memory Array Using a Magnetic Tunnel Junction and Fet Switch in Each Cell," Feb. 8, 2000.

M. Durlam, et al., ISSCC 2000 / Session 7 / TD: Emerging Memory & Device Technologies / Paper TA 7.3, pp. 130–131, 96–97, and 410–411, "Nonvolatile Ram Based on Magnetic Tunnel Junction Elements," Feb. 8, 2000.

P. K. Naji, et al., ISSCC 2001/Session 7/Technology Directions:Advanced Technologies/7.6, pp. 122–123, 438, 94–95, and 404–405, "A 256kb 3.DV1T1MTJ Nonvolatile Magnetoresistive RAM," 2001.

* cited by examiner

*Primary Examiner*—Son T. Dinh
*Assistant Examiner*—J. H. Hur
(74) *Attorney, Agent, or Firm*—Oblon, Spivak, McClelland, Maier & Neustadt, P.C.

(57) ABSTRACT

TMR elements are arranged at the intersections between word lines and bit lines. One end of each word line is connected to the ground point through a row select switch. One end of each bit line is connected to a bit line bias circuit. In read operation, the bit line bias circuit applies a bias potential to all the bit lines. The selected word line is short-circuited to the ground point. Unselected word lines are set in a floating state.

106 Claims, 40 Drawing Sheets

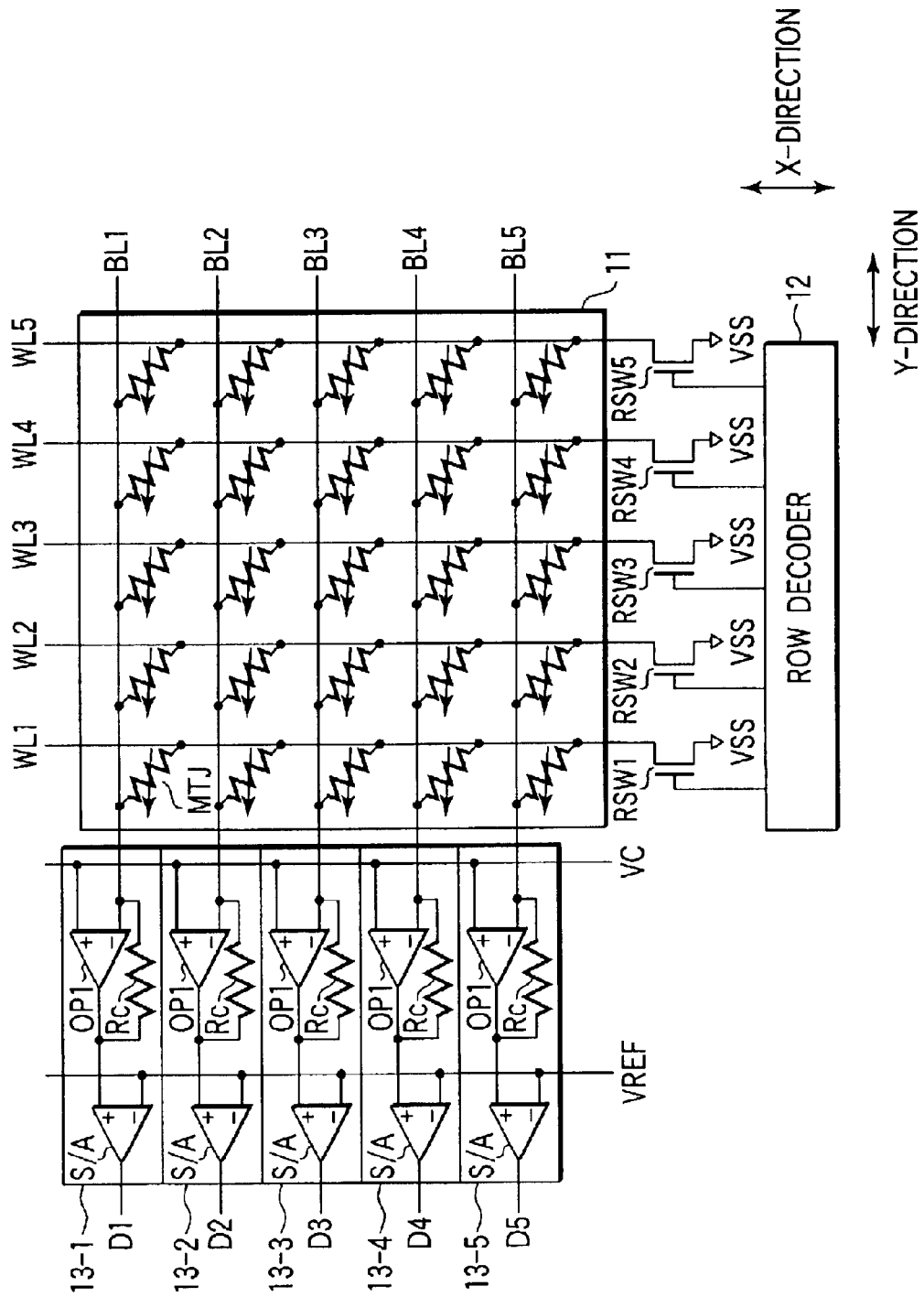
F I G. 2

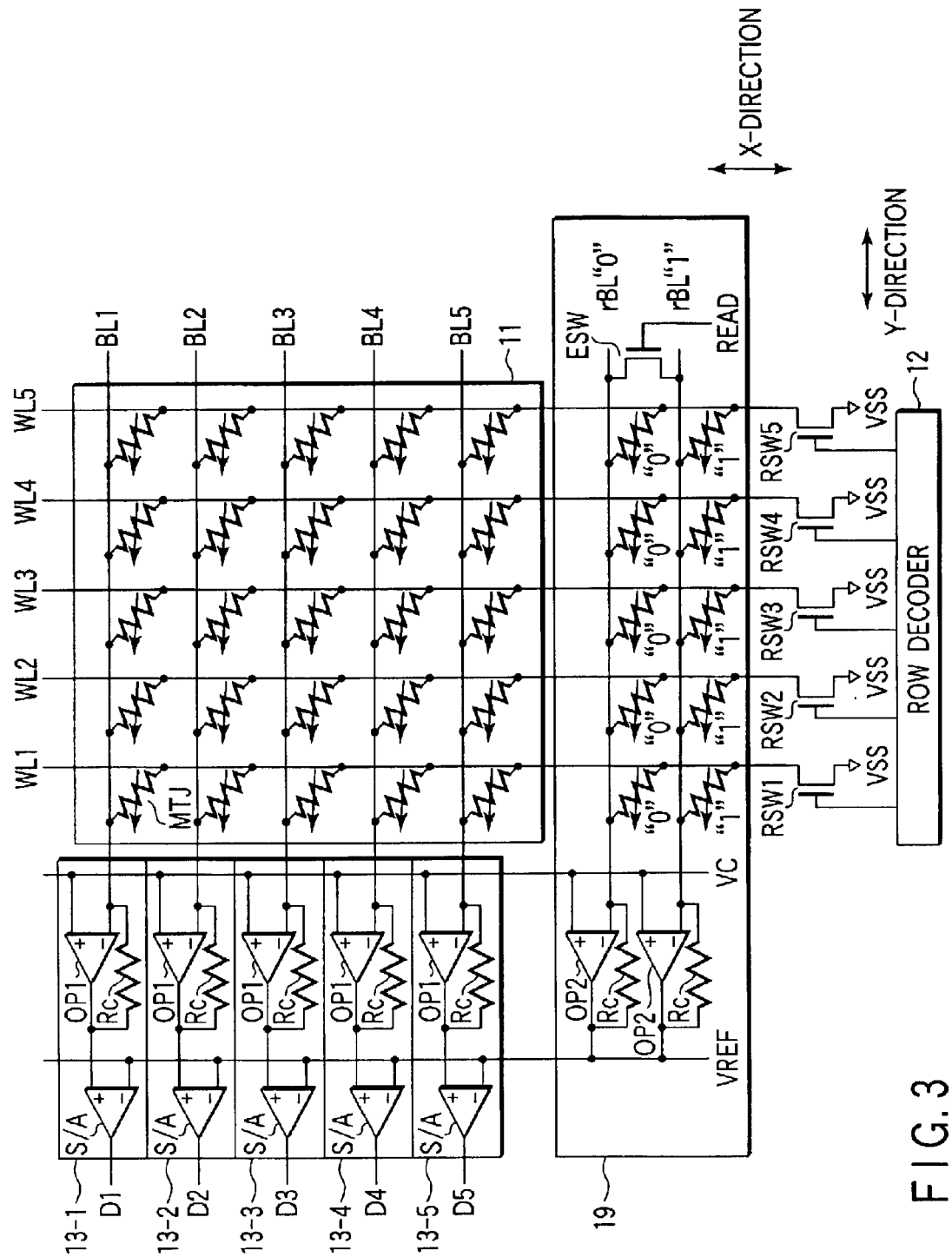
F I G. 3

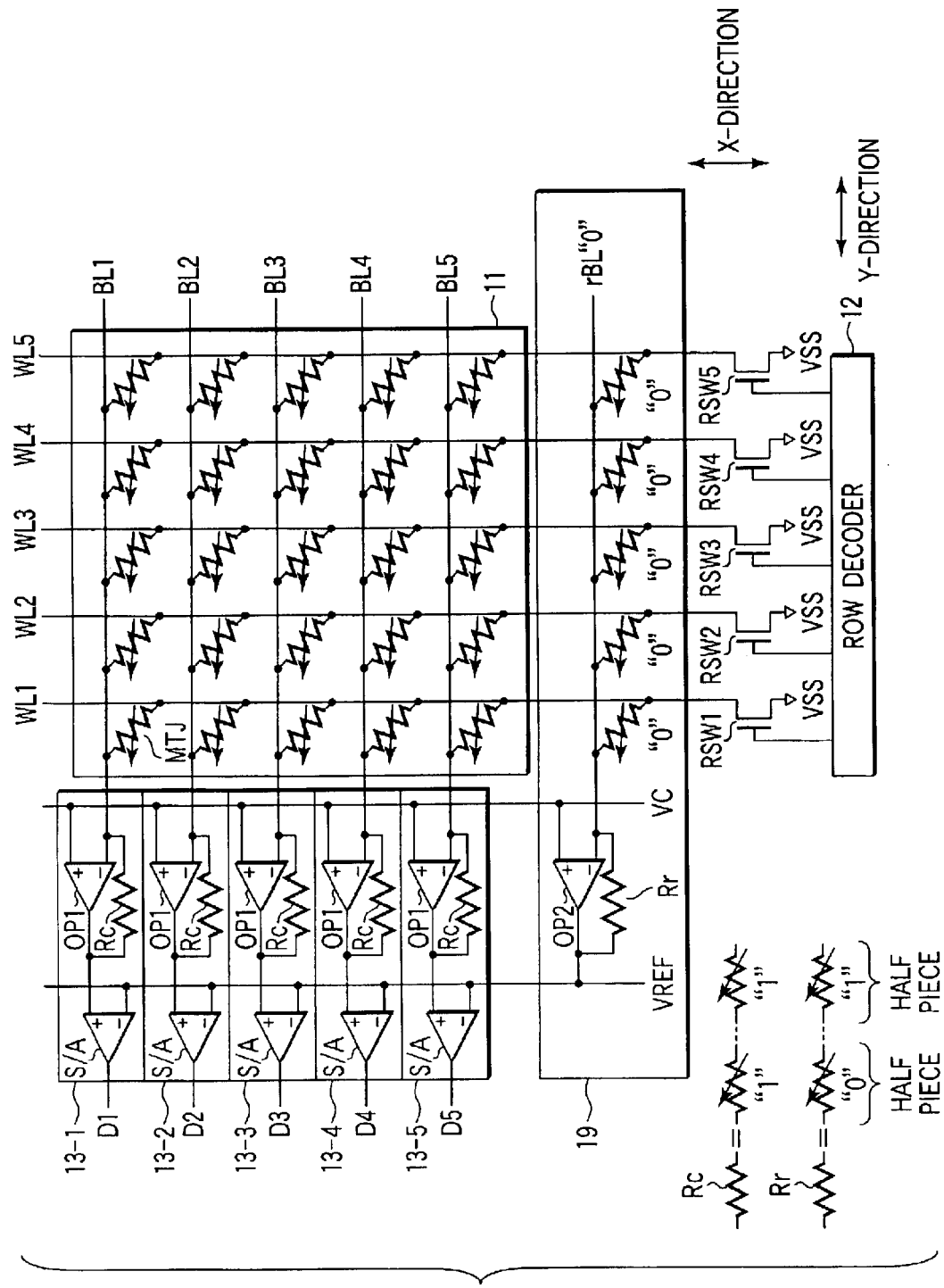
F I G. 5

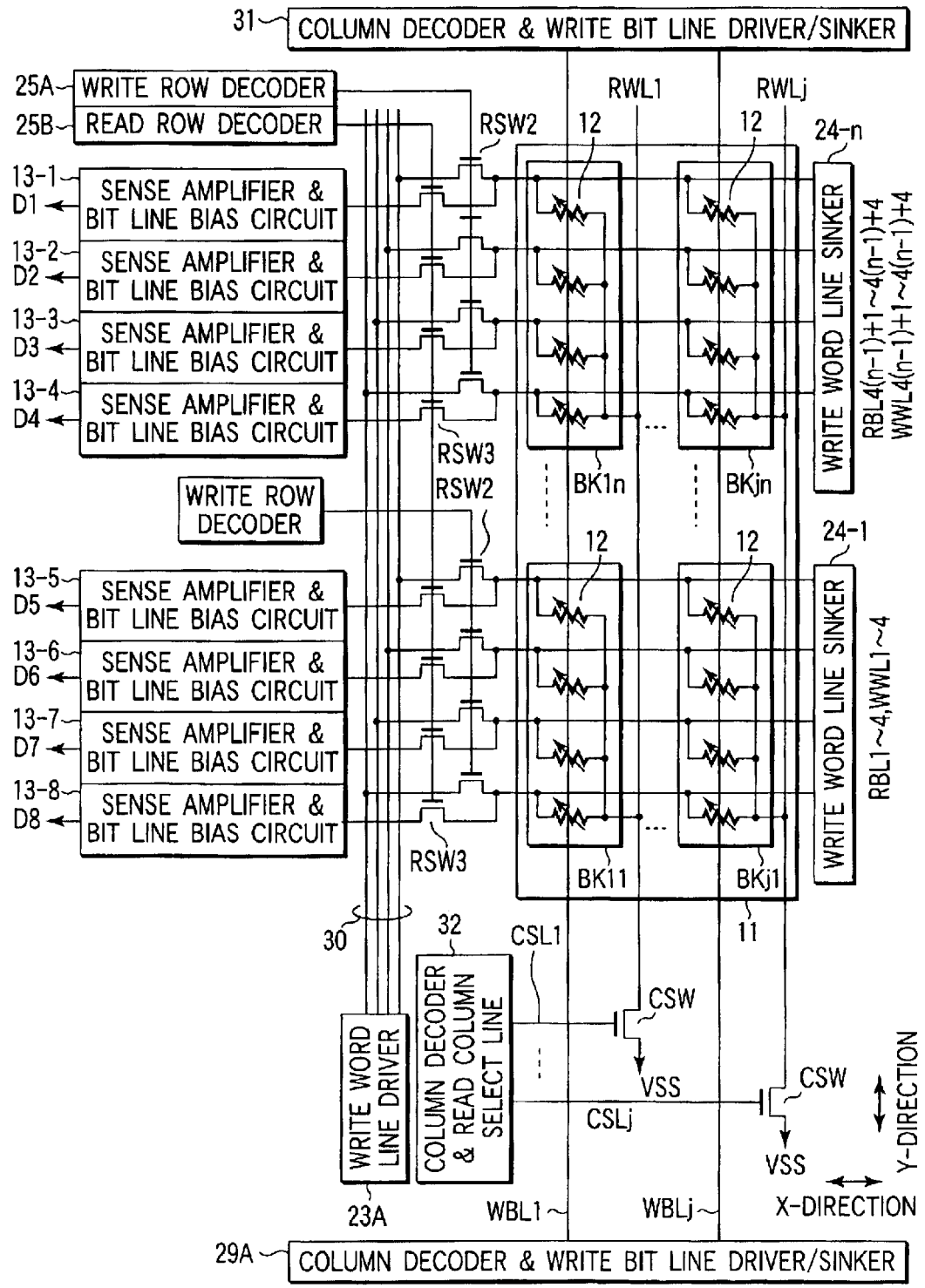
F I G. 31

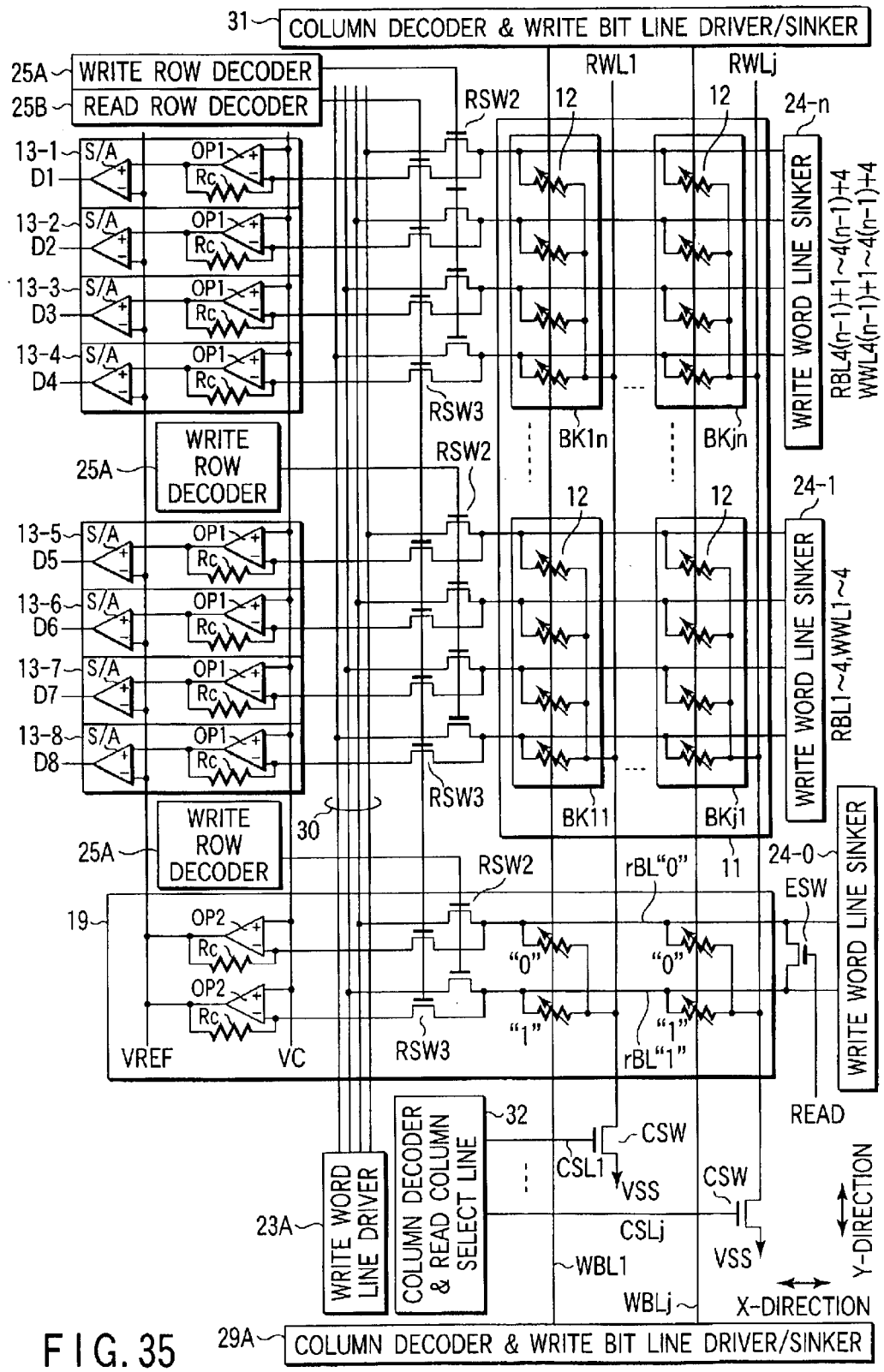
F I G. 35

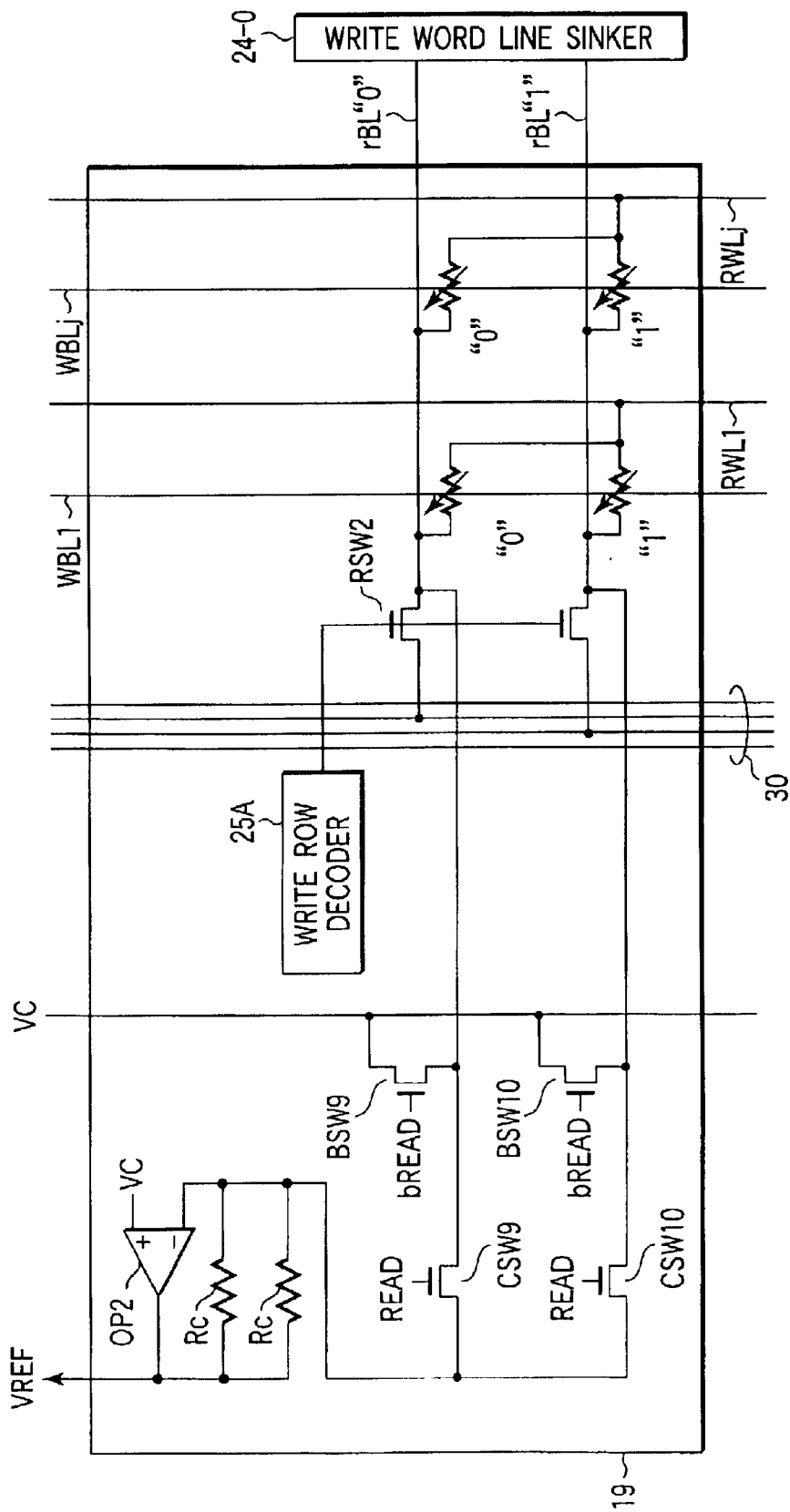
F I G. 40

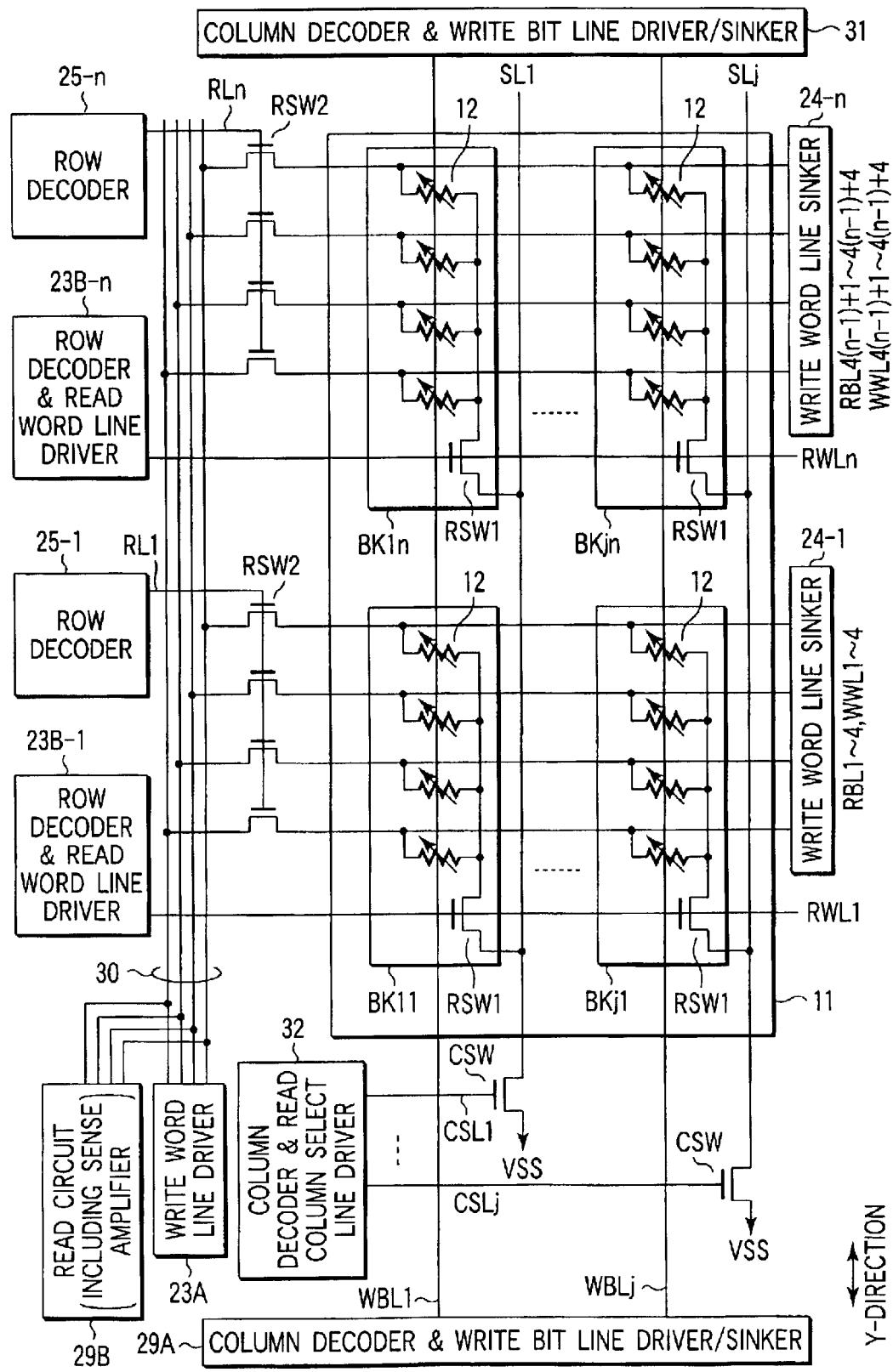
F I G. 41

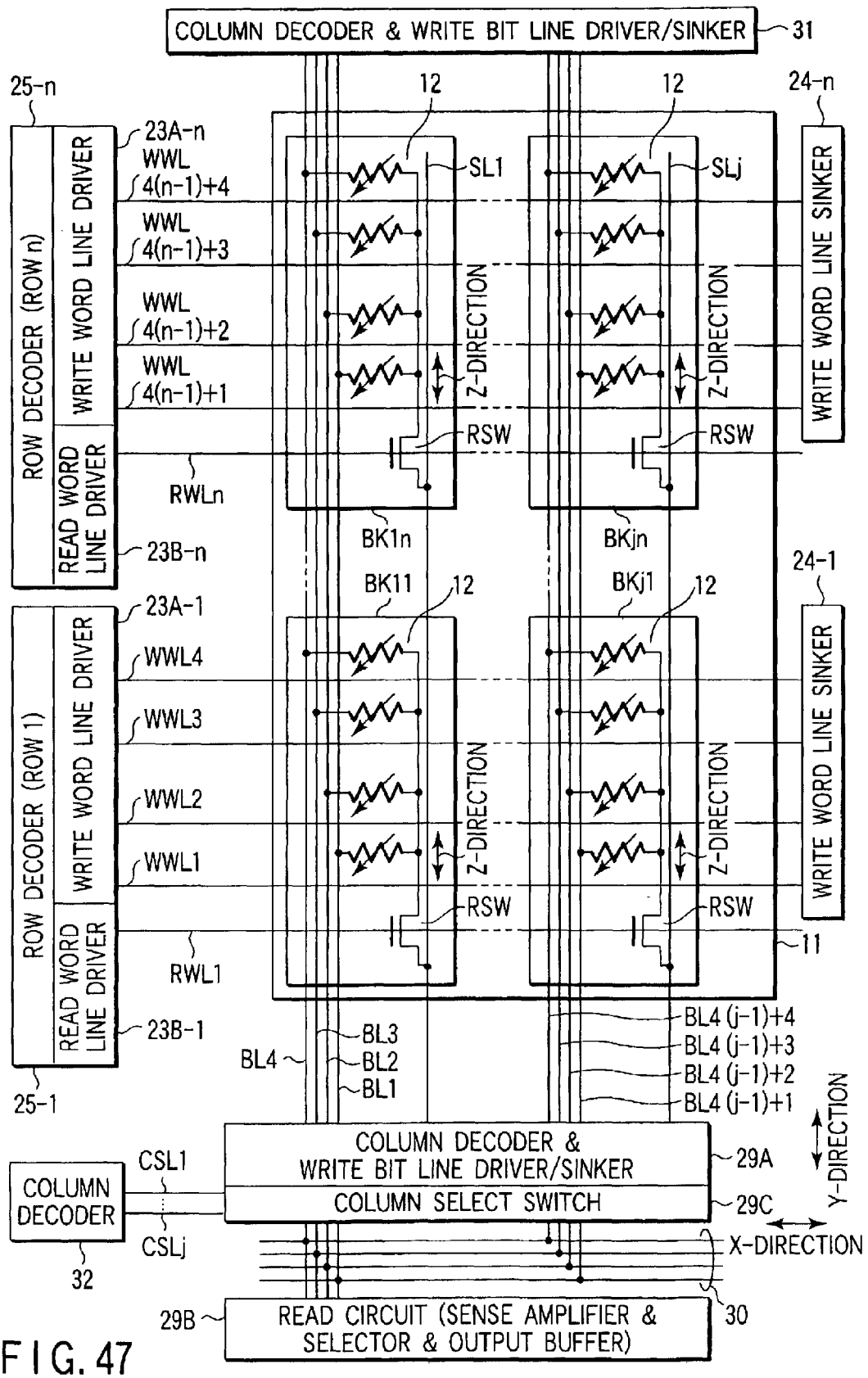
F I G. 47

X-DIRECTION

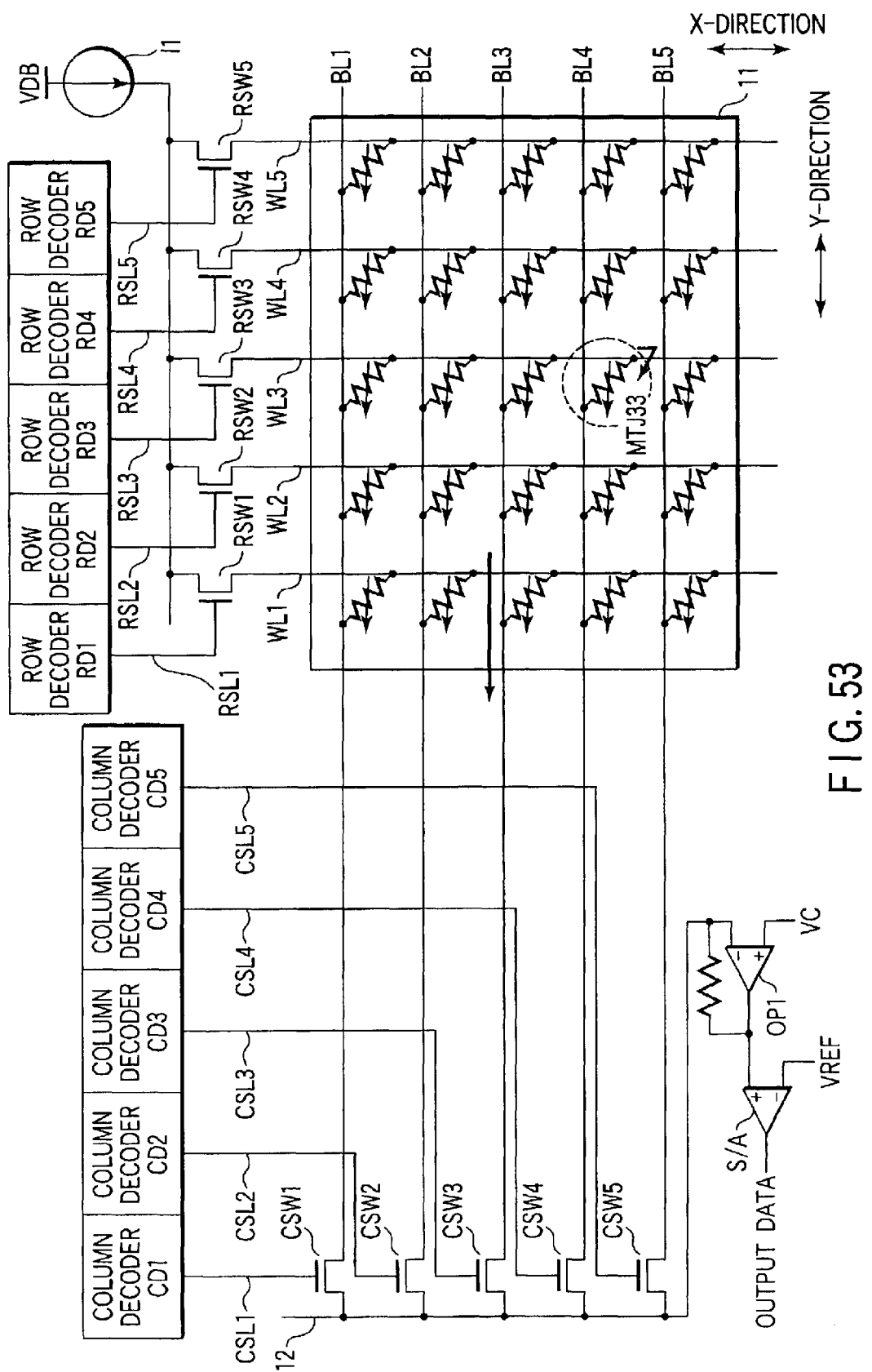
F I G. 53

MAGNETIC RANDOM ACCESS MEMORY

CROSS-REFERENCE TO RELATED APPLICATIONS

This application is based upon and claims the benefit of priority from the prior Japanese Patent Application No. 2001-401850, filed Dec. 28, 2001, the entire contents of which are incorporated herein by reference.

BACKGROUND OF THE INVENTION

1. Field of the Invention

The present invention relates to a magnetic random access memory (MRAM) which stores "1"- and "0"-data using a magnetoresistive effect.

2. Description of the Related Art

In recent years, many memories which store data by new principles have been proposed. One of them is a magnetic random access memory which stores "1"- and "0"-data using a tunneling magnetoresistive (to be referred to as TMR hereinafter) effect.

As a proposal for a magnetic random access memory, for example, Roy Scheuerlein et al, "A 10 ns Read and Write Non-Volatile Memory Array Using a Magnetic Tunnel Junction and FET Switch in each Cell", ISSCC2000 Technical Digest, p. 128 is known.

A magnetic random access memory stores "1"- and "0"-data using TMR elements. As the basic structure of a TMR element, an insulating layer (tunneling barrier) is sandwiched between two magnetic layers (ferromagnetic layers). However, various TMR element structures have been proposed to optimize the MR (MagnetoResistive) ratio.

Data stored in the TMR element is determined on the basis of whether the magnetizing states of the two magnetic layers are parallel or antiparallel. "Parallel" means that the two magnetic layers have the same magnetizing direction. "Antiparallel" means that the two magnetic layers have opposite magnetizing directions.

Normally, one (fixed layer) of the two magnetic layers has an antiferromagnetic layer. The antiferromagnetic layer serves as a member for fixing the magnetizing direction of the fixed layer. In fact, data ("1" or "0") stored in the TMR element is determined by the magnetizing direction of the other (free layer) of the two magnetic layers.

When the magnetizing states in the TMR element are parallel, the resistance of the insulating layer (tunneling barrier) sandwiched between the two magnetic layers of the TMR element is minimized. For example, this state is defined as a "1"-state. When the magnetizing states in the TMR element are antiparallel, the resistance of the insulating layer (tunneling barrier) sandwiched between the two magnetic layers of the TMR element is maximized. For example, this state is defined as a "0"-state.

Currently, various kinds of cell array structures have been examined for a magnetic random access memory from the viewpoint of increasing the memory capacity or stabilizing write/read operation.

For example, currently, a magnetic random access memory in which one memory cell is formed from one select MOS transistor and one TMR element (or an MTJ (Magnetic Tunnel Junction) element), and 1-bit data is stored using two memory cells is known.

However, in this magnetic random access memory, it is difficult to increase the memory capacity. This is because this cell array structure requires two TMR elements and two select MOS transistors to store 1-bit data.

A cell array structure in which TMR elements connected to word lines and bit lines are arranged at the intersections of the word lines and the bit lines, i.e., a cross-point cell array structure is known.

According to the cross-point cell array structure, the memory cell size can be reduced because no select MOS transistors are used. As a consequence, the memory capacity can be increased.

For example, when the minimum size of design rule is defined as "F", the size of a memory cell formed from a select MOS transistor and TMR element is $8F^2$. However, a memory cell including only a TMR element is $4F^2$. That is, the memory cell including only a TMR element can realize a cell size about ½ that of the memory cell formed from a select MOS transistor and TMR element.

However, in the cross-point cell array structure, since no select MOS transistor is present, a problem is posed in read operation.

In the cross-point cell array structure, a read current is supplied between the selected word line and the selected bit line. When the read current flows to the TMR element at the intersection between the selected word line and the selected bit line, the voltage drop amount of the selected TMR element is detected.

For example, as a known read method, the voltage applied across the selected TMR element is measured by 4-terminal resistance measurement and compared with a reference potential, thereby discriminating read data. As another known read method, one terminal of the selected TMR element is connected to one of two input terminals of an operational amplifier, and the output potential of the operational amplifier is compared with a reference potential, thereby discriminating read data.

In the latter read method using an operational amplifier, a ground potential is applied to the other input terminal of the operational amplifier. In addition, a resistive element is connected between the output terminal and one input terminal of the operational amplifier.

Let Rm be the resistance value of the TMR element, Ro be the resistance value of the resistive element connected between the output terminal and one input terminal of the operational amplifier, and Vm be the voltage applied across the TMR element. Since an output potential Vo of the operational amplifier is given by $Vm/Rm = -Vo/Ro$ $$Vo = -Vm \times (Ro/Rm) \qquad (1)$$

As is apparent from equation (1), in the read method using an operational amplifier, when Ro is sufficiently larger than Rm, a large gain can be obtained.

In either of the two read methods described above, a read current flows between the selected word line and the selected bit line.

In the cross-point cell array structure, however, since no select MOS transistor is connected to the TMR element, the read current flows through various paths via not only the selected TMR element but also other unselected TMR elements. For this reason, it is difficult to accurately evaluate the resistance value of only the selected TMR element (or the voltage applied across the TMR element).

For example, consider a magnetic random access memory having a cross-point cell array structure as shown in FIGS. 53 and 54.

In the read operation, for example, when an output signal RSL3 from a row decoder RD3 and an output signal CSL3 from a column decoder CD3 change to "H", a row select switch RSW3 and column select switch CSW3 are turned on.

As a result, in FIG. 53, the read current flows from a constant current source I1 to an operational amplifier OP1 through a word line WL3 and bit line BL3.

At this time, output signals RSL1, RSL2, RSL4, and RSL5 from row decoders RD1, RD2, RD4, and RD5 are "L". Output signals CSL1, CSL2, CSL4, and CSL5 from column decoders CD1, CD2, CD4, and CD5 are also "L".

Hence, unselected word lines WL1, WL2, WL4, and WL5 and unselected bit lines BL1, BL2, BL4, and BL5 are in a floating state.

That is, TMR elements connected to the unselected word lines WL1, WL2, WL4, and WL5 are short-circuited to each other at one terminal. The other terminal of each TMR element connected to a corresponding one of the unselected bit lines BL1, BL2, BL4, and BL5 is also short-circuited.

For this reason, as an equivalent circuit of the cross-point cell array structure in the read operation, unselected TMR elements are complexly connected in series or in parallel to a selected TMR element MTJ33. This means a decrease in read signal amount of the selected TMR element MTJ33. Consequently, it is difficult to accurately evaluate the resistance value of only the selected TMR element MTJ33 by a sense amplifier S/A.

Referring to FIG. 54, in the read operation, when the output signal RSL3 from the row decoder RD3 and the output signal CSL3 from the column decoder CD3 change to "H", the row select switch RSW3 and column select switch CSW3 are turned on. In addition, since signals bCSL1, bCSL2, bCSL4, and bCSL5 change to "H", transistors BSW1, BSW2, BSW4, and BSW5 are turned on.

As a result, the read current flows from the constant current source I1 to the operational amplifier OP1 through the word line WL3 and bit line BL3. In addition, the current flowing to the selected bit line BL3 flows toward a ground point VSS because of the input scheme of the operational amplifier OP1. Simultaneously, the read current flows toward the ground point VSS through the unselected bit lines BL1, BL2, BL4, and BL5.

The amount of the current that flows to the operational amplifier OP1 through the selected bit line BL3 is very small due to the influence of the current that flows through the unselected bit lines BL1, BL2, BL4, and BL5. Especially, at the start of read operation, the signal current does not flow to the operational amplifier OP1 at all, resulting in a delay in read operation.

The current that flows to the selected bit line BL3 also finally flows to the ground point VSS because of the input scheme of the operational amplifier OP1. When the unselected bit lines BL1, BL2, BL4, and BL5 in the parallelly connected state have low resistances, including the parasitic resistances, the necessary signal current does not flow to the operational amplifier OP1 even after the elapse of a sufficient time.

In FIGS. 53 and 54, in the paths from the selected word line WL3 to the selected bit line BL3, the primary path that passes through the selected TMR element MTJ33 and typical examples of other paths are indicated by arrows.

BRIEF SUMMARY OF THE INVENTION (1) According to a first aspect of the present invention, there is provided a magnetic random access memory comprising: a plurality of first interconnections; a plurality of second interconnections which cross the plurality of first interconnections; a plurality of memory cells which are arranged at intersections between the plurality of first interconnections and the plurality of second interconnections to store data using a magnetoresistive effect; and a bias circuit which applies a bias potential to all second interconnections electrically connected to a selected first interconnection when a read current is supplied between the selected first interconnection and a selected second interconnection.

According to a second aspect of the present invention, there is provided a magnetic random access memory comprising: a plurality of first interconnections; a plurality of second interconnections which cross the plurality of first interconnections; a first cell array structure formed from a plurality of first memory cells which are arranged at intersections between the plurality of first interconnections and the plurality of second interconnections to store data using a magnetoresistive effect; a plurality of third interconnections; a plurality of fourth interconnections which cross the plurality of third interconnections; and a second cell array structure stacked on the first cell array structure and formed from a plurality of second memory cells which are arranged at intersections between the plurality of third interconnections and the plurality of fourth interconnections to store data using a magnetoresistive effect.

According to a third aspect of the present invention, there is provided a magnetic random access memory comprising: a plurality of first interconnections; a plurality of second interconnections which cross the plurality of first interconnections; plurality of first memory cells which are arranged at intersections between the plurality of first interconnections and the plurality of second interconnections to store data using a magnetoresistive effect; a plurality of third interconnections which cross the plurality of second interconnections; and a plurality of second memory cells which are arranged at intersections between the plurality of second interconnections and the plurality of third interconnections to store data using a magnetoresistive effect.

(2) According to an aspect of the present invention, there is provided a read method of a magnetic random access memory, comprising: in performing a data read from a plurality of memory cells which are arranged at intersections between a plurality of first interconnections and a plurality of second interconnections crossing the plurality of first interconnections to store data using a magnetoresistive effect, applying a bias potential to each of the second interconnections electrically connected to a selected first interconnection when a read current is supplied between the selected first interconnection and a selected second interconnection.

BRIEF DESCRIPTION OF THE SEVERAL VIEWS OF THE DRAWING

FIG. 2 is a view showing Detailed Example 1 of Circuit Structure 1;

FIG. 3 is a view showing Detailed Example 2 of Circuit Structure 1;

FIG. 5 is a view showing Detailed Example 4 of Circuit Structure 1;

FIG. 31 is a view showing an application example 1 of a magnetic random access memory of the present invention;

FIG. 35 is a view showing a detailed example 2 of an application example 1;

FIG. 40 is a view showing an application example 4 of a magnetic random access memory of the present invention;

FIG. 41 is a view showing an application example 5 of a magnetic random access memory of the present invention;

FIG. 47 is a view showing an application example 7 of a magnetic random access memory of the present invention;

FIG. 53 is a view showing the circuit structure of a conventional magnetic random access memory.

DETAILED DESCRIPTION OF THE INVENTION

A magnetic random access memory of an aspect of the present invention will be described below in detail with reference to the accompanying drawings.

1. Structure of Main Part of Magnetic Random Access Memory

First, a main structure of a magnetic random access memory of an aspect of the present invention will be described below in detail.

A read circuit will be described below. For the descriptive convenience, a write circuit will be omitted.

(1) Circuit Structure 1

Figure 1:
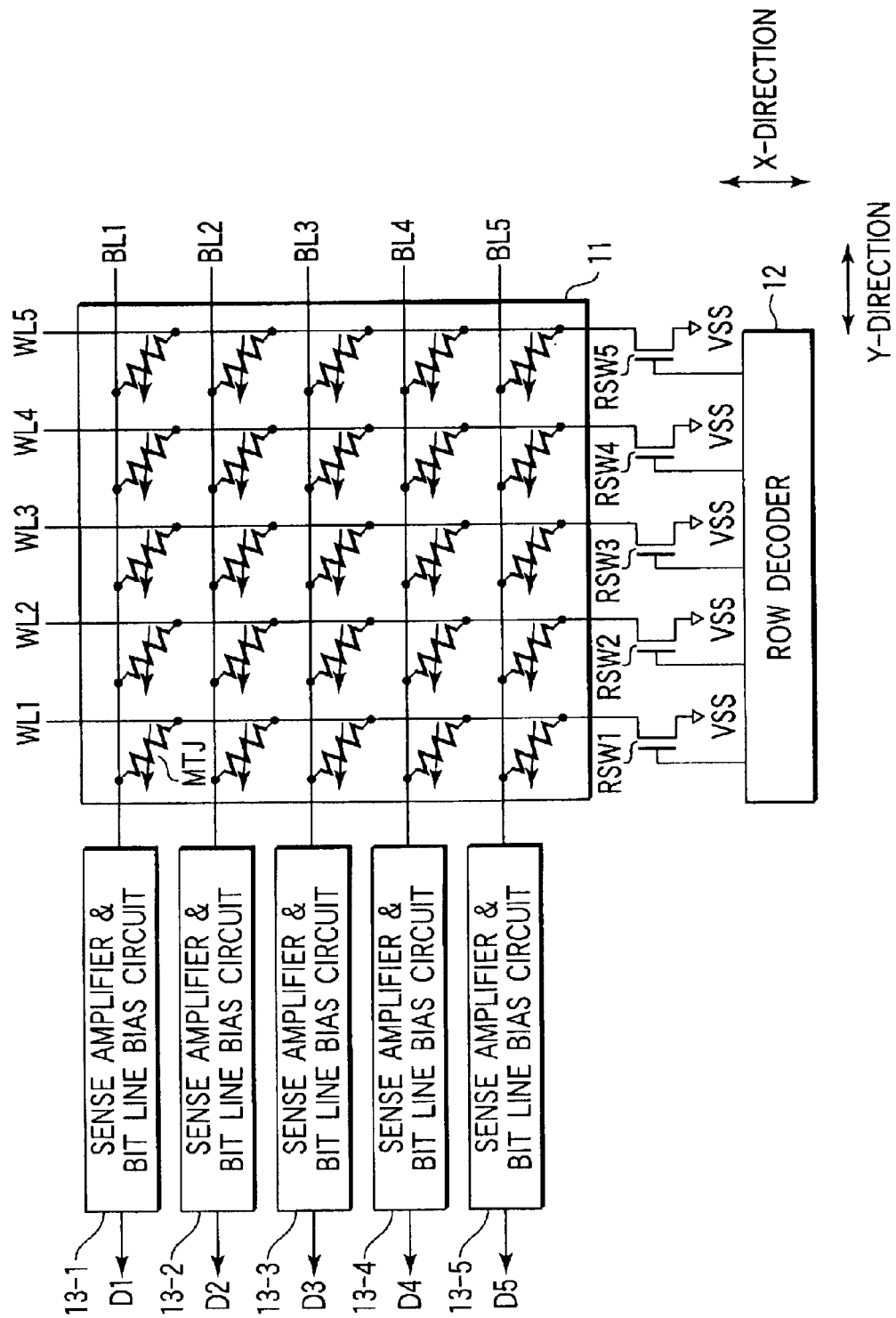
FIG. 1 is a view showing Circuit Structure 1 of a magnetic random access memory of the present invention.

FIG. 1 shows the circuit structure of a magnetic random access memory according to an embodiment of the present invention.

A memory cell array 11 is formed from a plurality of TMR elements (MTJ elements) MTJ arranged in an array. The TMR elements MTJ are arranged at the intersections between word lines WLi (i=1, 2, ..., 5) that run in the X-direction and bit lines BLi (i=1, 2, ..., 5) that run in the Y-direction. The TMR elements MTJ are connected between the word lines WLi and the bit lines BLi.

In this example, the memory cell array 11 is formed from 5×5 TMR elements MTJ for the descriptive convenience. Hence, the number of word lines WLi is five, and the number of bit lines BLi is also five.

This is merely an example. In the present invention, the size of the memory cell array 11 (the number of TMR elements) and the numbers of word lines WLi and bit line BLi are not limited.

One end of each word line WLi is connected to a ground point VSS through a corresponding row select switch RSWi (i=1, 2, ..., 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

As the row select switch RSWi, e.g., a MOS transistor can be employed, as shown in FIG. 1.

However, the row select switch RSWi is not limited to a MOS transistor. For example, a bipolar transistor, a MIS (Metal Insulator Semiconductor) transistor (including a MOSFET), a MES (Metal Semiconductor) transistor, or a junction transistor may be used.

One end of each bit line BLi is connected to a corresponding circuit block 13-$i$ ($i$=1, 2, ..., 5) including a sense amplifier and bit line bias circuit.

The bit line bias circuit applies a bias potential to the bit line BLi in read operation.

That is, in this example, in the read operation, the bias potential is applied to all the bit lines Bli connected to the selected word line WLi through the TMR elements MTJ, instead of applying the bias potential only to the selected bit line BLi. That is, in this example, all the bit lines BLi are set at an equipotential level, thereby blocking the current path from one bit line to another.

Additionally, in this example, sense amplifiers are connected to all the bit lines BLi connected to the selected word line WLi through the TMR elements MTJ. That is, in the read operation, the resistance values (data) of all the TMR elements MTJ connected to the selected word line WLi are read at once.

Sense amplifiers may be connected to all the bit lines BLi connected to the selected word line WLi through the TMR elements MTJ, as in this example. Alternatively, a sense amplifier may be connected to only the selected bit line BLi.

As described above, according to the magnetic random access memory of the present invention, the selected word line WLi is set at a predetermined potential (in this example, the ground potential) to read the read current. Unselected word lines are set in the floating state. All the bit lines BLi connected to the selected word line WLi through the TMR elements are set at a predetermined bias potential (e.g., a positive potential).

In the read operation, as an equivalent circuit of the cross-point cell array structure according to the present invention, only the selected TMR element is connected between the selected word line and the selected bit line. Hence, any decrease in read signal amount of the selected TMR element can be suppressed.

In addition, the sense amplifiers are connected to all the bit lines BLi connected to the selected word line WLi through the TMR elements MTJ. Hence, the read currents flow to all the bit lines BLi are equal. The amount of the signal current to the sense amplifier does not decrease, or no interference between the bit lines BLi occurs. For this reason, the read current stabilizes.

(2) Read Operation

Read operation when the magnetic random access memory shown in FIG. 1 is used will be described next.

In the read operation, the row decoder 12 selects one word line (row) WLi on the basis of a row address signal. Assume that a word line WL3 is selected by a row address signal. In this case, a row select switch RSW3 is turned on, and remaining row select switches RSW1, RSW2, RSW4, and RSW5 are turned off.

Hence, the selected word line WL3 is set at the ground potential. Unselected word lines WL1, WL2, WL4, and WL5 are set in the floating state.

In parallel to selection of the word line WL3 by the row decoder 12, bit line bias circuits 13-1, 13-2, ..., 13-5 apply a bias potential to all bit lines BL1, BL2, ..., BL5 connected to the selected word line WL3 through the TMR elements.

As a result, the read current flows from all the bit line bias circuits 13-1, 13-2, ..., 13-5 to the selected word line WL3 through all the bit lines BL1, BL2, ..., BL5 and all the TMR elements MTJ connected to the selected word line WL3.

The unselected word lines WL1, WL2, WL4, and WL5 are in the floating state and therefore are charged by the influence of the bit lines BL1, BL2, ..., BL5 to which the bias potential is applied. However, the potential of the unselected word lines WL1, WL2, WL4, and WL5 does not become higher than the potential (bias potential) of the bit lines BL1, BL2, ..., BL5.

For this reason, in the circuit shown in FIG. 1, no current path is formed from one bit line BLi to another bit line BLi through the unselected word lines WL1, WL2, WL4, and WL5.

Hence, as an equivalent circuit of the cross-point cell array structure in the read operation, only the selected TMR element is connected between the selected word line WL3 and the selected bit lines BL1, BL2, ..., BL5. Hence, the read signal amount of the selected TMR element does not decrease.

The sense amplifiers 13-1, 13-2, ..., 13-5 sense the potentials of the bit lines BLl, BL2, ..., BL5 when the read current is flowing, i.e., the resistance values of the selected TMR elements MTJ to determine data stored in the TMR elements MTJ connected to the selected word line WL3.

In this example, the read current flows from the bit lines BL1, BL2, ..., BL5 to the selected word line WL3. However, the direction of read current (the level relationship between the word line potential and the bit line potential) is not limited.

In this example, the resistance values (data) of all the TMR elements MTJ connected to the selected word line WL3 are read at once. Instead, the resistance value (data) of only the TMR element MTJ connected to the selected word line WLi and selected bit line BLi may be read.

In the present invention, power consumption in the read mode slightly increases as compared to the prior art. However, the power consumption is much smaller than that in the write mode and therefore poses no problem. The power consumption in the read mode is also much smaller than that of a DRAM or FeRAM which requires rewrite operation.

DETAILED EXAMPLES

Detailed examples of the magnetic random access memory shown in FIG. 1 and, more particularly, detailed examples of the read circuit will be described below.

① Detailed Example 1

FIG. 2 shows Detailed Example 1 of the magnetic random access memory of the present invention.

A memory cell array 11 is formed from a plurality of TMR elements MTJ arranged in an array. The TMR elements MTJ are arranged at the intersections between word lines WLi ($i$=1, 2, ..., 5) that run in the X-direction and bit lines BLi ($i$=1, 2, ..., 5) that run in the Y-direction. The TMR elements MTJ are connected between the word lines WLi and the bit lines BLi.

One end of each word line WLi is connected to a ground point VSS through a corresponding row select switch RSWi (i=1, 2, ..., 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

One end of each bit line BLi is connected to a corresponding circuit block 13-i (i=1, 2, ..., 5) including a sense amplifier and bit line bias circuit. The bit line bias circuit applies a bias potential to the bit line BLi in read operation.

In this example, each circuit block 13-i is constituted by an operational amplifier OP1, sense amplifier S/A, and resistive element Rc.

The bit line BLi is connected to the negative input terminal of the operational amplifier OP1 at the preceding stage. A clamp potential (bias potential) VC is applied to the positive input terminal of the operational amplifier OP1. The resistive element (feedback resistive element) Rc is connected between the output terminal and the negative input terminal of the operational amplifier OP1. The operational amplifier OP1 outputs an output potential to equalize the potential of the bit line BLi with the clamp potential.

The output terminal of the operational amplifier OP1 is connected to the positive input terminal of the sense amplifier (e.g., a differential amplifier) S/A. A reference potential VREF is applied to the negative input terminal of the sense amplifier S/A.

The sense amplifier S/A compares the output potential of the operational amplifier OP1 with the reference potential VREF, thereby discriminating read data.

Let Rm be the resistance value of the TMR element MTJ, Rc be the resistance value of the resistive element connected between the output terminal and the negative input terminal of the operational amplifier OP1, and Vm be the voltage applied across the TMR element. An output potential Vo of the operational amplifier is given by $$Vo = Vc \times (1 + Rc/Rm)$$

The sense amplifier S/A compares the output potential Vo with the reference potential VREF, thereby determining the resistance values (data) of the TMR elements MTJ connected to the selected word line WLi.

Sense amplifiers S/A may be connected to all the bit lines BLi connected to the selected word line WLi through the TMR elements MTJ, as in this example. Alternatively, a sense amplifier may be connected to only the selected bit line BLi.

According to Detailed Example 1 of the magnetic random access memory of the present invention, in the read operation, only the selected TMR element MTJ is connected between the selected word line WLi and the selected bit line BLi. Hence, the read signal amount of the selected TMR element MTJ does not decrease.

② Detailed Example 2

FIG. 3 shows Detailed Example 2 of the magnetic random access memory of the present invention.

Detailed Example 2 is an application example of Detailed Example 1 and shows a circuit which generates a reference potential VREF in Detailed Example 1 in detail.

Detailed Example 2 proposes a circuit which generates the reference potential VREF using TMR elements which store "0" data and TMR elements which store "1" data.

A memory cell array 11 is formed from a plurality of TMR elements MTJ arranged in an array. The TMR elements MTJ are arranged at the intersections between word lines WLi (i=1, 2, ..., 5) that run in the X-direction and bit lines BLi (i=1, 2, ..., 5) that run in the Y-direction. The TMR elements MTJ are connected between the word lines WLi and the bit lines BLi.

One end of each word line WLi is connected to a ground point VSS through a corresponding row select switch RSWi (i=1, 2, ..., 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

One end of each bit line BLi is connected to a corresponding circuit block 13-i (i=1, 2, ..., 5) including a sense amplifier and bit line bias circuit. The bit line bias circuit applies a bias potential to the bit line BLi in read operation.

In this example, each circuit block 13-i is constituted by an operational amplifier OP1, sense amplifier S/A, and resistive element Rc, as in Detailed Example 1.

The bit line BLi is connected to the negative input terminal of the operational amplifier OP1 at the preceding stage. A clamp potential (bias potential) VC is applied to the positive input terminal of the operational amplifier OP1. The resistive element Rc is connected between the output terminal and the negative input terminal of the operational amplifier OP1. The operational amplifier OP1 outputs an output potential to equalize the potential of the bit line BLi with the clamp potential.

The output terminal of the operational amplifier OP1 is connected to the positive input terminal of the sense amplifier S/A. The reference potential VREF is applied to the negative input terminal of the sense amplifier S/A.

The sense amplifier S/A compares the output potential of the operational amplifier OP1 with the reference potential VREF, thereby discriminating read data.

The reference potential VREF is generated by a reference potential generating circuit 19 including TMR elements (reference cells) which store "0" data and TMR elements (reference cells) which store "1" data.

The reference potential generating circuit 19 has bit lines rBL"0" and rBL"1" that run in the Y-direction.

At the intersections between all the word lines WLi and the bit line rBL"0", the TMR elements MTJ connected between these word lines WLi and the bit line rBL"0" are arranged. All the TMR elements MTJ arranged at the intersection between all the word lines WLi and the bit line rBL"0" store "0" data.

At the intersections between all the word lines WLi and the bit line rBL"1", the TMR elements MTJ connected between these word lines WLi and the bit line rBL"1" are arranged. All the TMR elements MTJ arranged at the intersection between all the word lines WLi and the bit line rBL"1" store "1" data.

According to this arrangement, in read operation, "0" data is read to the bit line rBL"0", and "1" data is read to the bit line rBL"1" always independently of the selected one of the five word lines WL1, WL2, ..., WL5.

In the read operation, when a read signal READ changes to "H", the bit lines rBL"0" and rBL"1" are short-circuited to each other by an equalize switch ESW.

Each of the bit lines rBL"0" and rBL"1" is connected to the negative input terminal of an operational amplifier OP2 whose circuit is same as the operational amplifier OP1. The output terminal of the operational amplifier OP2 connected to the bit line rBL"0" and the output terminal of the operational amplifier OP2 connected to the bit line rBL"1" are short-circuited to each other.

Like the operational amplifier OP1 of the read circuit, the clamp potential (bias potential) VC is input to the positive input terminal of the operational amplifier OP2. Additionally, a resistive element Rc is connected between the output terminal and the negative input terminal.

As a result, the reference potential VREF is output from the output terminal of the operational amplifier OP2.

According to Detailed Example 2 of the magnetic random access memory of the present invention, in the read operation, only the selected TMR element MTJ is connected between the selected word line WLi and the selected bit line BLi. Hence, the read signal amount of the selected TMR element MTJ does not decrease.

Furthermore, in Detailed Example 2, in the read operation, the reference potential VREF is generated using TMR elements which store "0" data and TMR elements which store "1" data. For this reason, the reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

③ Detailed Example 3

Figure 4:
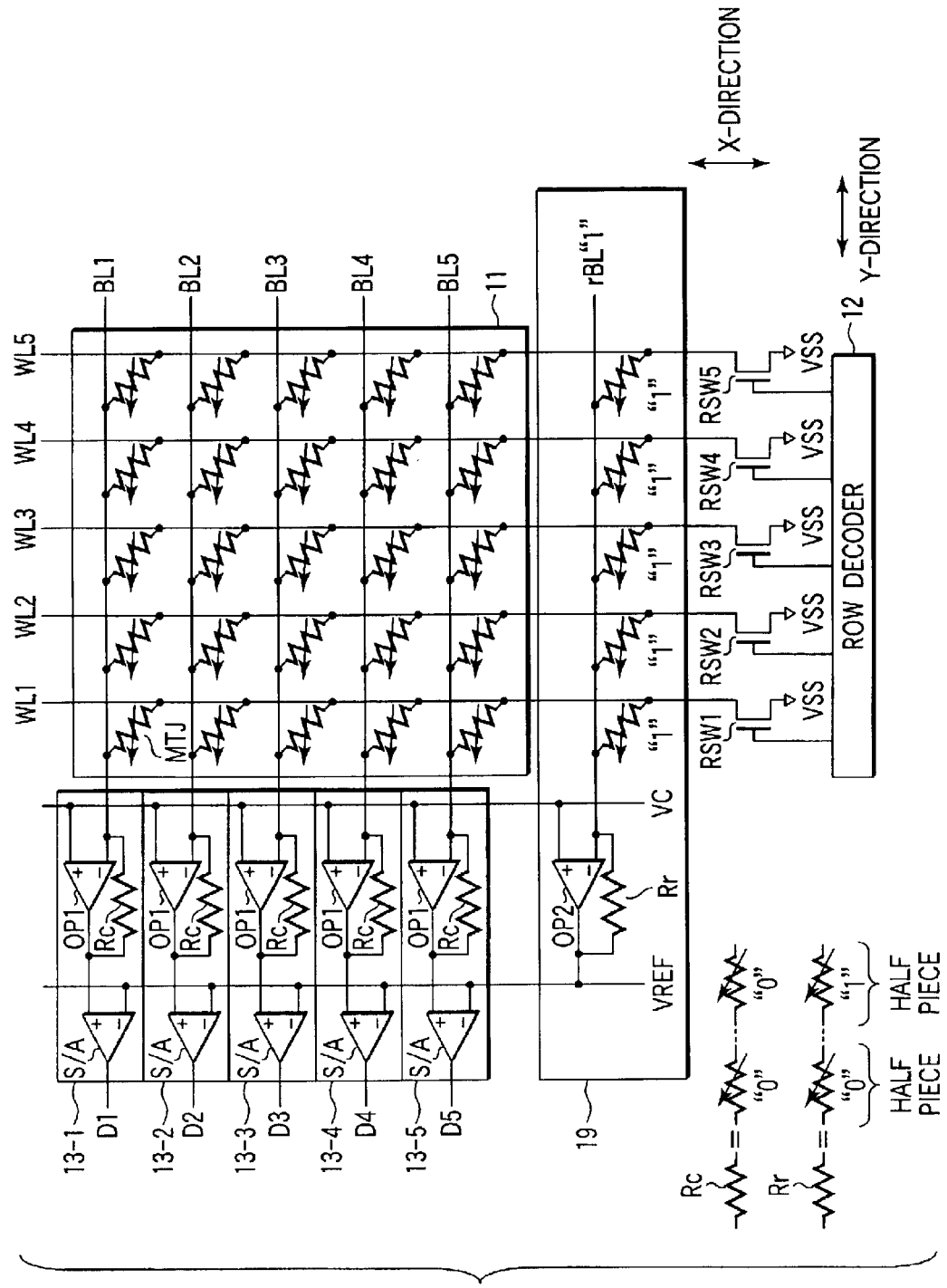
FIG. 4 is a view showing Detailed Example 3 of Circuit Structure 1.

FIG. 4 shows Detailed Example 3 of the magnetic random access memory of the present invention.

Detailed Example 3 is an improved example of Detailed Example 2 and simplifies the circuit structure of a reference potential generating circuit 19 in Detailed Example 2.

A memory cell array 11 is formed from a plurality of TMR elements MTJ arranged in an array. The TMR elements MTJ are arranged at the intersections between word lines WLi (i=1, 2, ..., 5) that run in the X-direction and bit lines BLi (i=1, 2, ..., 5) that run in the Y-direction. The TMR elements MTJ are connected between the word lines WLi and the bit lines BLi.

One end of each word line WLi is connected to a ground point VSS through a corresponding row select switch RSWi (i=1, 2, ..., 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

One end of each bit line BLi is connected to a corresponding circuit block 13-i (i=1, 2, ..., 5) including a sense amplifier and bit line bias circuit. The bit line bias circuit applies a bias potential to the bit line BLi in read operation.

In this example, each circuit block 13-i is constituted by an operational amplifier OP1, sense amplifier S/A, and resistive element Rc, as in Detailed Example 2.

The bit line BLi is connected to the negative input terminal of the operational amplifier OP1 at the preceding stage. A clamp potential (bias potential) VC is applied to the positive input terminal of the operational amplifier OP1. The resistive element Rc is connected between the output terminal and the negative input terminal of the operational amplifier OP1.

The output terminal of the operational amplifier OP1 is connected to the positive input terminal of the sense amplifier S/A. A reference potential VREF is applied to the negative input terminal of the sense amplifier S/A.

The sense amplifier S/A compares the output potential of the operational amplifier OP1 with the reference potential VREF, thereby discriminating read data.

The reference potential generating circuit 19 has a bit line rBL"1" that runs in the Y-direction. At the intersections between all the word lines WLi and the bit line rBL"1", the TMR elements (reference cells) MTJ connected between these word lines WLi and the bit line rBL"1" are arranged. All the TMR elements MTJ arranged at the intersection between all the word lines WLi and the bit line rBL"1" store "1" data.

The bit line rBL"1" is connected to the negative input terminal of an operational amplifier OP2. The clamp potential VC is input to the positive input terminal of the operational amplifier OP2. A resistive element Rr is connected between the output terminal and the negative input terminal of the operational amplifier OP2. The reference potential VREF is output from the output terminal of the operational amplifier OP2.

Each of the resistive element Rc connected to the operational amplifier OP1 on the data cell side and used to read data and the resistive element Rr connected to the operational amplifier OP2 whose circuit is same as the operational amplifier OP1 on the reference cell side and used to generate the reference potential VREF is formed from an even number of TMR elements (TMR elements having the same structure as the TMR element MTJ serving as a memory cell) connected in series.

All the even number of TMR elements that construct the resistive element Rc are set in a state wherein data "0" is written (a low resistance state). On the other hand, a half of the even number of TMR elements that construct the resistive element Rr is set in a state wherein data "0" is written (a low resistance state). The remaining half is set in a state wherein data "1" is written (a high resistance state).

According to this arrangement, in the read operation, data of the TMR elements MTJ connected to the selected word line WLi are read to the bit lines BLi, and "1" data is read to the bit line rBL"1".

The reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

④ Detailed Example 4

FIG. 5 shows Detailed Example 4 of the magnetic random access memory of the present invention.

Detailed Example 3 is also an improved example of Detailed Example 2. Detailed Example 4 proposes a technique of generating a reference potential VREF by the same principle as that of Detailed Example 3 except that the "0"/"1" relationship is reversed to that of Detailed Example 3.

A memory cell array 11 is formed from a plurality of TMR elements MTJ arranged in an array. The TMR elements MTJ are arranged at the intersections between word lines WLi (i=1, 2, . . . , 5) that run in the X-direction and bit lines BLi (i=1, 2, . . . , 5) that run in the Y-direction. The TMR elements MTJ are connected between the word lines WLi and the bit lines BLi.

One end of each word line WLi is connected to a ground point VSS through a corresponding row select switch RSWi (i=1, 2, . . . , 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

One end of each bit line BLi is connected to a corresponding circuit block 13-$i$ (i=1, 2, . . . , 5) including a sense amplifier and bit line bias circuit. The bit line bias circuit applies a bias potential to the bit line BLi in read operation.

In this example, each circuit block 13-$i$ is constituted by an operational amplifier OP1, sense amplifier S/A, and resistive element Rc, as in Detailed Example 2.

The bit line BLi is connected to the negative input terminal of the operational amplifier OP1 at the preceding stage. A clamp potential (bias potential) VC is applied to the positive input terminal of the operational amplifier OP1. The resistive element Rc is connected between the output terminal and the negative input terminal of the operational amplifier OP1.

The output terminal of the operational amplifier OP1 is connected to the positive input terminal of the sense amplifier S/A. The reference potential VREF is applied to the negative input terminal of the sense amplifier S/A.

The sense amplifier S/A compares the output potential of the operational amplifier OP1 with the reference potential VREF, thereby discriminating read data.

The reference potential generating circuit 19 has a bit line rBL"0" that runs in the Y-direction. At the intersections between all the word lines WLi and the bit line rBL"0", the TMR elements (reference cells) MTJ connected between these word lines WLi and the bit line rBL"0" are arranged. All the TMR elements MTJ arranged at the intersection between all the word lines WLi and the bit line rBL"0" store "0" data.

The bit line rBL"0" is connected to the negative input terminal of an operational amplifier OP2. The clamp potential VC is input to the positive input terminal of the operational amplifier OP2. A resistive element Rr is connected between the output terminal and the negative input terminal of the operational amplifier OP2. The reference potential VREF is output from the output terminal of the operational amplifier OP2.

Each of the resistive element Rc connected to the operational amplifier OP1 on the data cell side and used to read data and the resistive element Rr connected to the operational amplifier OP2 whose circuit is same as the operational amplifier OP1 on the reference cell side and used to generate the reference potential VREF is formed from an even number of TMR elements (TMR elements having the same structure as the TMR element MTJ serving as a memory cell) connected in series.

All the even number of TMR elements that construct the resistive element Rc are set in a state wherein data "1" is written (a high resistance state). On the other hand, a half of the even number of TMR elements that construct the resistive element Rr is set in a state wherein data "0" is written (a low resistance state). The remaining half is set in a state wherein data "1" is written (a high resistance state).

According to this arrangement, in the read operation, data of the TMR elements MTJ connected to the selected word line WLi are read to the bit lines BLi, and "0" data is read to the bit line rBL"0".

The reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

(4) Read Circuit

Figure 6:
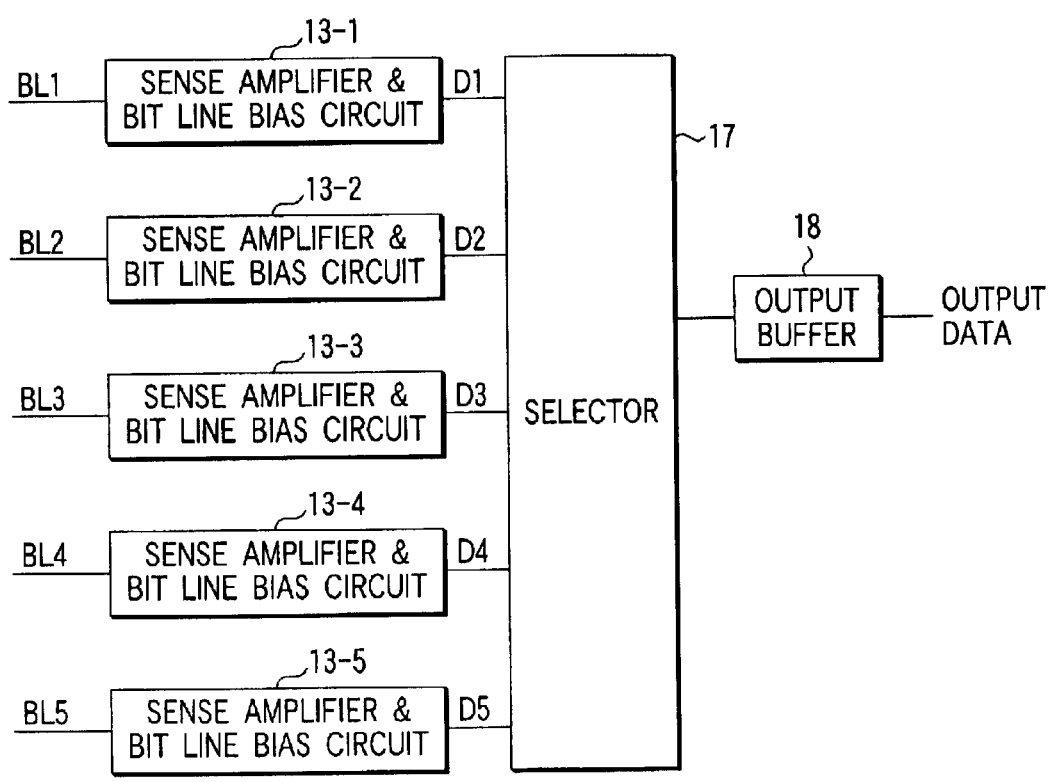
FIG. 6 is a view showing an example of a read circuit.
Figure 7:
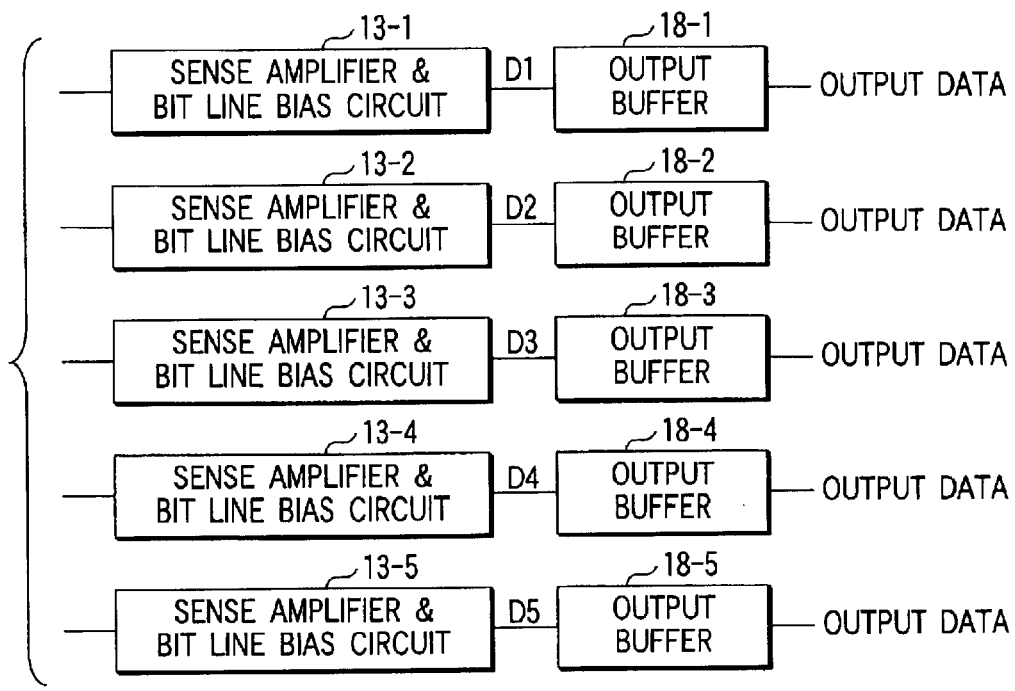
FIG. 7 is a view showing another example of the read circuit.

FIGS. 6 and 7 show examples of the read circuit.

The read circuit shown in FIG. 6 corresponds to the magnetic random access memories shown in FIGS. 1 to 5. This example assumes a 1-bit-type magnetic random access memory which outputs read data bits one by one.

The read circuit has sense amplifiers & bit line bias circuits 13-$i$ (i=1, 2, . . . , 5), a selector 17, and an output buffer 18. The sense amplifiers & bit line bias circuits 13-$i$ correspond to the sense amplifiers & bit line bias circuits 13-$i$ shown in FIGS. 1 to 5.

In the read operation, data of the TMR elements MTJ connected to the selected word line WLi are input to the sense amplifiers & bit line bias circuits 13-$i$ through the bit lines BLi. The sense amplifiers & bit line bias circuits 13-$i$ output read data Di (i=1, 2, . . . , 5).

The selector 17 selects one of the data Di and supplies the selected data Di to the output buffer 18. The selector 17 is formed from, e.g., a CMOS-type transfer gate and selects one of the data Di on the basis of the lower bits of a column address signal (the number of bits is determined by the number of data to be selected).

The read circuit shown in FIG. 7 also corresponds to the magnetic random access memories shown in FIGS. 1 to 5. This example assumes a plurality-bit-type magnetic random access memory which outputs a plurality of read data bits each time.

In this case, for example, the data of the TMR elements MTJ connected to the selected word line WLi can be read from the chip at once.

The read circuit has sense amplifiers & bit line bias circuits 13-$i$ (i=1, 2, . . . , 5) and output buffers 18-$i$ (i=1, 2, . . . , 5). The sense amplifiers & bit line bias circuits 13-$i$ correspond to the sense amplifiers & bit line bias circuits 13-$i$ shown in FIGS. 1 to 5.

In the read operation, data of the TMR elements MTJ connected to the selected word line WLi are input to the sense amplifiers & bit line bias circuits 13-$i$ through the bit lines BLi. The sense amplifiers & bit line bias circuits 13-$i$ output read data Di (i=1, 2, . . . , 5).

The read data Di are output from the chip through the output buffers 18-$i$.

Figure 8:
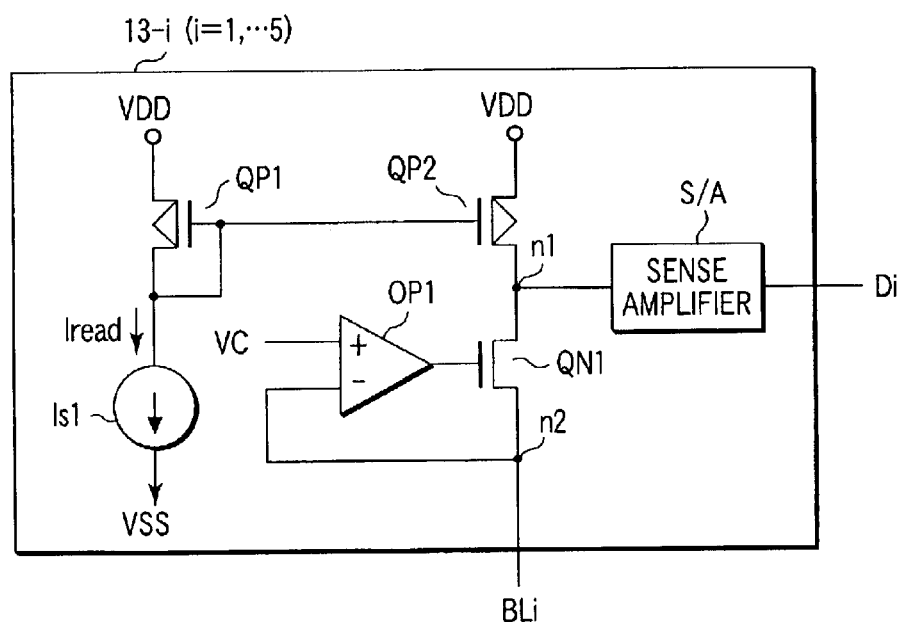
FIG. 8 is a view showing an example of a sense amplifier & bit line bias circuit.

FIG. 8 shows a circuit example of the sense amplifier & bit line bias circuit.

A circuit example of the sense amplifier & bit line bias circuit has already been described with reference to FIG. 2. Another example of the sense amplifier & bit line bias circuit which can be applied to the magnetic random access memories shown in FIGS. 1 to 5 will be described here.

A sense amplifier S/A is formed from, e.g., a differential amplifier.

A PMOS transistor QP2 and NMOS transistor QN1 are connected in series between a power supply terminal VDD and the bit line BLi. The negative input terminal of the operational amplifier OP1 is connected to a node n2 (bit line BLi). The output terminal of the operational amplifier OP1 is connected to the gate of the NMOS transistor QN1. The clamp potential VC is input to the positive input terminal of the operational amplifier OP1.

The operational amplifier OP1 controls the gate potential of the NMOS transistor QN1 so as to equalize the potential of the node n2 with the clamp potential VC. The clamp potential VC is set to a predetermined positive value.

A constant current source Is1 generates a read current Iread. The read current Iread is supplied to the bit line BLi through a current mirror circuit formed from PMOS transistors QP1 and QP2. The sense amplifier formed from, e.g., a differential amplifier senses the data of a memory cell (TMR element) on the basis of the potential of a node n1 when the read current Iread is flowing.

Figure 9:
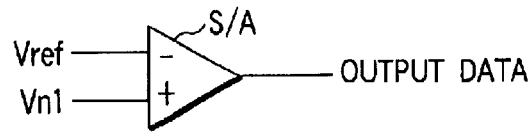
FIG. 9 is a view showing an example of a sense amplifier.
Figure 10:
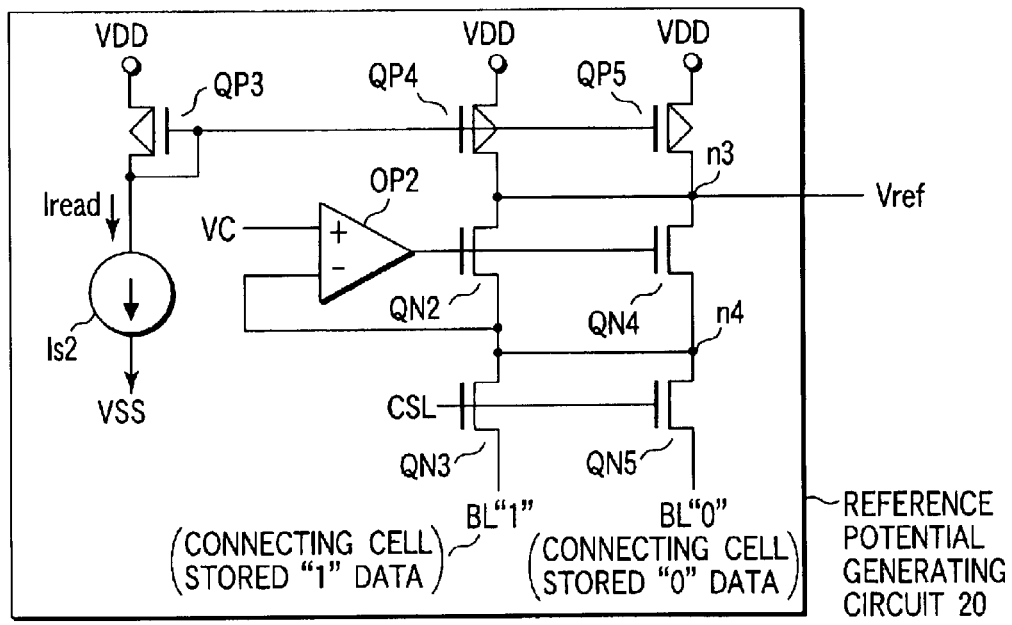
FIG. 10 is a view showing an example of a reference potential generating circuit.

FIG. 9 shows a circuit example of the sense amplifier. FIG. 10 shows a circuit example of the reference potential generating circuit of the sense amplifier.

The sense amplifier S/A is formed from, e.g., a differential amplifier. The sense amplifier S/A compares a potential Vn1 of the node n1 with a reference potential Vref.

The reference potential Vref is generated from a TMR element which stores "1" data and a TMR element which stores "0" data.

A PMOS transistor QP4 and NMOS transistor QN2 are connected in series between the power supply terminal VDD and the TMR element which stores "1" data. A PMOS transistor QP5 and NMOS transistor QN4 are connected in series between the power supply terminal VDD and the TMR element which stores "0" data.

The drains of the PMOS transistors QP4 and QP5 are connected to each other. The drains of the NMOS transistors QN2 and QN4 are also connected to each other.

The operational amplifier OP2 controls the gate potentials of the NMOS transistors QN2 and QN4 so as to equalize the potential of a node n4 with the clamp potential VC. A constant current source Is2 generates the read current Iread. The read current Iread flows to the TMR element which stores "1" data and TMR element which stores "0" data through a current mirror circuit formed from the PMOS transistors QP3 and QP4.

The reference potential Vref is output from a node n3.

Assume that Is1=Is2, the PMOS transistors QP1, QP2, QP3, QP4, and QP5 have the same size, and the NMOS transistors QN1, QN2, and QN4 have the same size. In this case, the reference potential Vref can be set to the intermediate value between a potential Vn1 when "1" data is output and that when "0" data is output.

Figure 11:
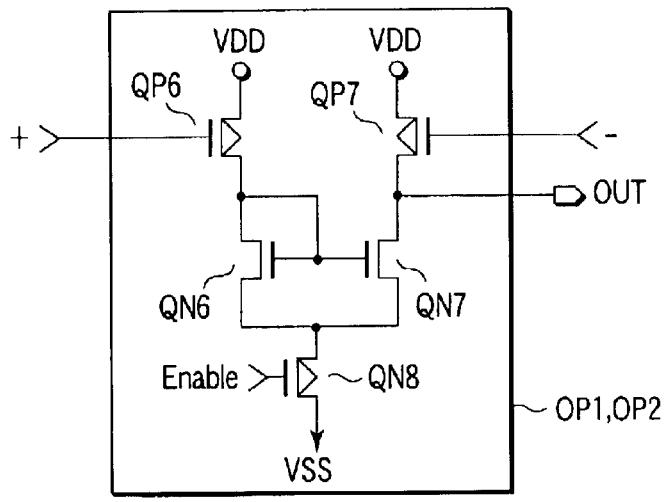
FIG. 11 is a view showing an example of an operational amplifier.

FIG. 11 shows a circuit example of the operational amplifier OP1 shown in FIG. 8 or operational amplifier OP2 shown in FIG. 10.

The operational amplifier OP1 or OP2 is formed from PMOS transistors QP6 and QP7 and NMOS transistors QN6, QN7, and QN8. When an enable signal Enable changes to "H", the NMOS transistor QN8 is turned on. Hence, the operational amplifier OP is set in an operative state.

(5) Circuit Structure 2

Figure 12:
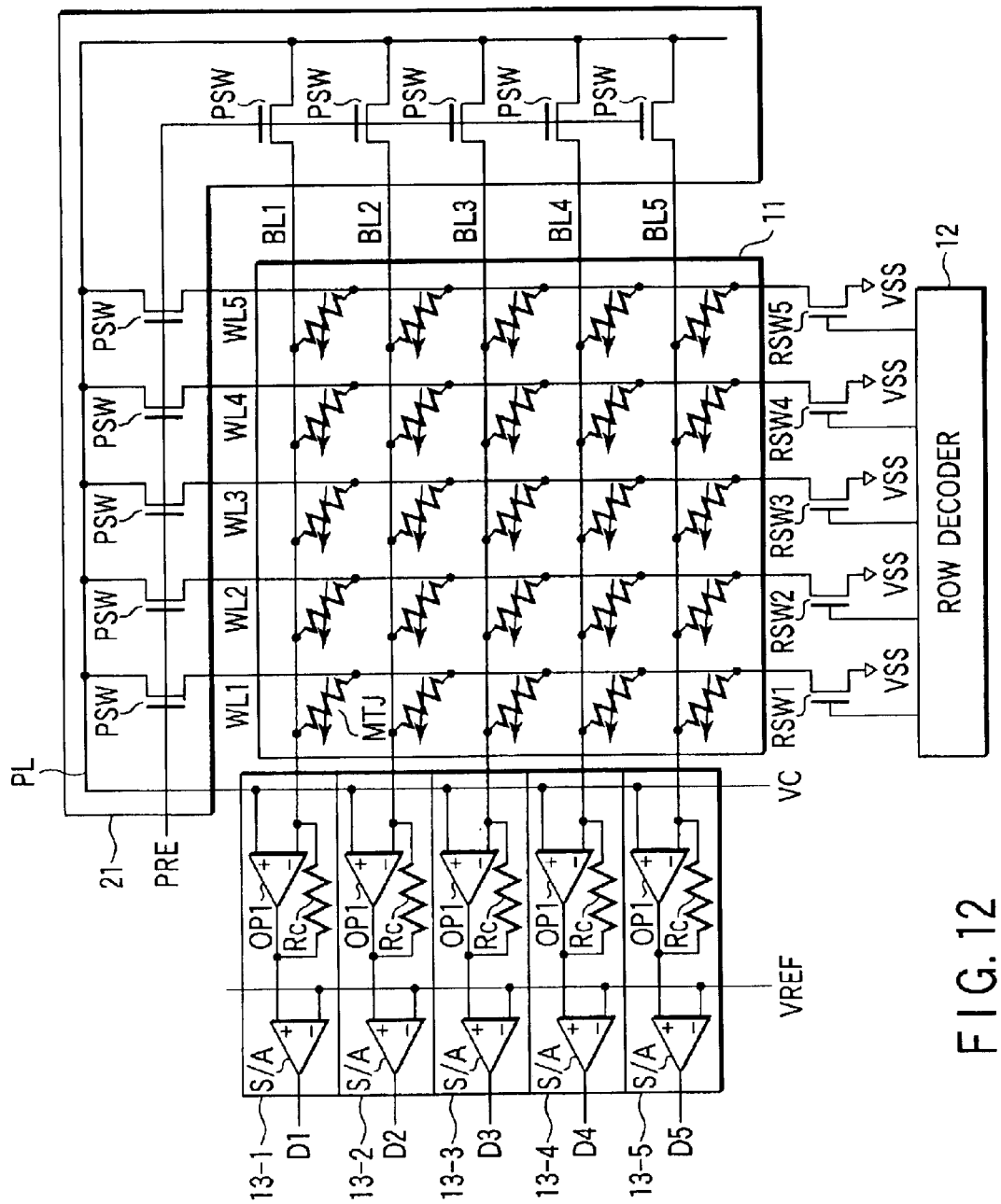
FIG. 12 is a view showing Circuit Structure 2 of the magnetic random access memory of the present invention.

FIG. 12 shows the circuit structure of a magnetic random access memory according to another embodiment of the present invention.

The circuit structure shown in FIG. 12 is an improved example of Detailed Example 1 (FIG. 2) of Circuit Structure 1. As its characteristic feature, a precharge circuit which precharges all word lines WLi and all bit lines BLi to a precharge potential in read operation is added to Detailed Example 1 of Circuit Structure 1.

A memory cell array 11 is formed from a plurality of TMR elements (MTJ elements) MTJ arranged in an array. The TMR elements MTJ are arranged at the intersections between word lines WLi (i=1, 2, . . . , 5) that run in the X-direction and bit lines BLi (i=1, 2, . . . , 5) that run in the Y-direction. The TMR elements MTJ are connected between the word lines WLi and the bit lines BLi.

In this example, the memory cell array 11 is formed from 5×5 TMR elements MTJ for the descriptive convenience. Hence, the number of word lines WLi is five, and the number of bit lines BLi is also five.

This is merely an example. In the present invention, the size of the memory cell array 11 (the number of TMR elements) and the numbers of word lines WLi and bit line BLi are not limited.

One end of each word line WLi is connected to a ground point VSS through a corresponding row select switch RSWi (i=1, 2, . . . , 5). The row select switch RSWi is controlled by an output signal from a row decoder 12, i.e., a signal obtained by decoding a row address signal.

One end of each bit line BLi is connected to a corresponding circuit block 13-*i* (i=1, 2, . . . , 5) including a sense amplifier and bit line bias circuit. The bit line bias circuit applies a bias potential to the bit line BLi in read operation.

In this example, in the read operation, the bias potential is applied to all the bit lines BLi connected to the selected word line WLi through the TMR elements MTJ, instead of applying the bias potential only to the selected bit line BLi. That is, in this example, all the bit lines BLi are set at an equipotential level, thereby blocking the current path from one bit line to another.

The other end of each of the word lines WLi and bit lines BLi is connected to a precharge line PL through a precharge switch PSW. A clamp potential (bias potential) VC is applied to the precharge line PL. The precharge switch PSW is controlled by a precharge signal PRE. The precharge signal PRE changes to "H" immediately before the read operation. Hence, the word lines WLi and bit lines BLi are precharged to a precharge potential.

When the precharge signal PRE changes to "L", precharge of the word lines WLi and bit lines BLi is ended. After that, a word line WLi and bit line BLi are selected. Subsequently, a read current is supplied between the selected word line WLi and the selected bit line BLi.

That is, in the read operation, the row select switch RSWi corresponding to the word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state while maintaining the precharge potential.

The word lines WLi and bit lines BLi are precharged in advance to increase the speed of read operation.

That is, in the present invention, to block the current path from one bit line to another bit line in the read operation, the bias potential is applied to all the bit lines BLi connected to the selected word line WLi through TMR elements MTJ. At this time, not only the bit lines BLi but also unselected word lines WLi (in the floating state) are charged.

To set all the bit lines BLi at the bias potential, all the bit lines BLi and unselected word lines WLi must be charged. This charging takes a very long time.

To prevent this, in this example, the word lines WLi and bit lines BLi are precharged in advance to shorten the charge time, thereby increasing the speed of read operation.

In this example, the precharge potential equals the bias potential. However, the precharge potential may be different from the bias potential. In this example, both the word lines WLi and bit lines BLi are precharged. However, only the word lines WLi or bit lines BLi may be precharged.

Additionally, in this example, sense amplifiers are connected to all the bit lines BLi connected to the selected word line WLi through the TMR elements MTJ. That is, in the read operation, the resistance values (data) of all the TMR elements MTJ connected to the selected word line WLi are read at once.

Sense amplifiers may be connected to all the bit lines BLi connected to the selected word line WLi through the TMR elements MTJ, as in this example. Alternatively, a sense amplifier may be connected to only the selected bit line BLi.

As described above, according to the magnetic random access memory of the present invention, all the word lines WLi and all the bit lines BLi are precharged in advance.

In the read operation, the selected word line WLi is set at a predetermined potential (unselected word lines are set in the floating state). In addition, all the bit lines BLi connected to the selected word line WLi through the TMR elements are set at the bias potential.

Hence, in the read operation, no many current paths of the read current are formed. For this reason, any decrease in read signal amount of the selected TMR element can be prevented. In addition, the charge time required to set all the bit lines BLi connected to the selected word line WLi through the TMR elements is shortened. Hence, the speed of read operation can be increased.

Referring to FIG. 12, the row select switch RSWi is formed from a MOS transistor. However, the row select switch RSWi is not limited to a MOS transistor. For example, a bipolar transistor, MIS transistor, MES transistor, or junction transistor may be used.

As the read circuit, the circuit shown in FIG. 6 or 7 can be used. As the sense amplifier & bit line bias circuit, not the circuit shown in FIG. 12 but the circuit shown in FIGS. 8 to 11 may be used.

(6) Circuit Structure 3

Figure 13:
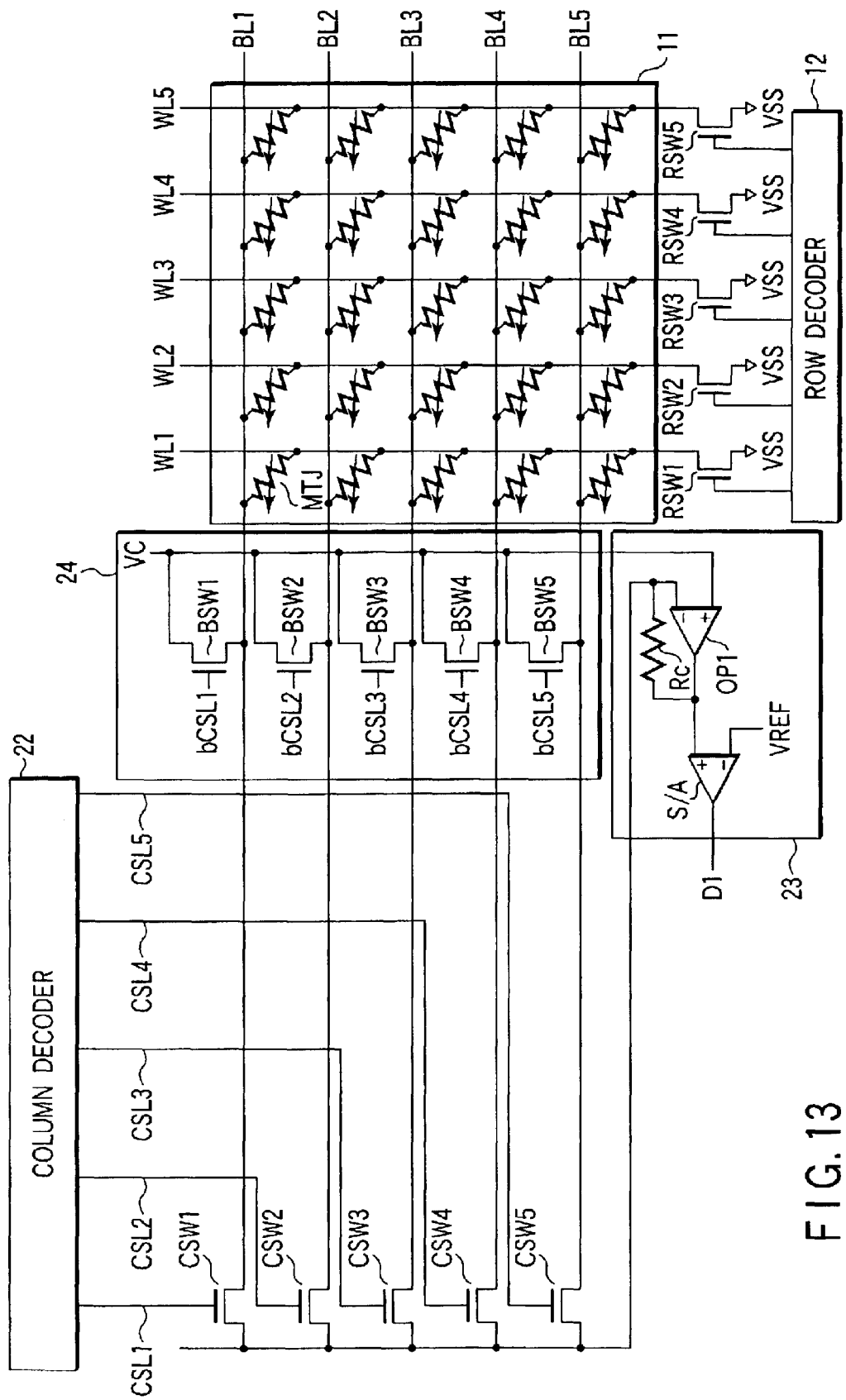
FIG. 13 is a view showing Circuit Structure 3 of the magnetic random access memory of the present invention.

FIG. 13 shows the circuit structure of a magnetic random access memory according to still another embodiment of the present invention.

The circuit structure shown in FIG. 13 is a modification to Detailed Example 1 (FIG. 2) of Circuit Structure 1. As its characteristic feature, a read circuit (including a sense amplifier) is connected only to the selected column instead of connecting the read circuit to all bit lines BLi.

In Circuit Structure 3, an effect similar to that of Circuit Structure 1 is obtained by arranging switches BSW1, BSW2, . . . , BSW5, as will be described later.

A memory cell array 11 is formed from a plurality of TMR elements (MTJ elements) MTJ arranged in an array. The TMR elements MTJ are arranged at the intersections between word lines WLi (i=1, 2, . . . , 5) that run in the X-direction and bit lines BLi (i=1, 2, . . . , 5) that run in the Y-direction. The TMR elements MTJ are connected between the word lines WLi and the bit lines BLi.

In this example, the memory cell array 11 is formed from 5×5 TMR elements MTJ for the descriptive convenience. Hence, the number of word lines WLi is five, and the number of bit lines BLi is also five.

This is merely an example. In the present invention, the size of the memory cell array 11 (the number of TMR elements) and the numbers of word lines WLi and bit line BLi are not limited.

One end of each word line WLi is connected to a ground point VSS through a corresponding row select switch RSWi (i=1, 2, . . . , 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

One end of each bit line BLi is connected to a read circuit 23 through a column select switch CSWi (i=1, 2, . . . , 5). The column select switch CSWi is controlled by the output signal from a column decoder 22, i.e., a signal obtained by decoding a column address signal.

Hence, a column select switch CSWi corresponding to a bit line (column) BLi selected by a column address signal is turned on. One end of the selected bit line BLi is connected to the read circuit 23.

In addition, the column select switches CSWi corresponding to the bit lines BLi that are not selected by the column address signal are turned off. Hence, the unselected bit lines BLi are not connected to the read circuit 23.

As the row select switch RSWi or column select switch CSWi, e.g., a MOS transistor can be employed, as shown in FIG. 13.

However, the row select switch RSWi or column select switch CSWi is not limited to a MOS transistor. For example, a bipolar transistor, MIS transistor, MES transistor, or junction transistor may be used.

In this example, a bit line bias circuit 24 is connected to the bit lines BLi. The bit line bias circuit 24 is constructed by bias switches BSWi (i=1, 2, . . . , 5) each having one terminal connected to a bit line BLi. A clamp potential (bias potential) VC is applied to the other terminal of each bias switch BSWi.

The clamp potential VC is the same as the clamp potential VC input to the positive input terminal of an operational amplifier OP1 in the read circuit 23.

The bias switch BSWi is formed from, e.g., an NMOS transistor. The bias switch BSWi is controlled by a signal bCSLi (i=1, 2, . . . , 5) obtained by inverting an output signal CSLi (i=1, 2, . . . , 5) from the column decoder 22.

In the read operation, the bit line bias circuit 24 applies the bias potential to the unselected bit lines BLi to equalize the potentials of all the bit lines BLi connected to the selected word line WLi through the TMR elements MTJ.

For example, assume that a column select signal CSL3 changes to "H", and remaining column select signals CSL1, CSL2, CSL4, and CSL5 change to "L". A bit line BL3 is connected to the read circuit 23 through a column select switch CSW3. In addition, bias switches BSW1, BSW2, BSW4, and BSW5 are turned on. The clamp potential (bias potential) VC is applied to bit lines BL1, BL2, BL4, and BL5.

As described above, according to the magnetic random access memory of the present invention, the selected word line WLi is set at a predetermined potential (in this example, the ground potential) to read the read current. Unselected word lines are set in the floating state. All the bit lines BLi connected to the selected word line WLi through the TMR elements are set at a predetermined bias potential (e.g., a positive potential).

In the read operation, as an equivalent circuit of the cross-point cell array structure according to the present invention, only the selected TMR element is connected between the selected word line and the selected bit line. Hence, the read signal amount of the selected TMR element does not decrease.

As the read circuit (sense amplifier & bit line bias circuit) 23, not the circuit shown in FIG. 13 but the circuit shown in FIGS. 8 to 11 may be used.

(7) Circuit Structure 4

Figure 14:
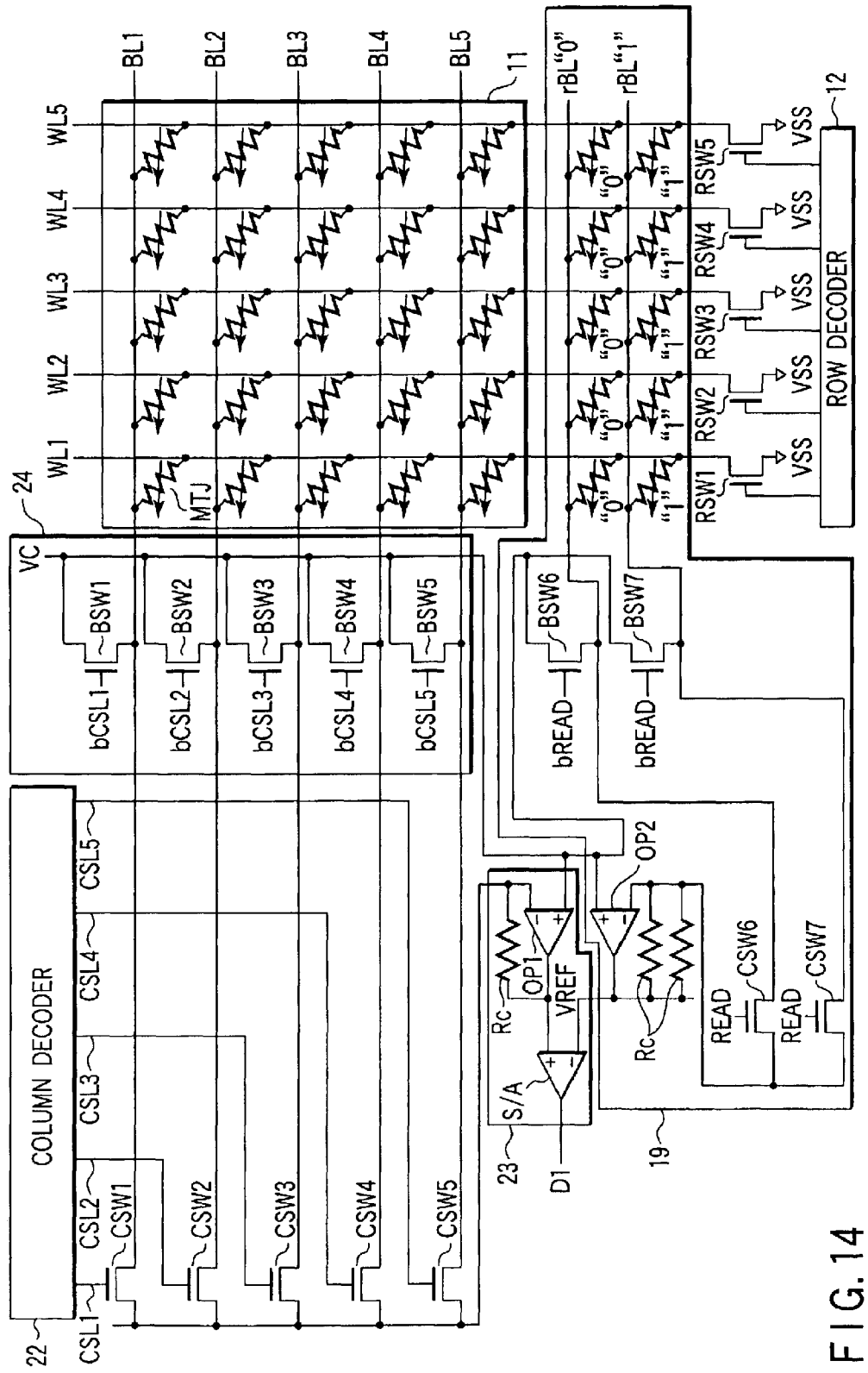
FIG. 14 is a view showing Circuit Structure 4 of the magnetic random access memory of the present invention.

FIG. 14 shows the circuit structure of a magnetic random access memory according to still another embodiment of the present invention.

The circuit structure shown in FIG. 14 is an application example of Circuit Structure 3. This circuit structure shows a reference potential generating circuit which generates a reference potential VREF in Circuit Structure 3 in detail.

Circuit Structure 4 proposes a circuit which generates the reference potential VREF using TMR elements which store "0" data and TMR elements which store "1" data.

A memory cell array 11 is formed from a plurality of TMR elements (MTJ elements) MTJ arranged in an array. The TMR elements MTJ are arranged at the intersections between word lines WLi (i=1, 2, . . . , 5) that run in the X-direction and bit lines BLi (i=1, 2, . . . , 5) that run in the Y-direction. The TMR elements MTJ are connected between the word lines WLi and the bit lines BLi.

One end of each word line WLi is connected to a ground point VSS through a corresponding row select switch RSWi (i=1, 2, . . . , 5). The row select switch RSWi is controlled by an output signal from a row decoder 12, i.e., a signal obtained by decoding a row address signal.

Hence, a row select switch RSWi corresponding to a word line (row) WLi selected by a row address signal is turned on. One end of the selected word line WLi is short-circuited to the ground point VSS.

In addition, the row select switches RSWi corresponding to the word lines WLi that are not selected by the row address signal are turned off. Hence, the unselected word lines WLi are set in a floating state.

One end of each bit line BLi is connected to a read circuit 23 through a column select switch CSWi (i=1, 2, . . . , 5). The column select switch CSWi is controlled by the output signal from a column decoder 22, i.e., a signal obtained by decoding a column address signal.

Hence, a column select switch CSWi corresponding to a bit line (column) BLi selected by a column address signal is turned on. One end of the selected bit line BLi is connected to the read circuit 23.

In addition, the column select switches CSWi corresponding to the bit lines BLi that are not selected by the column address signal are turned off. Hence, the unselected bit lines BLi are not connected to the read circuit 23.

A bit line bias circuit 24 is connected to the bit lines BLi. The bit line bias circuit 24 is constructed by bias switches BSWi (i=1, 2, . . . , 5) each having one terminal connected to a bit line BLi. A clamp potential (bias potential) VC is applied to the other terminal of each bias switch BSWi.

The clamp potential VC is the same as the clamp potential VC input to the positive input terminal of an operational amplifier OP1 in the read circuit 23.

The bias switch BSWi is formed from, e.g., an NMOS transistor. The bias switch BSWi is controlled by a signal bCSLi (i=1, 2, . . . , 5) obtained by inverting an output signal CSLi (i=1, 2, . . . , 5) from the column decoder 22.

In the read operation, the bit line bias circuit 24 applies the bias potential to the unselected bit lines BLi to equalize the potentials of all the bit lines BLi connected to the selected word line WLi through the TMR elements MTJ.

The reference potential VREF is generated by a reference potential generating circuit 19 including TMR elements (reference cells) which store "0" data and TMR elements (reference cells) which store "1" data.

The reference potential generating circuit 19 has bit lines rBL"0" and rBL"1" that run in the Y-direction.

At the intersections between all the word lines WLi and the bit line rBL"0", the TMR elements MTJ connected between these word lines WLi and the bit line rBL"0" are arranged. All the TMR elements MTJ arranged at the intersection between all the word lines WLi and the bit line rBL"0" store "0" data.

At the intersections between all the word lines WLi and the bit line rBL"1", the TMR elements MTJ connected between these word lines WLi and the bit line rBL"1" are arranged. All the TMR elements MTJ arranged at the intersection between all the word lines WLi and the bit line rBL"1" store "1" data.

According to this arrangement, in read operation, "0" data is read to the bit line rBL"0", and "1" data is read to the bit line rBL"1" always independently of the selected one of five word lines WL1, WL2, . . . , WL5.

In the read operation, when a read signal READ changes to "H" (bREAD changes to "L"), the bit lines rBL"0" and rBL"1" are short-circuited to each other by an equalize switch ESW.

Both of the bit lines rBL"0" and rBL"1" are connected to the negative input terminals of operational amplifiers OP2. Like an operational amplifier OP1 of the read circuit 23, the clamp potential VC is input to the positive input terminal of the operational amplifier OP2. Additionally, a resistive element Rc is connected between the output terminal and the negative input terminal.

As a result, the reference potential VREF is output from the output terminal of the operational amplifier OP2.

According to the magnetic random access memory of this example, in the read operation, only the selected TMR element MTJ is connected between the selected word line WLi and the selected bit line BLi. Hence, the read signal amount of the selected TMR element MTJ does not decrease.

Furthermore, in the read operation, the reference potential VREF is generated using TMR elements which store "0" data and TMR elements which store "1" data. For this reason, the reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

As the read circuit (sense amplifier & bit line bias circuit) 23 and reference potential generating circuit 19, not the circuits shown in FIG. 13 but the circuits shown in FIGS. 8 to 11 may be used.

2. Circuit Example of Write Circuit (1) Circuit Structure

Figure 15:
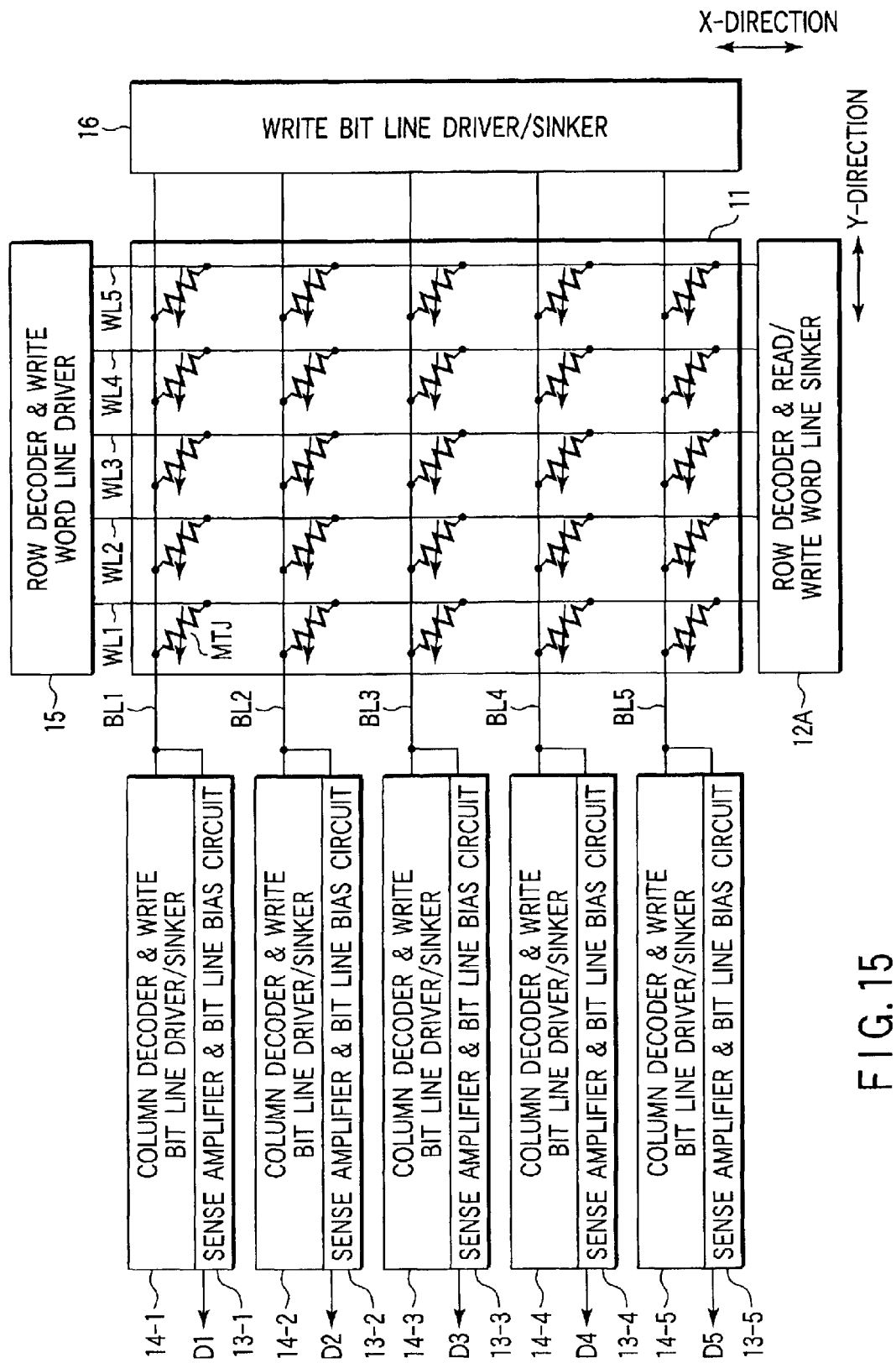
FIG. 15 is a view showing an example of a write circuit.

FIG. 15 shows the circuit structure of a magnetic random access memory according to still another embodiment of the present invention.

As a characteristic feature of this circuit structure, a write circuit is added to Circuit Structure 1 (FIG. 1).

A memory cell array 11 is formed from a plurality of TMR elements (MTJ elements) MTJ arranged in an array. The TMR elements MTJ are arranged at the intersections between word lines WLi (i=1, 2, . . . , 5) that run in the X-direction and bit lines BLi (i=1, 2, . . . , 5) that run in the Y-direction. The TMR elements MTJ are connected between the word lines WLi and the bit lines BLi.

One end of each word line WLi is connected to a circuit block 15 including a row decoder and write word line driver. The other end of each word line WLi is connected to a circuit block 12A including a row decoder and read/write word line sinker.

In write operation, for example, a write current flows to the selected word line WLi in the direction from the write word line driver toward the write word line sinker.

One end of each bit line BLi is connected to a circuit block 13-i (i=1, 2, . . . , 5) including a sense amplifier and bit line bias circuit. The bit line bias circuit applies a bias potential to the bit line BLi in read operation.

One end of each bit line BLi is also connected to a write bit line driver/sinker 14-i (i=1, 2, . . . , 5). The other end of each bit line BLi is connected to a write bit line driver/sinker 16.

In write operation, for example, a write current flows to the selected bit line BLi in the direction from the write bit line driver/sinker 14-i toward the write bit line driver/sinker 16 or in the direction from the write bit line driver/sinker 16 toward the write bit line driver/sinker 14-i in accordance with the value of write data.

(2) Row Decoder & Write Word Line Driver, and Row Decoder & Read/Write Word Line Sinker: No. 1

Figure 16:
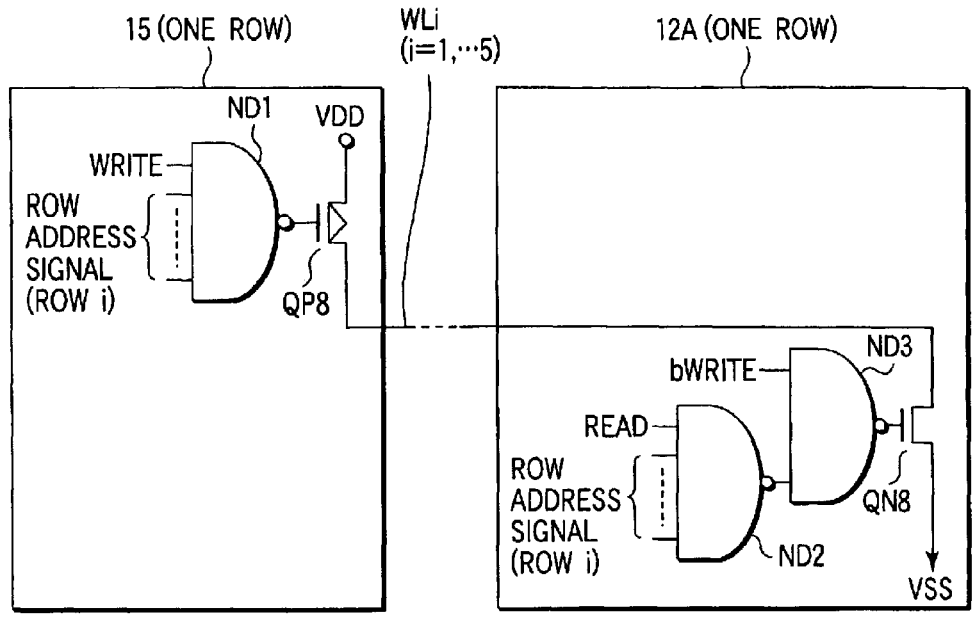
FIG. 16 is a view showing a row decoder and write word line driver/sinker.

FIG. 16 shows a circuit example of the row decoder & write word line driver and a circuit example of the row decoder & read/write word line sinker.

The row decoder & write word line driver and row decoder & read/write word line sinker shown in FIG. 16 are applied to the magnetic random access memories shown in FIGS. 1, 2, 3, 4, 5, 13, and 14.

FIG. 16 shows a row decoder & write word line driver and row decoder & read/write word line sinker corresponding to one row.

The row decoder & write word line driver 15 is formed from a PMOS transistor QP8 and NAND gate circuit ND1. The row decoder & read/write word line sinker 12A is formed from an NMOS transistor QN8 and NAND gate circuits ND2 and ND3.

The PMOS transistor QP8 is connected between a power supply terminal VDD and one end of the word line WLi. The output signal from the NAND gate circuit ND1 is supplied to the gate of the PMOS transistor QP8.

The NMOS transistor QN8 is connected between the other end of the word line WLi and a ground terminal VSS. The output signal from the NAND gate circuit ND2 is input to the NAND gate circuit ND3. The output signal from the NAND gate circuit ND3 is supplied to the gate of the NMOS transistor QN8.

When the output signal from the NAND gate circuit ND1 is "L", and the output signal from the NAND gate circuit ND3 is "H", a write current flows to the word line WLi in the direction from the row decoder & write word line driver 15 toward the row decoder & read/write word line sinker 12A.

In such a row decoder & write word line driver and row decoder & read/write word line sinker, a write signal WRITE changes to "H" in the write operation. For this reason, in a row (selected row) for which all the bits of the row address signal are "H", the output signal from the NAND gate circuit ND1 changes to "L" to turn on the PMOS transistor QP8.

On the other hand, in a row (unselected row) for which not all the bits of the row address signal are "H", the output signal from the NAND gate circuit ND1 changes to "H" to turn off the PMOS transistor QP8.

In the write operation, a read signal READ is "L". Hence, the output signal from the NAND gate circuit ND2 is "H". At this time, a signal bWRITE, i.e., the inverted signal of the write signal WRITE is "L". For this reason, the output signal from the NAND gate circuit ND3 is "H".

Hence, in the write operation, the NMOS transistor QN8 is turned on.

In the write operation, a write current flows only to the selected word line WLi in the direction from the row decoder & write word line driver 15 toward the row decoder & read/write word line sinker 12A.

In read operation, the write signal WRITE changes to "L" (bWRITE is "H"). For this reason, in all rows, the output signal from the NAND gate circuit ND1 changes to "H" to turn off the PMOS transistor QP8.

In the read operation, the read signal READ changes to "H". For this reason, in a row (selected row) for which all the bits of the row address signal are "H", the output signal from the NAND gate circuit ND2 changes to "L". The output signal from the NAND gate circuit ND3 changes to "H". Hence, the NMOS transistor QN8 is turned on.

On the other hand, in a row (unselected row) for which not all the bits of the row address signal are "H", the output signal from the NAND gate circuit ND2 changes to "H". The output signal from the NAND gate circuit ND3 changes to "L". Hence, the NMOS transistor QN8 is turned off.

(3) Column Decoder & Write Bit Line Driver/Sinker: No. 1

Figure 17:
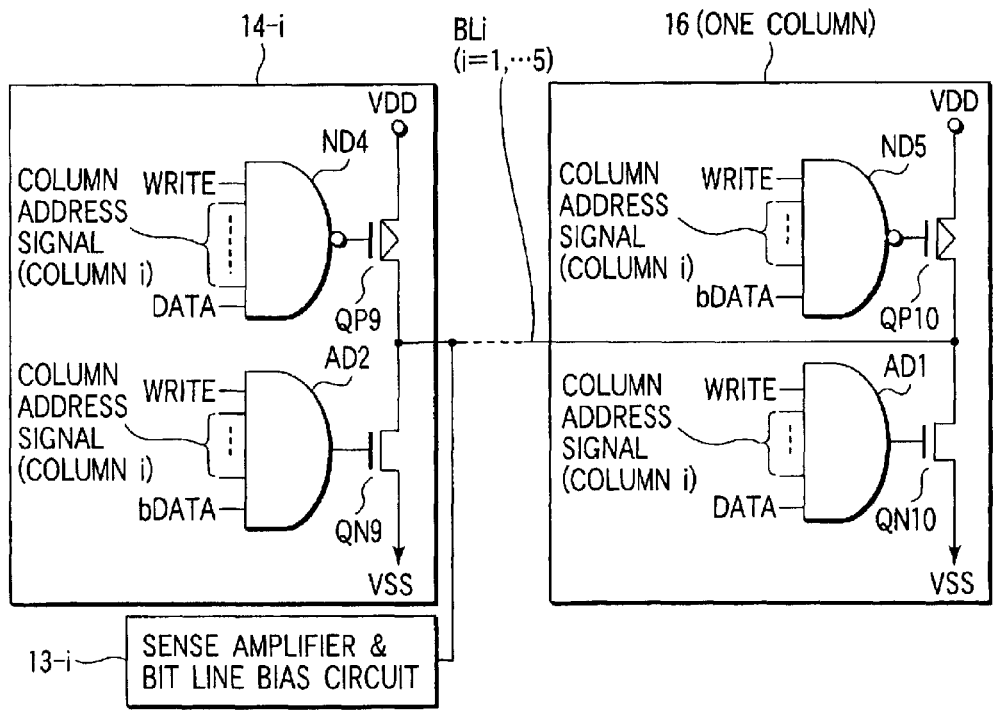
FIG. 17 is a view showing a column decoder and write bit line driver/sinker.

FIG. 17 shows a circuit example of the column decoder & write bit line driver/sinker.

The column decoder & write bit line driver/sinker shown in FIG. 17 is applied to the magnetic random access memories shown in FIGS. 1, 2, 3, 4, and 5.

FIG. 17 shows column decoder & write bit line driver/sinkers corresponding to one column.

The column decoder & write bit line driver/sinker 14-i is formed from a PMOS transistor QP9, NAND gate circuit ND4, NMOS transistor QN9, and AND gate circuit AD2. The column decoder & write bit line driver/sinker 16 is formed from a PMOS transistor QP10, NAND gate circuit ND5, NMOS transistor QN10, and AND gate circuit AD1.

The PMOS transistor QP9 is connected between the power supply terminal VDD and one end of the bit line BLi. The output signal from the NAND gate circuit ND4 is supplied to the gate of the PMOS transistor QP9. The NMOS transistor QN9 is connected between one end of the bit line BLi and the ground terminal VSS. The output signal from the AND gate circuit AD2 is supplied to the gate of the NMOS transistor QN9.

The PMOS transistor QP10 is connected between the power supply terminal VDD and the other end of the bit line BLi. The output signal from the NAND gate circuit ND5 is supplied to the gate of the PMOS transistor QP10. The NMOS transistor QN10 is connected between the other end of the bit line BLi and the ground terminal VSS. The output signal from the AND gate circuit AD1 is supplied to the gate of the NMOS transistor QN10.

When the output signal from the NAND gate circuit ND4 is "L", and the output signal from the AND gate circuit AD1 is "H", a write current flows to the bit line BLi in the direction from the column decoder & write bit line driver/sinker 14-*i* toward the column decoder & write bit line driver/sinker 16.

When the output signal from the NAND gate circuit ND5 is "L", and the output signal from the AND gate circuit AD2 is "H", a write current flows to the bit line BLi in the direction from the column decoder & write bit line driver/sinker 16 toward the column decoder & write bit line driver/sinker 14-*i*.

In such a column decoder & write bit line driver/sinker, the write signal WRITE changes to "H" in the write operation.

For this reason, in a column (selected column) for which all the bits of the column address signal are "H", a write current flows to the bit line BLi in the direction toward the column decoder & write bit line driver/sinker 16 or in the direction toward the column decoder & write bit line driver/sinker 14-*i* in accordance with the value of write data DATA.

For example, when the write data DATA is "1" (corresponding to "H"), all the bits of the input signal to the NAND gate circuit ND4 are "H". Hence, the output signal from the NAND gate circuit ND4 changes to "L" to turn on the PMOS transistor QP9. In addition, when the write data DATA is "1", all the bits of the input signal to the AND gate circuit AD1 are "H". Hence, the output signal from the AND gate circuit AD1 changes to "H" to turn on the NMOS transistor QN10.

Hence, a write current flows to the bit line BLi in the direction from the column decoder & write bit line driver/sinker 14-*i* toward the column decoder & write bit line driver/sinker 16.

When the write data DATA is "0" (corresponding to "L"), a signal bit bDATA changes to "H". That is, all the bits of the input signal to the NAND gate circuit ND5 are "H". Hence, the output signal from the NAND gate circuit ND5 changes to "L" to turn on the PMOS transistor QP10. In addition, when the write data DATA is "0", all the bits of the input signal to the AND gate circuit AD2 are "H". Hence, the output signal from the AND gate circuit AD2 changes to "H" to turn on the NMOS transistor QN9.

Hence, a write current flows to the bit line BLi in the direction from the column decoder & write bit line driver/sinker 16 toward the column decoder & write bit line driver/sinker 14-*i*.

(4) Row Decoder & Write Word Line Driver, and Row Decoder & Read/Write Word Line Sinker: No. 2

Figure 18:
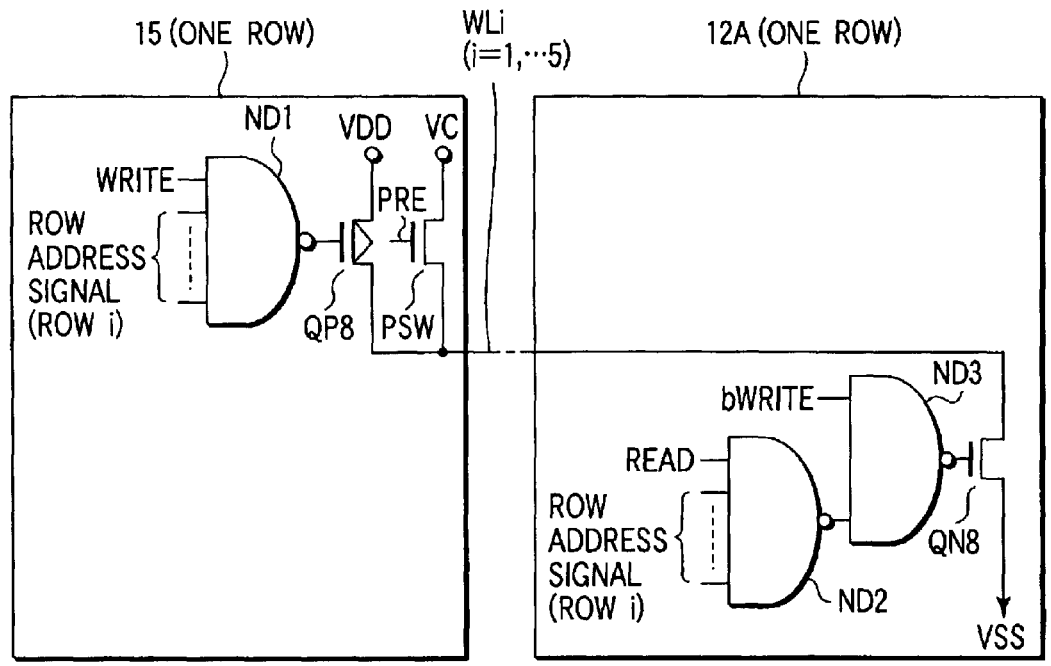
FIG. 18 is a view showing a row decoder and write word line driver/sinker.

FIG. 18 shows a circuit example of the row decoder & write word line driver and a circuit example of the row decoder & read/write word line sinker.

The row decoder & write word line driver and row decoder & read/write word line sinker shown in FIG. 18 are applied to the magnetic random access memory shown in FIG. 12.

FIG. 18 shows a row decoder & write word line driver and row decoder & read/write word line sinker corresponding to one row.

The row decoder & write word line driver 15 is formed from the PMOS transistor QP8, NMOS transistor PSW, and NAND gate circuit ND1. The row decoder & read/write word line sinker 12A is formed from the NMOS transistor QN8 and NAND gate circuits ND2 and ND3.

The PMOS transistor QP8 is connected between the power supply terminal VDD and one end of the word line WLi. The NMOS transistor PSW is connected to a clamp terminal VC and one end of the word line WLi. The output signal from the NAND gate circuit ND1 is supplied to the gate of the PMOS transistor QP8.

The NMOS transistor QN8 is connected between the other end of the word line WLi and the ground terminal VSS. The output signal from the NAND gate circuit ND2 is input to the NAND gate circuit ND3. The output signal from the NAND gate circuit ND3 is supplied to the gate of the NMOS transistor QN8.

The row decoder & write word line driver 15 and row decoder & read/write word line sinker 12A shown in FIG. 18 are substantially the same as those shown in FIG. 16.

The NMOS transistor PSW corresponds to the precharge switch PSW shown in FIG. 12.

(5) Column Decoder & Write Bit Line Driver/Sinker: No. 2

Figure 19:
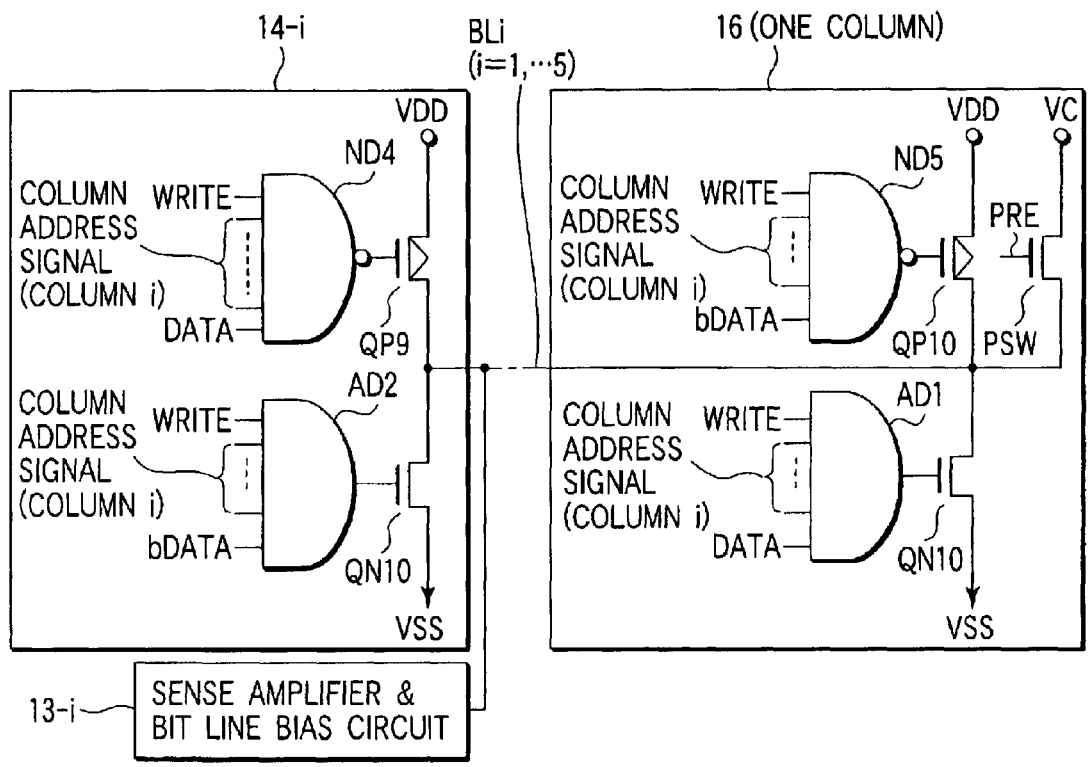
FIG. 19 is a view showing a column decoder and write bit line driver/sinker.

FIG. 19 shows a circuit example of the column decoder & write bit line driver/sinker.

The column decoder & write bit line driver/sinker shown in FIG. 19 is applied to the magnetic random access memory shown in FIG. 12.

FIG. 19 shows column decoder & write bit line driver/sinkers corresponding to one column.

The column decoder & write bit line driver/sinker 14-*i* is formed from the PMOS transistor QP9, NAND gate circuit ND4, NMOS transistor QN9, and AND gate circuit AD2. The column decoder & write bit line driver/sinker 16 is formed from the PMOS transistor QP10, NAND gate circuit ND5, NMOS transistors QN10 and PSW, and AND gate circuit AD1.

The PMOS transistor QP9 is connected between the power supply terminal VDD and one end of the bit line BLi. The output signal from the NAND gate circuit ND4 is supplied to the gate of the PMOS transistor QP9. The NMOS transistor QN9 is connected between one end of the bit line BLi and the ground terminal VSS. The output signal from the AND gate circuit AD2 is supplied to the gate of the NMOS transistor QN9.

The PMOS transistor QP10 is connected between the power supply terminal VDD and the other end of the bit line BLi. The NMOS transistor PSW is connected between the clamp terminal VC and the other end of the bit line BLi. The output signal from the NAND gate circuit ND5 is supplied to the gate of the PMOS transistor QP10. The NMOS transistor QN10 is connected between the other end of the bit line BLi and the ground terminal VSS. The output signal from the AND gate circuit AD1 is supplied to the gate of the NMOS transistor QN10.

The column decoder & write bit line driver/sinker 14-*i* and the column decoder & write bit line driver/sinker 16 shown in FIG. 19 are substantially the same as those shown in FIG. 17.

The NMOS transistor PSW corresponds to the precharge switch PSW shown in FIG. 12.

(6) Column Decoder & Write Bit Line Driver/Sinker: No. 3

Figure 20:
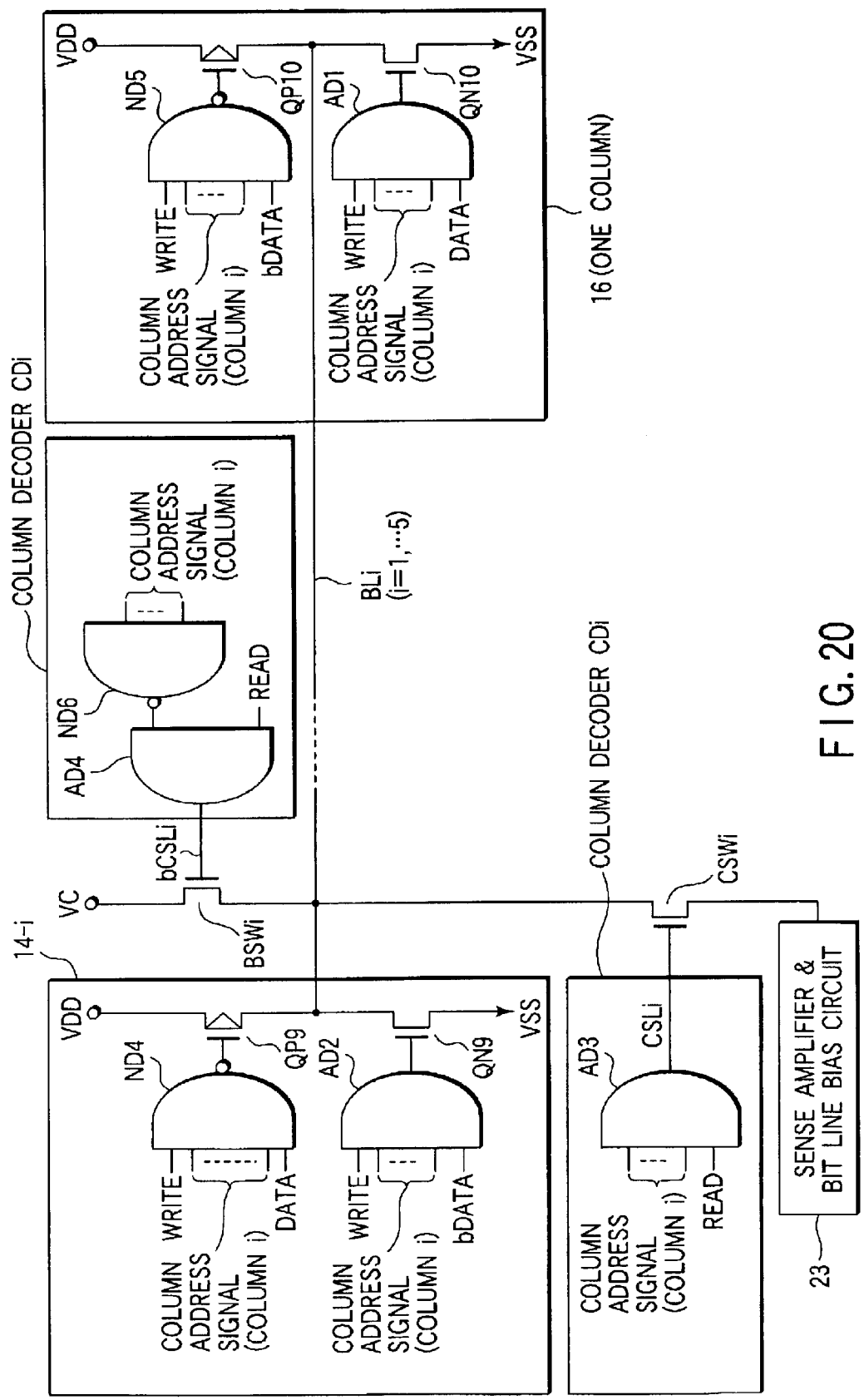
FIG. 20 is a view showing a column decoder and write bit line driver/sinker.

FIG. 20 shows a circuit example of the column decoder & write bit line driver/sinker.

The column decoder & write bit line driver/sinker shown in FIG. 20 is applied to the magnetic random access memories shown in FIGS. 13 and 14.

FIG. 20 shows column decoder & write bit line driver/sinkers corresponding to one column.

The column decoder & write bit line driver/sinker 14-*i* is formed from the PMOS transistor QP9, NAND gate circuit ND4, NMOS transistor QN9, and AND gate circuit AD2. The column decoder & write bit line driver/sinker 16 is formed from the PMOS transistor QP10, NAND gate circuit ND5, NMOS transistor QN10, and AND gate circuit AD1.

The PMOS transistor QP9 is connected between the power supply terminal VDD and one end of the bit line BLi. The output signal from the NAND gate circuit ND4 is supplied to the gate of the PMOS transistor QP9. The NMOS transistor QN9 is connected between one end of the bit line BLi and the ground terminal VSS. The output signal from the AND gate circuit AD2 is supplied to the gate of the NMOS transistor QN9.

The PMOS transistor QP10 is connected between the power supply terminal VDD and the other end of the bit line BLi. The output signal from the NAND gate circuit ND5 is supplied to the gate of the PMOS transistor QP10. The NMOS transistor QN10 is connected between the other end of the bit line BLi and the ground terminal VSS. The output signal from the AND gate circuit AD1 is supplied to the gate of the NMOS transistor QN10.

When the output signal from the NAND gate circuit ND4 is "L", and the output signal from the AND gate circuit AD1 is "H", a write current flows to the bit line BLi in the direction from the column decoder & write bit line driver/sinker 14-$i$ toward the column decoder & write bit line driver/sinker 16.

When the output signal from the NAND gate circuit ND5 is "L", and the output signal from the AND gate circuit AD2 is "H", a write current flows to the bit line BLi in the direction from the column decoder & write bit line driver/sinker 16 toward the column decoder & write bit line driver/sinker 14-$i$.

In such a column decoder & write bit line driver/sinker, the write signal WRITE changes to "H" in the write operation.

For this reason, in a column (selected column) for which all the bits of the column address signal are "H", a write current flows to the bit line BLi in the direction toward the column decoder & write bit line driver/sinker 16 or in the direction toward the column decoder & write bit line driver/sinker 14-$i$ in accordance with the value of write data DATA.

For example, when the write data DATA is "1" (corresponding to "H"), all the bits of the input signal to the NAND gate circuit ND4 are "H". Hence, the output signal from the NAND gate circuit ND4 changes to "L" to turn on the PMOS transistor QP9. In addition, when the write data DATA is "1", all the bits of the input signal to the AND gate circuit AD1 are "H". Hence, the output signal from the AND gate circuit AD1 changes to "H" to turn on the NMOS transistor QN10.

Hence, a write current flows to the bit line BLi in the direction from the column decoder & write bit line driver/sinker 14-$i$ toward the column decoder & write bit line driver/sinker 16.

When the write data DATA is "0" (corresponding to "L"), a signal bit bDATA changes to "H". That is, all the bits of the input signal to the NAND gate circuit ND5 are "H". Hence, the output signal from the NAND gate circuit ND5 changes to "L" to turn on the PMOS transistor QP10. In addition, when the write data DATA is "0", all the bits of the input signal to the AND gate circuit AD2 are "H". Hence, the output signal from the AND gate circuit AD2 changes to "H" to turn on the NMOS transistor QN9.

Hence, a write current flows to the bit line BLi in the direction from the column decoder & write bit line driver/sinker 16 toward the column decoder & write bit line driver/sinker 14-$i$.

In the magnetic random access memories shown in FIGS. 13 and 14, in the read operation, only one selected bit line (column) BLi is connected to a read circuit (sense amplifier & bit line bias circuit) 23.

Hence, a column select switch CSWi is connected between the bit line BLi and the read circuit 23.

In the read operation, a read signal READ changes to "H". In the selected column, all the bits of the column address signal are "H". Hence, an output signal CSLi from an AND gate circuit AD3 changes to "H". As a result, the column select switch CSWi is turned on to electrically connect the bit line BLi to the read circuit 23.

In the read operation, in an unselected column, not all the bits of the column address signal are "H". For this reason, the output signal from a NAND gate circuit ND6 changes to "H". Since the read signal READ is "H", an output signal bCSLi from an AND gate circuit AD4 changes to "H".

Consequently, a bias switch BSWi is turned on to bias the unselected bit line BLi to a clamp potential (bias potential) VC.

3. Structural Example of Device (1) Cell Array Structure

Figure 21:
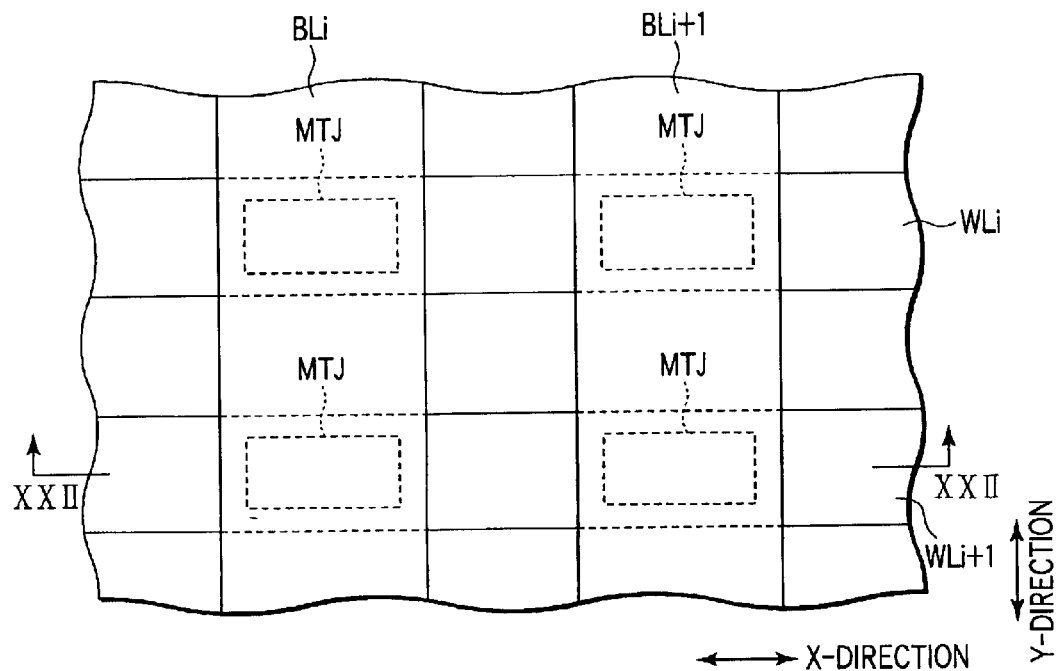
FIG. 21 is a plan view showing an example of a cell array structure according to the present invention.
Figure 22:
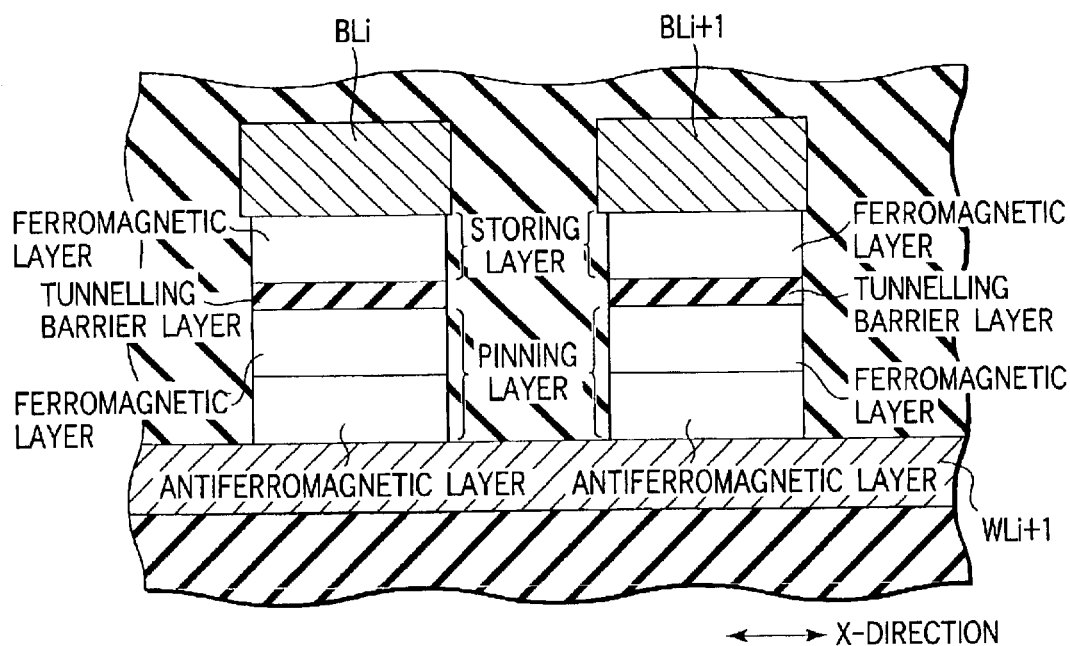
FIG. 22 is a sectional view taken along a line XXII—XXII in FIG. 21.

FIG. 21 is a plan view showing an example of the cell array structure of the memory cell array. FIG. 22 is a sectional view taken along a line XXII—XXII in FIG. 21.

The word lines WLi and WLi+1 run in the X-direction. The bit lines BLi and BLi+1 run in the Y-direction perpendicular to the X-direction. The TMR elements MTJ are arranged at the intersections between the word lines WLi and WLi+1 and the bit lines BLi and BLi+1. The TMR elements MTJ are in direct contact with the word lines WLi and WLi+1 and bit lines BLi and BLi+1.

(2) Structural Example of TMR Element

Figure 23:
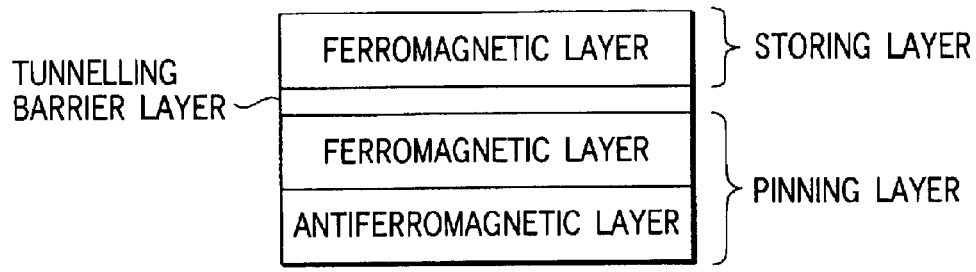
FIG. 23 is a view showing a structural example of a TMR element.
Figure 24:
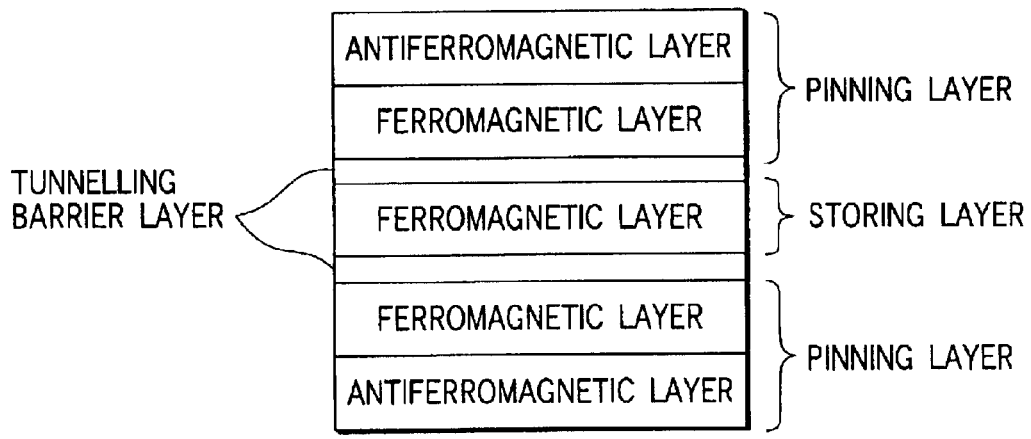
FIG. 24 is a view showing another structural example of the TMR element.
Figure 25:
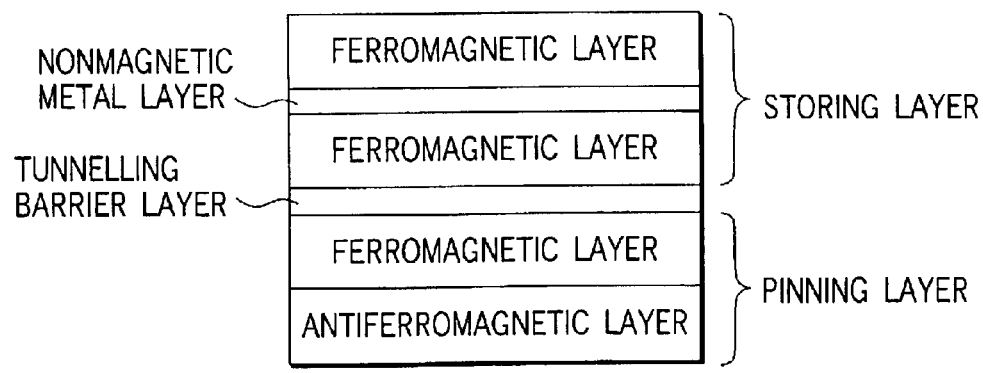
FIG. 25 is a view showing still another structural example of the TMR element.

FIGS. 23 to 25 show structural examples of the TMR element.

The TMR element shown in FIG. 23 has the most basic structure having two ferromagnetic layers and a tunneling barrier layer sandwiched between these layers.

An antiferromagnetic layer for fixing the magnetizing direction is added to a fixed layer (pinning layer) of the two ferromagnetic layers, in which the magnetizing direction is fixed. The magnetizing direction in a free layer (storing layer) of the two ferromagnetic layers, in which the magnetizing direction can be freely changed, is determined by a synthesized magnetic field formed by a write word line and write bit line.

The TMR element shown in FIG. 24 has two tunneling barrier layers in it to make the bias voltage higher than in the TMR element shown in FIG. 23.

The TMR element shown in FIG. 24 can be regarded to have a structure (double junction structure) in which two TMR elements shown in FIG. 23 are connected in series.

In this example, the TMR element has three ferromagnetic layers. Tunneling barrier layers are inserted between the ferromagnetic layers. Antiferromagnetic layers are added to the two ferromagnetic layers (pinning layers) at two ends. The middle layer in the three ferromagnetic layers serves as a free layer (storing layer) in which the magnetizing direction can be freely changed.

For the TMR element shown in FIG. 25, a storing layer has a three-layered structure with two ferromagnetic layers and a nonmagnetic metal layer sandwiched therebetween. With this structure, lines of magnetic force in the two ferromagnetic layers of the storing layer can easily be closed. That is, since any antimagnetic field component in the two ferromagnetic layers of the storing layer can be prevented, the MR ratio can be improved. The switching current can be easily reduced without deteriorating the memory retention characteristics.

By thinning the storing layer consisted of one magnetic layer, the switching current can be reduced. But the memory retention characteristics, for example, the case of the disturbance by writing of a neighboring cell, deteriorate. The storing layer consisted of two magnetic layers and one non-magnetic layer can be reduced the switching current by thinning the storing layer like the storing layer consisted of one magnetic layer. By using magnetic coupling of two magnetic layers, the memory retention characteristics do not deteriorate.

The structural examples of the TMR element have been described above. In the present invention (circuit structure, device structure, read operation principle, read circuit, and manufacturing method), the structure of the TMR element is not particularly limited. The above-described three structural examples are mere representative examples of the TMR element structure.

(3) Application Example

An application example of the device structure of the magnetic random access memory according to the present invention will be described. As a characteristic feature of this application example, TMR elements are stacked at a plurality of stages to increase the memory capacity.

Assume that a cross-point memory cell array according to the present invention is arranged at one stage. When TMR elements are stacked at n (n is an integer; n≧2) stages, the cell size of a memory cell is $4F^2/n$. F is the minimum size of design rule.

Figure 26:
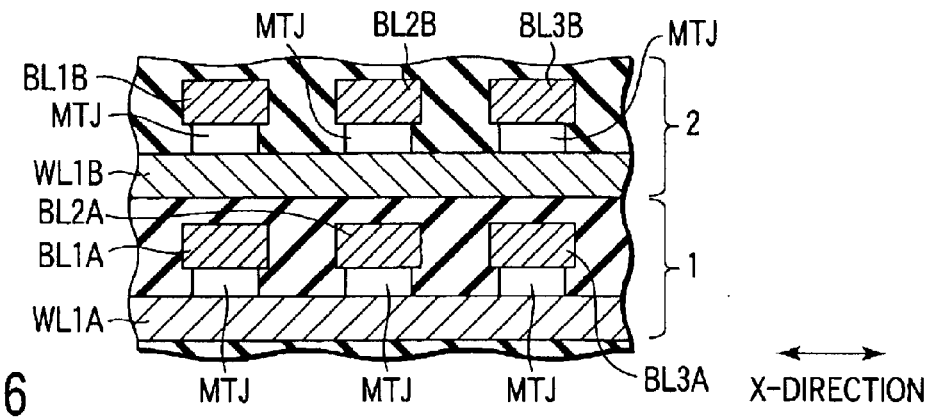
FIG. 26 is a view showing an example of the cell array structure according to the present invention.

FIG. 26 shows an example of the device structure when TMR elements are stacked at two stages.

A word line WL1A running in the X-direction is arranged immediately under the TMR elements MTJ at the first stage. Bit lines BL1A, BL2A, and BL3A running in the Y-direction perpendicular to the X-direction are arranged immediately on the TMR elements MTJ at the first stage. The TMR elements MTJ are arranged at the intersections between the word line WL1A and the bit lines BL1A, BL2A, and BL3A and are in contact with both the word line and bit lines.

Similarly, a word line WL1B running in the X-direction is arranged immediately under the TMR elements MTJ at the second stage. Bit lines BL1B, BL2B, and BL3B running in the Y-direction are arranged immediately on the TMR elements MTJ at the second stage. The TMR elements MTJ are arranged at the intersections between the word line WL1B and the bit lines BL1B, BL2B, and BL3B and are in contact with both the word line and bit lines.

Figure 27:
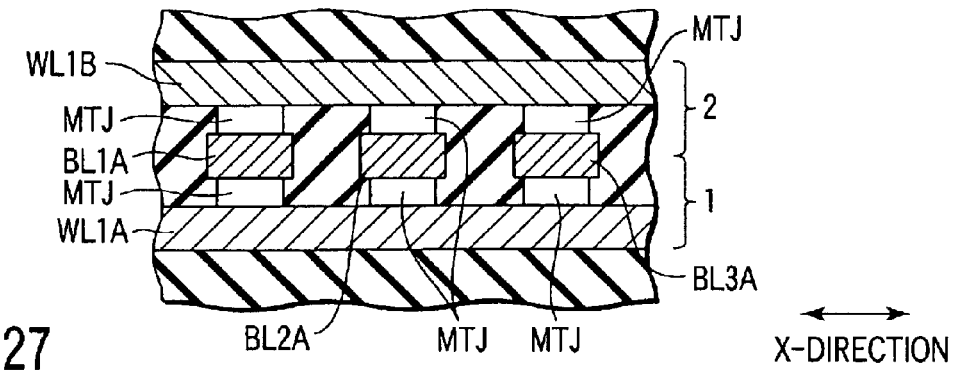
FIG. 27 is a view showing another example of the cell array structure according to the present invention.

FIG. 27 shows an improved example of the device structure shown in FIG. 26. As a characteristic feature, one bit line is shared by TMR elements at the first and second stages.

The word line WL1A running in the X-direction is arranged immediately under the TMR elements MTJ at the first stage. The bit lines BL1A, BL2A, and BL3A running in the Y-direction perpendicular to the X-direction are arranged immediately on the TMR elements MTJ at the first stage. The TMR elements MTJ are arranged at the intersections between the word line WL1A and the bit lines BL1A, BL2A, and BL3A and are in contact with both the word line and bit lines.

The bit lines BL1A, BL2A, and BL3A are arranged immediately under the TMR elements MTJ at the second stage. The word line WL1B running in the X-direction is arranged immediately on the TMR elements MTJ at the second stage. The TMR elements MTJ are arranged at the intersections between the word line WL1B and the bit lines BL1A, BL2A, and BL3A and are in contact with both the word line and bit lines.

In the device structure of this example, the bit lines BL1A, BL2A, and BL3A are shared by the TMR elements MTJ at the first stage and those at the second stage. Hence, even when the TMR elements MTJ are stacked at a plurality of stages, the number of bit lines does not excessively increase. As a result, the area for the driver/sinker (transistor) connected to the bit lines BL1A, BL2A, and BL3A does not increase.

Figure 28:
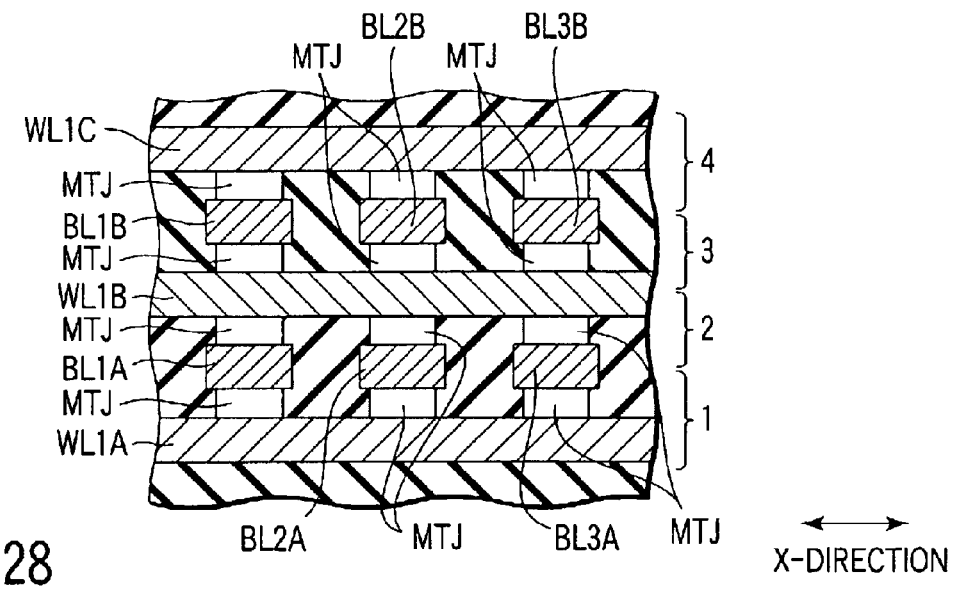
FIG. 28 is a view showing still another example of the cell array structure according to the present invention.

FIG. 28 shows an improved example of the device structure shown in FIG. 27. As a characteristic feature, one bit line is shared by TMR elements at the upper and lower stages. In addition, one word line is shared by TMR elements at the upper and lower stages.

The word line WL1A running in the X-direction is arranged immediately under the TMR elements MTJ at the first stage. The bit lines BL1A, BL2A, and BL3A running in the Y-direction perpendicular to the X-direction are arranged immediately on the TMR elements MTJ at the first stage. The TMR elements MTJ are arranged at the intersections between the word line WL1A and the bit lines BL1A, BL2A, and BL3A and are in contact with both the word line and bit lines.

The bit lines BL1A, BL2A, and BL3A are arranged immediately under the TMR elements MTJ at the second stage. The word line WL1B running in the X-direction is arranged immediately on the TMR elements MTJ at the second stage. The TMR elements MTJ are arranged at the intersections between the word line WL1B and the bit lines BL1A, BL2A, and BL3A and are in contact with both the word line and bit lines.

This structure is the same as in FIG. 27. In this example, the word line WL1B is arranged immediately under the TMR elements MTJ at the third stage. In addition, the bit lines BL1B, BL2B, and BL3B running in the Y-direction are arranged immediately on the TMR elements MTJ at the third stage. The TMR elements MTJ are arranged at the intersections between the word line WL1B and the bit lines BL1B, BL2B, and BL3B and are in contact with both the word line and bit lines.

The bit lines BL1B, BL2B, and BL3B are arranged immediately under the TMR elements MTJ at the fourth stage. In addition, a word line WL1C running in the X-direction is arranged immediately on the TMR elements MTJ at the fourth stage. The TMR elements MTJ are arranged at the intersections between the word line WL1C and the bit lines BL1B, BL2B, and BL3B and are in contact with both the word line and bit lines.

In the device structure of this example, the bit lines BL1A, BL2A, and BL3A are shared by the TMR elements MTJ at the first stage and those at the second stage. The bit lines BL1B, BL2B, and BL3B are shared by the TMR elements MTJ at the third stage and those at the fourth stage. The word line WL1B is shared by the TMR elements MTJ at the second stage and those at the third stage.

Hence, in the device structure of this example, the number of word lines or bit lines does not increase in proportion to the number of stages of the stacked TMR elements MTJ. For this reason, the memory capacity can easily be increased by stacking the TMR elements MTJ at a plurality of stages.

When TMR elements are stacked at three or more stages, care must be taken for bias potential application to the bit lines of the present invention.

When TMR elements are stacked at three or more stages, the number of bit lines to which the bias potential is applied changes depending on the layout position (the stage) of the TMR elements to be read-accessed.

For the example shown in FIG. 28, to read data of the TMR elements MTJ at the first stage, a read current is supplied between the word line WL1A and one of the bit lines BL1A, BL2A, and BL3A. In this case, the current path between the bit lines BL1A, BL2A, and BL3A is blocked. Hence, the bias potential is applied only to the bit lines BL1A, BL2A, and BL3A.

That is, to read data of the TMR elements MTJ at the first stage, the bias potential needs to be applied only to the bit lines BL1A, BL2A, and BL3A.

To read data of the TMR elements MTJ at the fourth stage, the bias potential is applied only to the bit lines BL1B, BL2B, and BL3B by the same principle.

However, to read data of the TMR elements MTJ at, e.g., the second stage, a read current must be supplied between the word line WL1B and one of the bit lines BL1A, BL2A, and BL3A. In this case, in addition to the current path between the bit lines BL1A, BL2A, and BL3A, the current path between the bit lines BL1B, BL2B, and BL3B must also be blocked.

Hence, to read data of the TMR elements MTJ at the second stage, the bias potential is applied to the bit lines BL1A, BL2A, and BL3A and bit lines BL1B, BL2B, and BL3B.

To read data of the TMR elements MTJ at the third stage, the bias potential is applied to the bit lines BL1A, BL2A, and BL3A and bit lines BL1B, BL2B, and BL3B by the same principle.

Figure 29:
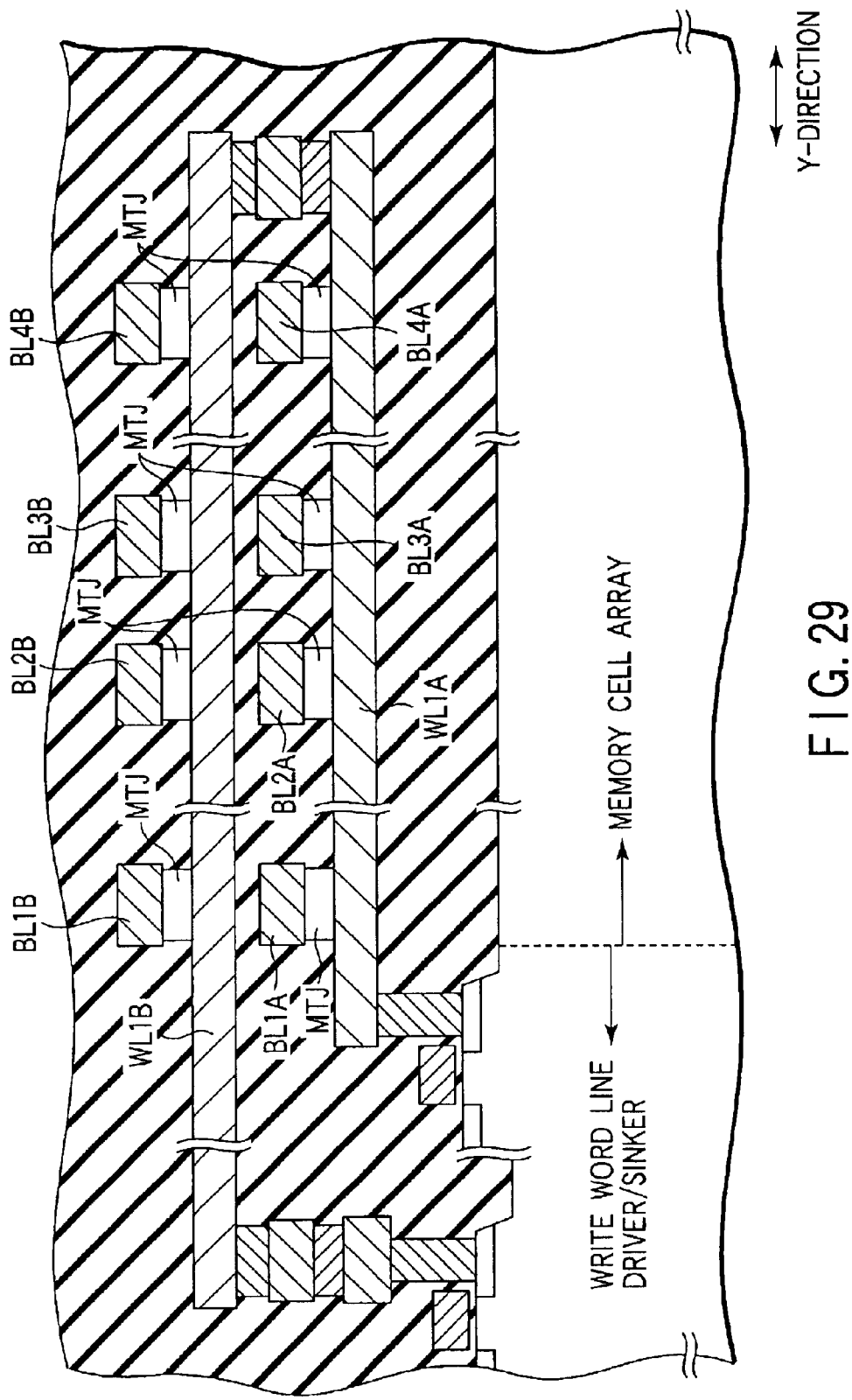
FIG. 29 is a view showing still another example of the cell array structure according to the present invention.

FIG. 29 shows an improved example of the device structure shown in FIG. 26.

As a characteristic feature of this device structure, interconnections having the same function and arranged at different stages are connected in series.

In this example, the word line WL1A running in the X-direction and connected to the TMR elements MTJ at the first stage and the word line WL1B running in the X-direction and connected to the TMR elements MTJ at the second stages are connected in series.

In this example, the TMR elements MTJ are stacked at two stages. Hence, each of the word lines WL1A and WL1B has a folded structure in which the word line is directed from one end to the other end of the memory cell array, folded, and then directed from the other end to one end of the memory cell array.

However, the device structure of this example can also be applied to a device having TMR elements stacked at three or more stages. In this case, each word line zigzags through the memory cell array.

The structure in which word lines arranged at different stages are connected in series can also be applied to the device structure (e.g., FIG. 27) wherein one bit line is shared by TMR elements at the upper stages and those at the lower stage or the device structure (e.g., FIG. 28) wherein one word line or one bit line is shared by TMR elements at the upper stages and those at the lower stages. However, the device structure wherein two word lines arranged at different stages share the same bit line by two TMR elements is not effective for increasing memory capacity. For example, at the device structure shown in FIG. 27, the device structure wherein the WL1B is connected to WL1A is not effective for increasing memory capacity. Because the TMR element at the upper stage cannot be distinguish from the TMR element that shares same bit line by addressing. At the device structure shown in FIG. 28, the device structure wherein the BL1B is connected to BL1A is not effective for increasing memory capacity. Because the TMR element at the upper stage cannot be distinguish from the TMR element that shares same word line by addressing.

In this example, word lines arranged at different stages are connected in series. These word lines may be connected in parallel.

Figure 30:
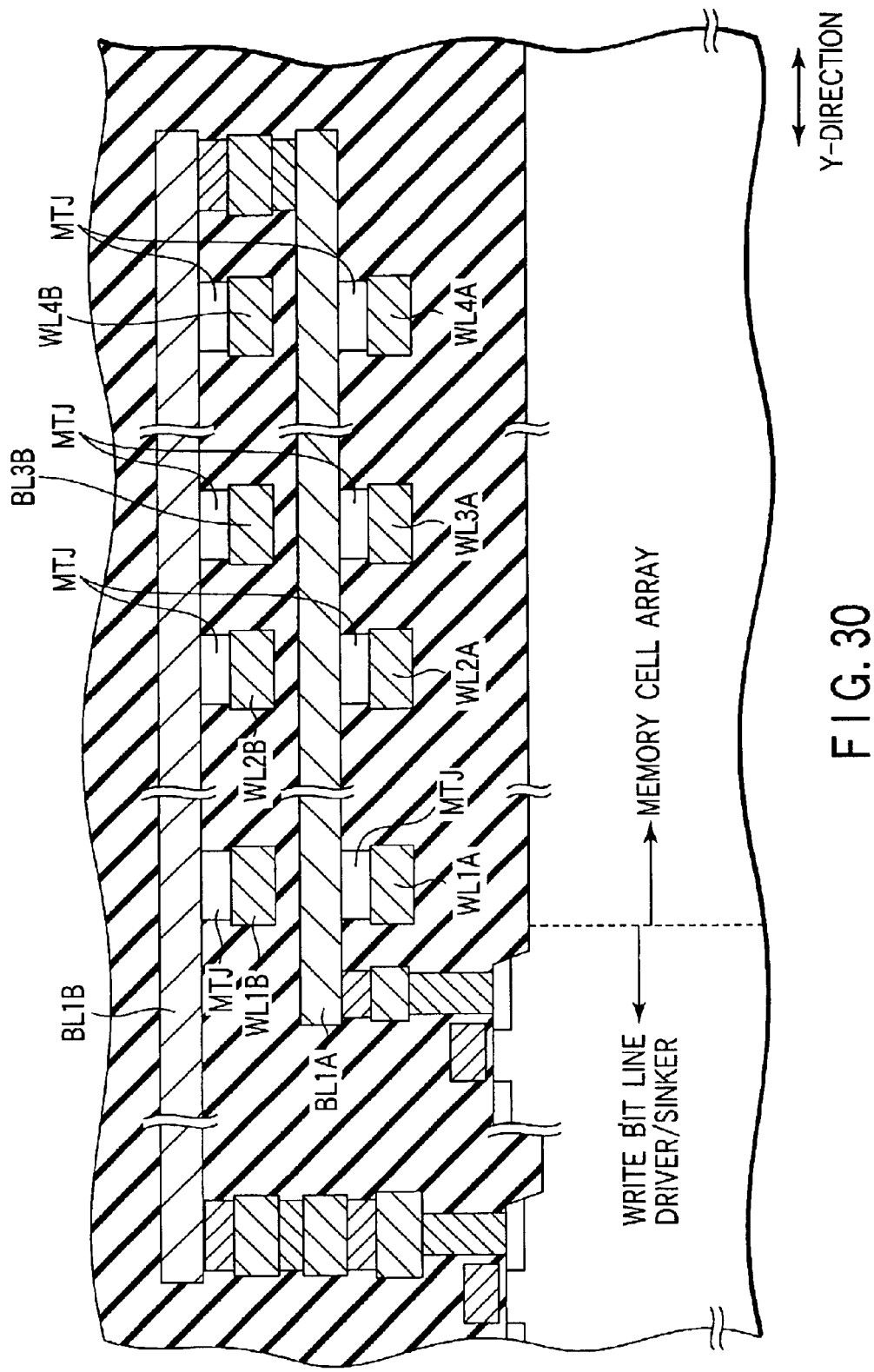
FIG. 30 is a view showing still another example of the cell array structure according to the present invention.

FIG. 30 also shows an improved example of the device structure shown in FIG. 26.

As a characteristic feature of this device structure shown in FIG. 30, the bit lines BL1A and BL1B have the folded structure, unlike the device structure in FIG. 29 in which the word lines WL1A and WL1B have the folded structure.

In this example, the bit line BL1A running in the Y-direction and connected to the TMR elements MTJ at the first stage and the bit line BL1B running in the Y-direction and connected to the TMR elements MTJ at the second stages are connected in series. The TMR elements MTJ are stacked at two stages. Hence, each of the bit lines BL1A and BL1B has a structure in which the bit line is directed from one end to the other end of the memory cell array, folded, and then directed from the other end to one end of the memory cell array.

However, in the device structure of this example as well, when TMR elements are stacked at three or more stages, each bit line zigzags through the memory cell array.

The structure in which bit lines arranged at different stages are connected in series can also be applied to the device structure (e.g., FIG. 28) wherein one word line or one bit line is shared by TMR elements at the upper stages and those at the lower stages.

In this example, bit lines arranged at different stages are connected in series. These bit lines may be connected in parallel.

4. Application Examples to Structures Other Than Cross-Point Cell Array Structures Applications of the present invention to cross-point cell array structures have been described above. However, the present invention can also be applied to a magnetic random access memory having a structure other than a cross-point cell array structure.

Several examples will be described below.

(1) Application Example 1

① Circuit Structure

FIG. 31 shows the main part of a magnetic random access memory according to Application Example 1 of the present invention.

As the first characteristic feature of the cell array structure of this example, one terminal of each of a plurality of TMR elements of a read block is commonly connected. As the second characteristic feature, the other terminal of each of a plurality of TMR elements of a read block is independently connected to a read bit line. As the third characteristic feature, one terminal of each of a plurality of TMR elements of a read block is directly connected to a read word line without intervening a read select switch.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, . . . , j, k=1, . . . , n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, . . . , j). The read word line RWLi runs in the Y-direction. For example, one read word line RWLi is arranged in one column.

The TMR elements 12 in the blocks BKik arranged in one column are directly connected to the read word line RWLi (i=1, . . . , j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a corresponding one of sense amplifiers & bit line bias circuits 13-1, 13-2, . . . , 13-8 through a row select switch RSW3 (MOS transistor).

A row select line signal RR is input to the row select switch RSW3. A read row decoder 25B outputs the row select line signal RR.

In read operation, the bit line bias circuits 13-1, 13-2, . . . , 13-8 supply a bias potential to the read bit lines RBL4(n−1)+1, RBL4(n−1)+2, RBL4(n−1)+3, and RBL4(n−1)+4, respectively.

In this example, in read operation, instead of supplying a bias potential only to a selected read bit line, a bias potential is supplied to all the read bit lines RBL4(n−1)+1, RBL4(n−1)+2, RBL4(n−1)+3, and RBL4(n−1)+4 connected to the selected read word line RWLi through the TMR elements MTJ.

That is, in this example, all the read bit lines RBL4(n−1)+1, RBL4(n−1)+2, RBL4(n−1)+3, and RBL4(n−1)+4 are set at an equipotential level, thereby blocking the current path from one bit line to another.

In this example, sense amplifiers are connected to all the read bit lines RBL4(n−1)+1, RBL4(n−1)+2, RBL4(n−1)+3, and RBL4(n−1)+4 connected to the selected read word line RWLi through the TMR elements MTJ.

That is, in the read operation, the resistance values (data) of all TMR elements MTJ connected to the selected read word line RWLi are read all at once.

Sense amplifiers may be connected to all the read bit lines RBL4(n−1)+1, RBL4(n−1)+2, RBL4(n−1)+3, and RBL4(n−1)+4 connected to the selected read word line RWLi through the TMR elements MTJ, like this example. Alternatively, a sense amplifier may be connected to only a selected read bit line.

The read bit lines RBL4(n−1)+1, RBL4(n−1)+2, RBL4(n−1)+3, and RBL4(n−1)+4 run in the X-direction (row direction) and also function as write word lines WWL4(n−1)+1, WWL4(n−1)+2, WWL4(n−1)+3, and WWL4(n−1)+4.

The write word lines WWL4(n−1)+1, WWL4(n−1)+2, WWL4(n−1)+3, and WWL4(n−1)+4 run in the X-direction. One end of each of the write word lines WWL4(n−1)+1, WWL4(n−1)+2, WWL4(n−1)+3, and WWL4(n−1)+4 is connected to a common data line 30 through a row select switch (MOS transistor) RSW2. The common data line 30 is connected to a write word line driver 23A.

In write operation, a row select line signal RLi (i=1, . . . , n) is input to the row select switch RSW2. A write row decoder 25A outputs the row select line signal RLi.

The other end of each of the write word lines WWL4(n−1)+1, WWL4(n−1)+2, WWL4(n−1)+3, and WWL4(n−1)+4 is connected to a corresponding one of write word line sinkers 24-1, . . . , 24-n.

Near the four TMR elements 12 of the read block BKik, one write bit line WBLi (i=1 . . . , j) that is shared by the four TMR elements and runs in the Y-direction is arranged. One write bit line WBLi is arranged in one column.

One end of the write bit line WBLi is connected to a circuit block 29A including column decoders & write bit line drivers/sinkers. The other end is connected to a circuit block 31 including column decoders & write bit line drivers/sinkers.

In the write operation, the circuit blocks 29A and 31 are set in an operative state. A write current flows to the write bit line WBLi in a direction toward the circuit block 29A or 31 in accordance with write data.

According to the magnetic random access memory of the present invention, in the read operation, the selected read word line RWLi is set at a predetermined potential (in this example, ground potential) to flow a read current. Simultaneously, each unselected read word line is set in a floating state. In addition, all the read bit lines RBL4(n−1)+1, RBL4(n−1)+2, RBL4(n−1)+3, and RBL4(n−1)+4 connected to the selected read word line RWLi through the TMR elements are set at a predetermined bias potential (e.g., a positive potential).

Hence, in the read operation, as an equivalent circuit of the cell array structure of the magnetic random access memory according to the present invention, only selected TMR elements are connected between a selected read word line and a selected read bit line. The read signal amount of a selected TMR element does not decrease.

In addition, sense amplifiers are connected to all the read bit lines RBL4(n−1)+1, RBL4(n−1)+2, RBL4(n−1)+3, and RBL4(n−1)+4 connected to the selected read word line RWLi through the TMR elements MTJ. Hence, read currents flowing to all the read bit lines RBL4(n−1)+1, RBL4(n−1)+2, RBL4(n−1)+3, and RBL4(n−1)+4 equal each other. The read current stabilizes.

② Device Structure

The device structure will be described next.

[1] Sectional Structure

Figure 32:
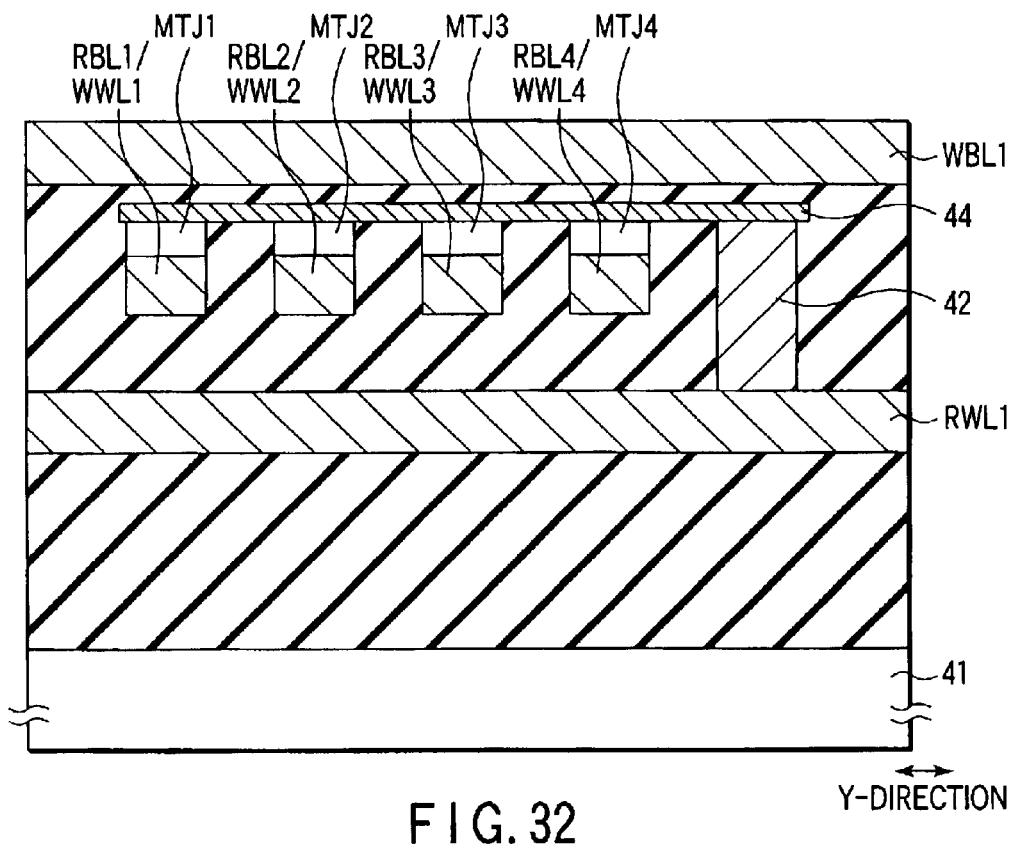
FIG. 32 is a sectional view showing an example of a Structure of a memory of FIG. 31.

FIG. 32 shows the device structure of one block of the magnetic random access memory as Application Example 1 of the present invention.

The same reference numerals as in FIG. 31 denote the same elements in FIG. 32 to show the correspondence between the elements.

A read word line RWL1 that runs in the Y-direction is arranged on a semiconductor substrate 41. No switch element is arranged immediately under the read word line RWL1. Four TMR elements (MTJ (Magnetic Tunnel Junction) elements) MTJ1, MTJ2, MTJ3, and MTJ4 arrayed in the Y-direction are arranged on the read word line RWL1.

One terminal (the upper end in this example) of each of the TMR elements MTJ1, MTJ2, MTJ3, and MTJ4 is commonly connected to an upper electrode 44. A contact plug 42 electrically connects the upper electrode 44 and read word line RWL1.

The other terminal (the lower end in this example) of each of the TMR elements MTJ1, MTJ2, MTJ3, and MTJ4 is electrically connected to a corresponding one of read bit lines RBL1, RBL2, RBL3, and RBL4 (write word lines WWL1, WWL2, WWL3, and WWL4). The read bit lines RBL1, RBL2, RBL3, and RBL4 run in the X-direction (row direction).

The TMR elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four TMR elements MTJ1, MTJ2, MTJ3, and MTJ4.

A write bit line WBL1 is arranged above and near the TMR elements MTJ1, MTJ2, MTJ3, and MTJ4. The write bit line WBL1 runs in the Y-direction (column direction).

In Application Example 1, one write bit line WBL1 is arranged in correspondence with the four TMR elements MTJ1, MTJ2, MTJ3, and MTJ4 of a read block. Instead, for example, the four TMR elements MTJ1, MTJ2, MTJ3, and MTJ4 may be stacked, and four write bit lines may be arranged in correspondence with the four TMR elements MTJ1, MTJ2, MTJ3, and MTJ4.

In Application Example 1, a write bit line BL1 that runs in the Y-direction is arranged above the TMR elements MTJ1, MTJ2, MTJ3, and MTJ4. The read bit lines RBL1, RBL2, RBL3, and RBL4 that run in the X-direction are arranged under the TMR elements MTJ1, MTJ2, MTJ3, and MTJ4.

However, the positional relationship between the write bit line BL1 and the read bit lines RBL1, RBL2, RBL3, and RBL4 with respect to the TMR elements MTJ1, MTJ2, MTJ3, and MTJ4 is not limited to this.

For example, the write bit line WBL1 that runs in the Y-direction may be arranged under the TMR elements MTJ1, MTJ2, MTJ3, and MTJ4, and the read bit lines RBL1, RBL2, RBL3, and RBL4 that run in the X-direction may be arranged above the TMR elements MTJ1, MTJ2, MTJ3, and MTJ4.

According to this device structure, the plurality of TMR elements MTJ1, MTJ2, MTJ3, and MTJ4 in the read block are electrically connected to the different read bit lines RBL1, RBL2, RBL3, and RBL4 (write word lines WWL1, WWL2, WWL3, and WWL4), respectively. For this reason, data of the plurality of TMR elements MTJ1, MTJ2, MTJ3, and MTJ4 in the read block can be read all at once by one read step.

In addition, one terminal of each of the plurality of TMR elements MTJ1, MTJ2, MTJ3, and MTJ4 in the read block is commonly connected. The connection point is directly connected to the read word line RWL1 without intervening any read select switch. Furthermore, the write bit line WBL1 that runs in the Y-direction is shared by the plurality of TMR elements MTJ1, MTJ2, MTJ3, and MTJ4 in the read block. For this reason, the degree of integration and characteristics of the TMR elements can be improved.

[2] Planar Structure

Figure 33:
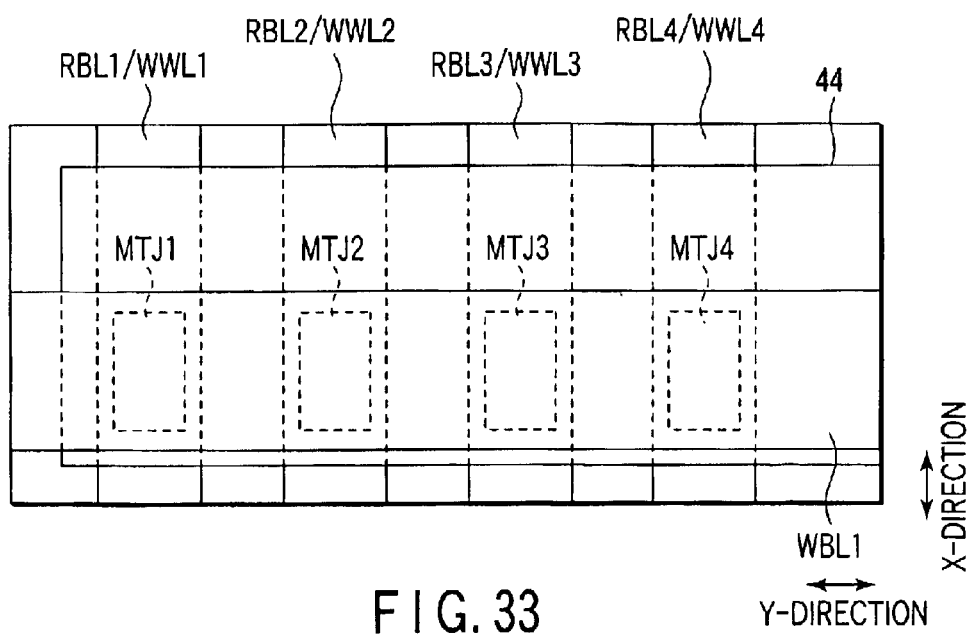
FIG. 33 is a plane view showing an example of a Structure of a memory of FIG. 31.

FIG. 33 shows the positional relationship between the TMR elements, the read bit lines (write word lines), and the write bit line in the device structure shown in FIG. 32.

The upper electrode 44 of the TMR elements MTJ1, MTJ2, MTJ3, and MTJ4 has, e.g., a rectangular pattern. A contact region for a contact plug is formed at part of the upper electrode 44.

The TMR elements MTJ1, MTJ2, MTJ3, and MTJ4 are arranged in the Y-direction. Their axes of easy magnetization (a direction parallel to the long side of each TMR element) are directed to the X-direction. That is, each of the TMR elements MTJ1, MTJ2, MTJ3, and MTJ4 has a rectangular shape long in the X-direction.

The TMR elements MTJ1, MTJ2, MTJ3, and MTJ4 are arranged in a region where the write bit line WBL1 crosses the read bit lines RBL1, RBL2, RBL3, and RBL4 (write word lines WWL1, WWL2, WWL3, and WWL4).

(2) DETAILED EXAMPLE

A detailed example of the magnetic random access memory shown in FIG. 31 and, more particularly, a detailed example of a read circuit will be described below.

① Detailed Example 1

Figure 34:
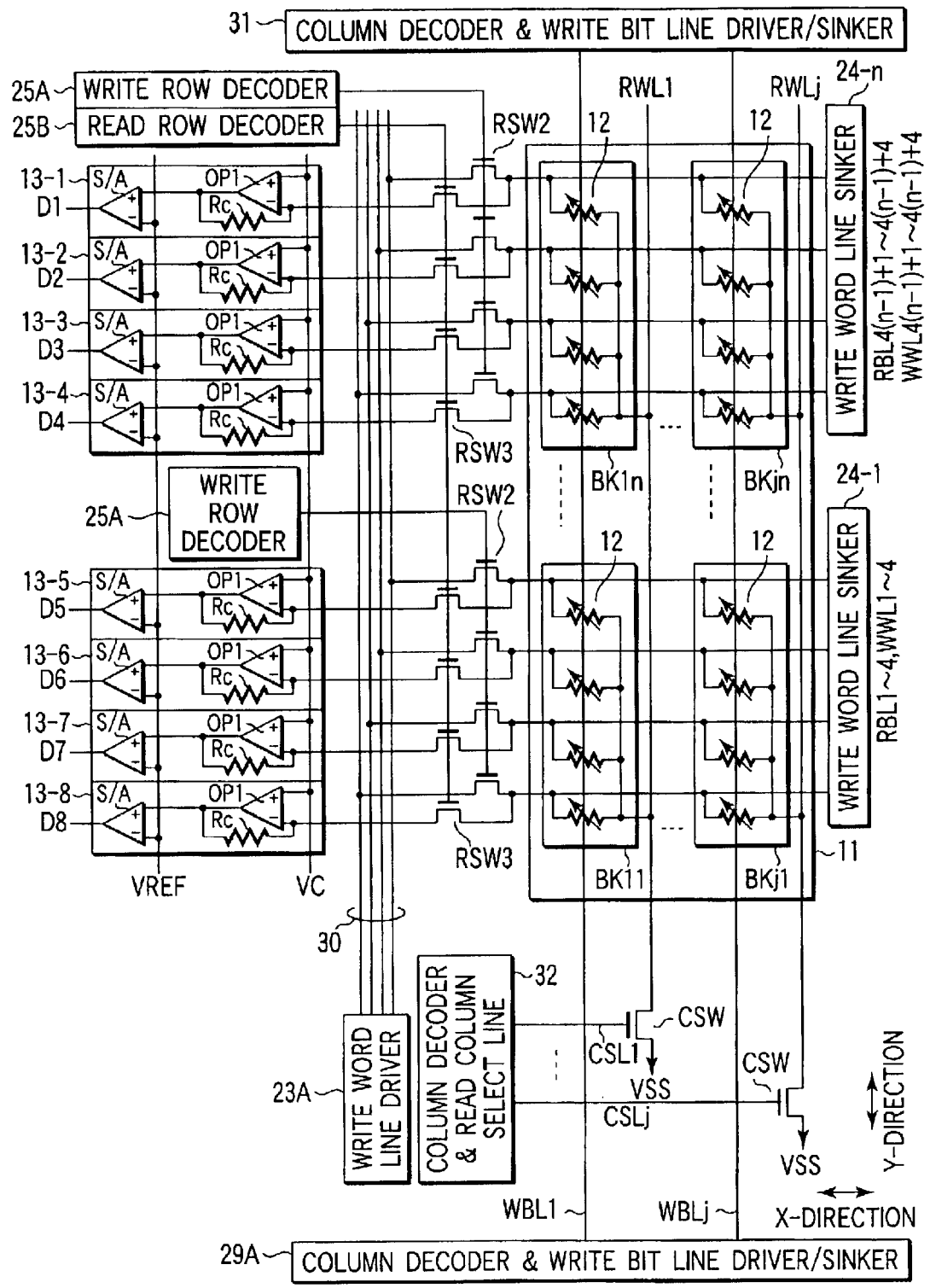
FIG. 34 is a view showing a detailed example 1 of an application example 1.

FIG. 34 shows Detailed Example 1 of the magnetic random access memory shown in FIG. 31.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, ..., j, k=1, ..., n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, ..., j). The read word line RWLi runs in the Y-direction. For example, one read word line RWLi is arranged in one column.

The TMR elements 12 in the blocks BKik arranged in one column are directly connected to the read word line RWLi (i=1, ..., j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a circuit block 13-$i$ ($i$=1, 2, ..., 8) including a sense amplifier and bit line bias circuit through a row select switch RSW3 (MOS transistor). In read operation, the bit line bias circuits supply a bias potential to the read bit lines RBL4(n−1)+1, RBL4(n−1)+2, RBL4(n−1)+3, and RBL4(n−1)+4, respectively.

In this example, each circuit block 13-$i$ is formed from an operational amplifier OP1, sense amplifier S/A, and resistive element Rc.

Each of the read bit lines RBL4(n−1)+1, RBL4(n−1)+2, RBL4(n−1)+3, and RBL4(n−1)+4 is connected to the negative input terminal of a corresponding operational amplifier OP1 on the input side. A clamp potential (bias potential) VC is applied to the positive input terminal of the operational amplifier OP1. The resistive element (feedback resistive element) Rc is connected between the output terminal and the negative input terminal of the operational amplifier OP1. The operational amplifier OP1 outputs an output potential to equalize the potential of the bit line BLi with the clamp potential.

The output terminal of the operational amplifier OP1 is connected to the positive input terminal of the sense amplifier (e.g., a differential amplifier) S/A. A reference potential VREF is applied to the negative input terminal of the sense amplifier S/A.

The sense amplifier S/A compares the output potential of the operational amplifier OP1 with the reference potential VREF, thereby discriminating read data.

Let Rm be the resistance value of the TMR element MTJ, Rc be the resistance value of the resistive element connected between the output terminal and the negative input terminal of the operational amplifier OP1. The voltage across the TMR elements is applied Vm by the function of the operational amplifier OP1. An output potential Vo of the operational amplifier is given by $$Vo=Vc \times (1+Rc/Rm)$$

The sense amplifier S/A compares the output potential Vo with the reference potential VREF, thereby determining the resistance values (data) of the TMR elements MTJ connected to the selected read word line RWLi.

Sense amplifiers S/A may be connected to all the read bit lines RBL4(n−1)+1, RBL4(n−1)+2, RBL4(n−1)+3, and RBL4(n−1)+4 connected to the selected read word line RWLi through the TMR elements MTJ, as in this example. Alternatively, a sense amplifier may be connected to only the selected read bit line.

According to Detailed Example 1 of the magnetic random access memory of the present invention, in the read operation, only the selected TMR element MTJ is connected between the selected word line WLi and the selected bit line BLi. Hence, the read signal amount of the selected TMR element MTJ does not decrease.

② Detailed Example 2

FIG. 35 shows Detailed Example 2 of the magnetic random access memory shown in FIG. 31.

Detailed Example 2 is an application example of Detailed Example 1 and shows a circuit for generating the reference potential VREF in Detailed Example 1 in detail.

Detailed Example 2 proposes a circuit which generates the reference potential VREF using TMR elements which store "0" data and TMR elements which store "1" data.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, ..., j, k=1, ..., n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, ..., j). The read word line RWLi runs in the Y-direction. For example, one read word line RWLi is arranged in one column.

The TMR elements 12 in the blocks BKik arranged in one column are directly connected to the read word line RWLi (i=1, ..., j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a circuit block 13-i (i=1, 2, ..., 8) including a sense amplifier and bit line bias circuit through a row select switch RSW3 (MOS transistor). In read operation, the bit line bias circuits supply a bias potential to the read bit lines RBL4(n−1)+1, RBL4(n−1)+2, RBL4(n−1)+3, and RBL4(n−1)+4, respectively.

In this example, each circuit block 13-i is formed from an operational amplifier OP1, sense amplifier S/A, and resistive element Rc, as in Detailed Example 1.

Each bit line BLi is connected to the negative input terminal of a corresponding operational amplifier OP1 on the input side. A clamp potential (bias potential) VC is applied to the positive input terminal of the operational amplifier OP1. The resistive element Rc is connected between the output terminal and the negative input terminal of the operational amplifier OP1. The operational amplifier OP1 outputs an output potential to equalize the potential of the bit line BLi with the clamp potential.

The output terminal of the operational amplifier OP1 is connected to the positive input terminal of the sense amplifier S/A. A reference potential VREF is applied to the negative input terminal of the sense amplifier S/A.

The sense amplifier S/A compares the output potential of the operational amplifier OP1 with the reference potential VREF, thereby discriminating read data.

The reference potential VREF is generated by a reference potential generating circuit 19 including TMR elements (reference cells) which store "0" data and TMR elements (reference cells) which store "1" data.

The reference potential generating circuit 19 has bit lines rBL"0" and rBL"1" that run in the X-direction.

At the intersections between all the read word lines RWLi and the bit line rBL"0", the TMR elements MTJ connected between these read word lines RWLi and the bit line rBL"0" are arranged. All the TMR elements MTJ arranged at the intersection between all the read word lines RWLi and the bit line rBL"0" store "0" data.

At the intersections between all the read word lines RWLi and the bit line rBL"1", the TMR elements MTJ connected between these read word lines RWLi and the bit line rBL"1" are arranged. All the TMR elements MTJ arranged at the intersection between all the read word lines RWLi and the bit line rBL"1" store "1" data.

According to this arrangement, in read operation, "0" data is read to the bit line rBL"0", and "1" data is read to the bit line rBL"1" always independently of the selected one of the plurality of read word lines RWL1, ..., RWLj.

In the read operation, when a read signal READ changes to "H", the bit lines rBL"0" and rBL"1" are short-circuited to each other by an equalize switch (NMOS transistor) ESW.

Each of the bit lines rBL"0" and rBL"1" is connected to the negative input terminal of an operational amplifier OP2 whose circuit is same as the operational amplifier OP1. The output terminal of the operational amplifier OP2 connected to the bit line rBL"0" and the output terminal of the operational amplifier OP2 connected to the bit line rBL"1" are short-circuited to each other.

Like the operational amplifier OP1 of the read circuit, the clamp potential (bias potential) VC is input to the positive input terminal of the operational amplifier OP2. Additionally, a resistive element Rc is connected between the output terminal and the negative input terminal.

As a result, the reference potential VREF is output from the output terminal of the operational amplifier OP2.

According to Detailed Example 2 of the magnetic random access memory of the present invention, in the read operation, only the selected TMR element MTJ is connected between the selected read word line RWLi and the selected read bit line RBLi. Hence, the read signal amount of the selected TMR element MTJ does not decrease.

Furthermore, in Detailed Example 2, in the read operation, the reference potential VREF is generated using TMR elements which store "0" data and TMR elements which store "1" data. For this reason, the reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

③ Detailed Example 3

Figure 36:
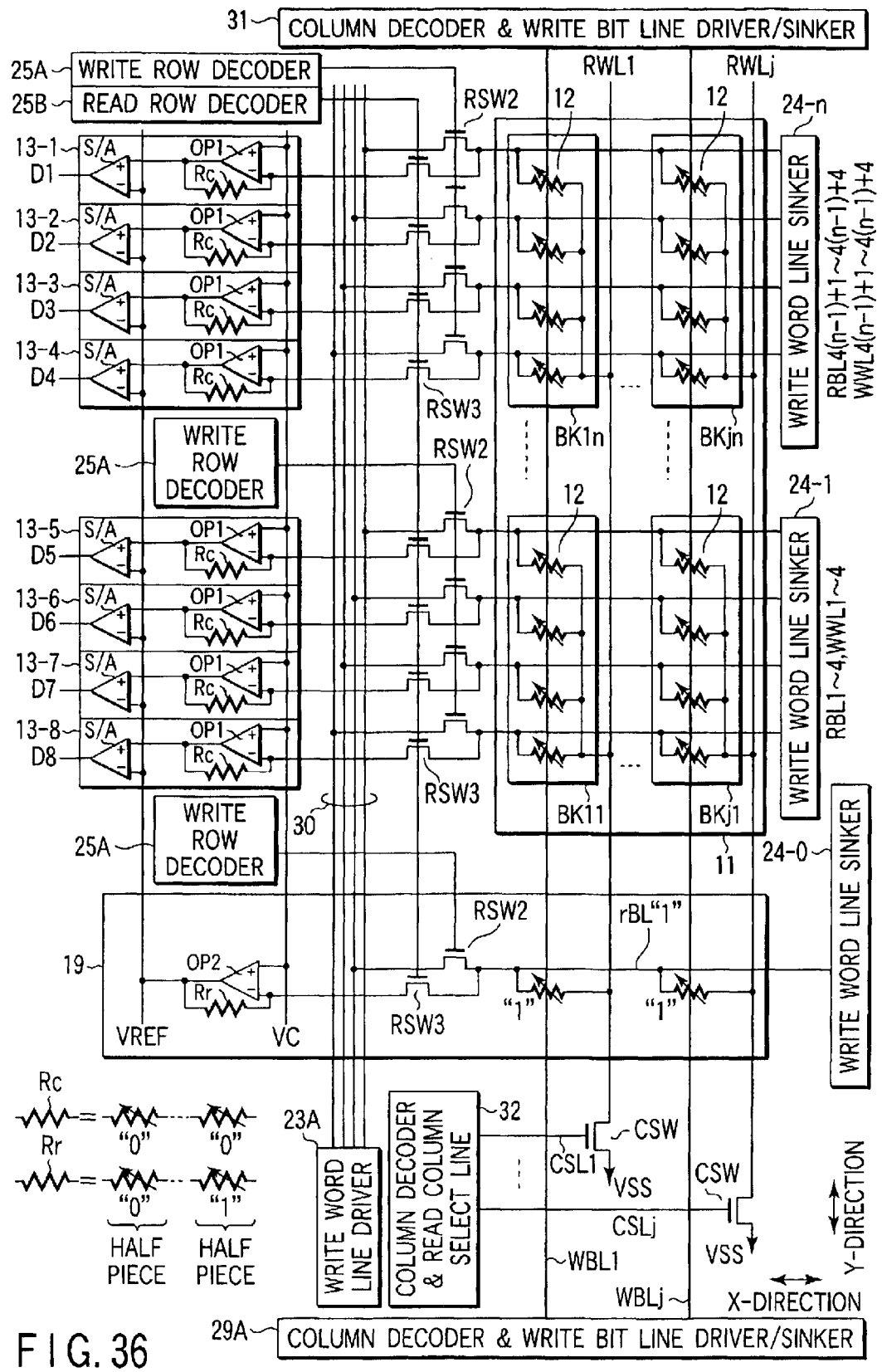
FIG. 36 is a view showing a detailed example 3 of an application example 1.

FIG. 36 shows Detailed Example 3 of the magnetic random access memory shown in FIG. 31.

Detailed Example 3 is an improved example of Detailed Example 2 and simplifies the circuit structure of a reference potential generating circuit 19 in Detailed Example 2.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, ..., j, k=1, ..., n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, ..., j). The read word line RWLi runs in the Y-direction. For example, one read word line RWLi is arranged in one column.

The TMR elements 12 in the blocks BKik arranged in one column are directly connected to the read word line RWLi (i=1, ..., j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a circuit block 13-i (i=1, 2, ..., 8) including a sense amplifier and bit line bias circuit through a row select switch RSW3 (MOS transistor). In read operation, the bit line bias circuits supply a bias potential to the read bit lines RBL4(n−1)+1, RBL4(n−1)+2, RBL4(n−1)+3, and RBL4(n−1)+4, respectively.

Each circuit block 13-i is formed from an operational amplifier OP1, sense amplifier S/A, and resistive element Rc, as in Detailed Example 2.

Each of the read bit lines RBL4(n−1)+1, RBL4(n−1)+2, RBL4(n−1)+3, and RBL4(n−1)+4 is connected to the negative input terminal of a corresponding operational amplifier OP1 on the input side. A clamp potential (bias potential) VC is applied to the positive input terminal of the operational amplifier OP1. The resistive element Rc is connected between the output terminal and the negative input terminal of the operational amplifier OP1.

The output terminal of the operational amplifier OP1 is connected to the positive input terminal of the sense amplifier S/A. A reference potential VREF is applied to the negative input terminal of the sense amplifier S/A.

The sense amplifier S/A compares the output potential of the operational amplifier OP1 with the reference potential VREF, thereby discriminating read data.

The reference potential generating circuit 19 has a bit line rBL"1" that runs in the X-direction. At the intersections between all the read word lines RWLi and the bit line rBL"1", the TMR elements (reference cells) MTJ connected between these read word lines RWLi and the bit line rBL"1" are arranged. All the TMR elements MTJ arranged at the intersection between all the read word lines RWLi and the bit line rBL"1" store "1" data.

The bit line rBL"1" is connected to the negative input terminal of an operational amplifier OP2 whose circuit is same as the operational amplifier OP1. The clamp potential VC is input to the positive input terminal of the operational amplifier OP2. A resistive element Rr is connected between the output terminal and the negative input terminal of the operational amplifier OP2. The reference potential VREF is output from the output terminal of the operational amplifier OP2.

Each of the resistive element Rc connected to the operational amplifier OPT on the data cell side and used to read data and the resistive element Rr connected to the operational amplifier OP2 on the reference cell side and used to generate the reference potential VREF is formed from an even number of TMR elements (TMR elements having the same structure as the TMR element MTJ serving as a memory cell) connected in series.

All the even number of TMR elements that construct the resistive element Rc are set in a state wherein data "0" is written (a low resistance state). On the other hand, a half of the even number of TMR elements that construct the resistive element Rr is set in a state wherein data "0" is written (a low resistance state). The remaining half is set in a state wherein data "1" is written (a high resistance state).

According to this arrangement, in the read operation, data of the TMR elements MTJ connected to the selected read word line RWLi are read to the read bit lines RBL4(n−1)+1, RBL4(n−1)+2, RBL4(n−1)+3, and RBL4(n−1)+4, and "1" data is read to the bit line rBL"1".

The reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

④ Detailed Example 4

Figure 37:
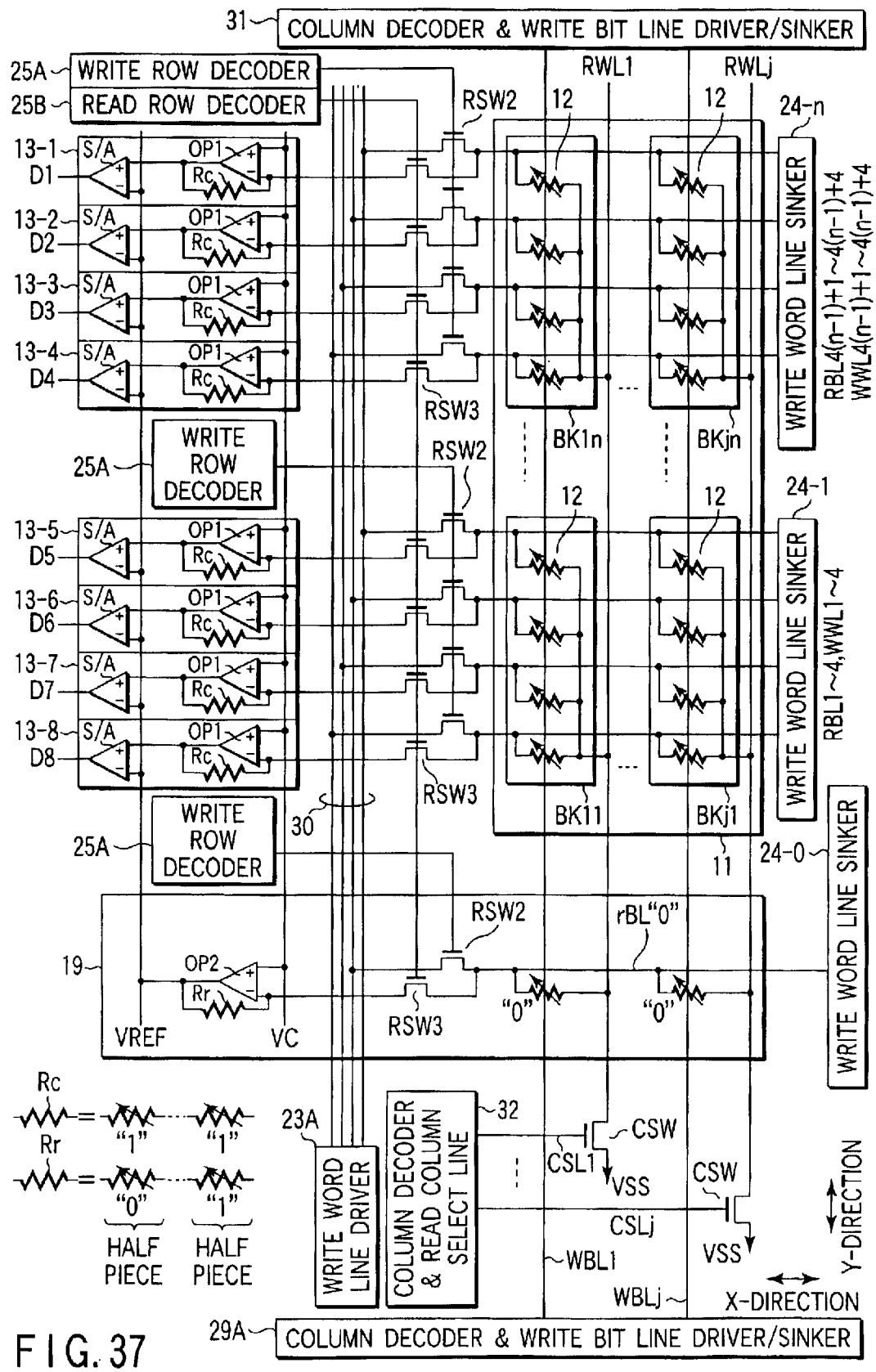
FIG. 37 is a view showing a detailed example 4 of an application example 1.

FIG. 37 shows Detailed Example 4 of the magnetic random access memory shown in FIG. 31.

Detailed Example 4 is also an improved example of Detailed Example 2. Detailed Example 4 proposes a technique of generating a reference potential VREF by the same principle as that of Detailed Example 3 except that the "0"/"1" relationship is reversed to that of Detailed Example 3.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, . . . j, k=1, . . . , n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, . . . , j). The read word line RWLi runs in the Y-direction. For example, one read word line RWLi is arranged in one column.

The TMR elements 12 in the blocks BKik arranged in one column are directly connected to the read word line RWLi (i=1, . . . , j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a circuit block 13-i (i=1, 2, . . . , 8) including a sense amplifier and bit line bias circuit through a row select switch RSW3 (MOS transistor). In read operation, the bit line bias circuits supply a bias potential to the read bit lines RBL4(n−1)+1, RBL4(n−1)+2, RBL4(n−1)+3, and RBL4(n−1)+4, respectively.

Each circuit block 13-i is formed from an operational amplifier OP1, sense amplifier S/A, and resistive element Rc, as in Detailed Example 2.

Each of the read bit lines RBL4(n−1)+1, RBL4(n−1)+2, RBL4(n−1)+3, and RBL4(n−1)+4 is connected to the negative input terminal of a corresponding operational amplifier OP1 on the input side. A clamp potential (bias potential) VC is applied to the positive input terminal of the operational amplifier OP1. The resistive element Rc is connected between the output terminal and the negative input terminal of the operational amplifier OP1.

The output terminal of the operational amplifier OP1 is connected to the positive input terminal of the sense amplifier S/A. A reference potential VREF is applied to the negative input terminal of the sense amplifier S/A.

The sense amplifier S/A compares the output potential of the operational amplifier OP1 with the reference potential VREF, thereby discriminating read data.

A reference potential generating circuit 19 has a bit line rBL"0" that runs in the X-direction. At the intersections between all the read word lines RWLi and the bit line rBL"0", the TMR elements (reference cells) MTJ connected between these read word lines RWLi and the bit line rBL"0" are arranged. All the TMR elements MTJ arranged at the intersection between all the read word lines RWLi and the bit line rBL"0" store "0" data.

The bit line rBL"0" is connected to the negative input terminal of an operational amplifier OP2 whose circuit is same as the operational amplifier OP1. The clamp potential VC is input to the positive input terminal of the operational amplifier OP2. A resistive element Rr is connected between the output terminal and the negative input terminal of the operational amplifier OP2. The reference potential VREF is output from the output terminal of the operational amplifier OP2.

Each of the resistive element Rc connected to the operational amplifier OP1 on the data cell side and used to read data and the resistive element Rr connected to the operational amplifier OP2 on the reference cell side and used to generate the reference potential VREF is formed from an even number of TMR elements (TMR elements having the same structure as the TMR element MTJ serving as a memory cell) connected in series.

All the even number of TMR elements that construct the resistive element Rc are set in a state wherein data "1" is written (a high resistance state). On the other hand, a half of the even number of TMR elements that construct the resistive element Rr is set in a state wherein data "0" is written (a low resistance state). The remaining half is set in a state wherein data "1" is written (a high resistance state).

According to this arrangement, in the read operation, data of the TMR elements MTJ connected to the selected read word line RWLi are read to the read bit lines RBL4(n−1)+1, RBL4(n−1)+2, RBL4(n−1)+3, and RBL4(n−1)+4, and "0" data is read to the bit line rBL"1".

The reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

(3) Application Example 2

Figure 38:
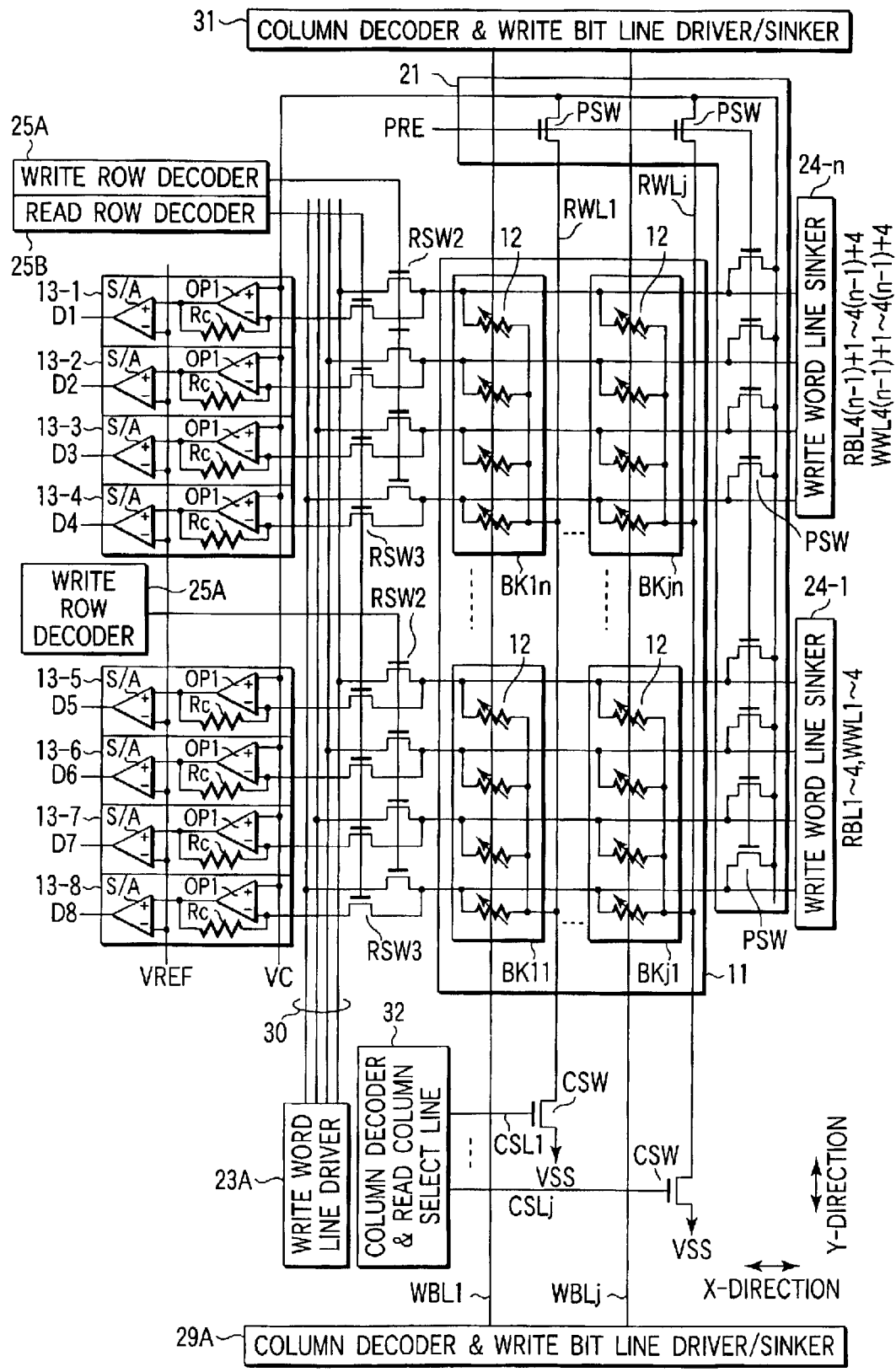
FIG. 38 is a view showing an application example 2 of a magnetic random access memory of the present invention.

FIG. 38 shows the circuit structure of a magnetic random access memory according to Application Example 2 of the present invention.

The circuit structure shown in FIG. 38 is an improved example of Detailed Example 1 (FIG. 34) of Application Example 1. As its characteristic feature, a precharge circuit which precharges all read word lines RWLi and all read bit lines RBLi to a precharge potential in advance in read operation is added to Detailed Example 1 of Application Example 1.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, . . . , j, k=1, . . . , n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, . . . , j). The read word line RWLi runs in the Y-direction. For example, one read word line RWLi is arranged in one column.

The TMR elements 12 in the blocks BKik arranged in one column are directly connected to the read word line RWLi (i=1, . . . , j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a circuit block 13-$i$ (i=1, 2, . . . , 8) including a sense amplifier and bit line bias circuit through a row select switch RSW3 (MOS transistor). In read operation, the bit line bias circuits supply a bias potential to the read bit lines RBL4(n−1)+1, RBL4(n−1)+2, RBL4(n−1)+3, and RBL4(n−1)+4, respectively.

Each circuit block 13-$i$ is formed from an operational amplifier OP1, sense amplifier S/A, and resistive element Rc, as in Detailed Example 1 of Application Example 1. A description of the circuit structure of the circuit block 13-$i$ will be omitted.

In this example, in the read operation, the bias potential is applied to all the read bit lines RBL4(n−1)+1, RBL4(n−1)+2, RBL4(n−1)+3, and RBL4(n−1)+4 connected to the selected read word line RWLi through the TMR elements MTJ, instead of applying the bias potential only to the selected read bit line.

That is, in this example, all the read bit lines RBL4(n−1)+1, RBL4(n−1)+2, RBL4(n−1)+3, and RBL4(n−1)+4 are set at an equipotential level, thereby blocking the current path from one bit line to another.

The other end of each of the read word lines RWLi and read bit lines RBLi is connected to a precharge line PL through a precharge switch PSW. A clamp potential (bias potential) VC is applied to the precharge line PL. The precharge switch PSW is controlled by a precharge signal PRE. The precharge signal PRE changes to "H" immediately before the read operation. Hence, the read word lines RWLi and read bit lines RBLi are precharged to a precharge potential.

When the precharge signal PRE changes to "L", precharge of the read word lines RWLi and read bit lines RBLi is ended. After that, a read word line RWLi and read bit line RBLi are selected. Subsequently, a read current is supplied between the selected read word line RWLi and the selected read bit line RBLi.

That is, in the read operation, the column select switch corresponding to the read word line (row) RWLi selected by a column address signal is turned on. One end of the selected read word line RWLi is short-circuited to the ground point VSS.

In addition, the column select switches CSW corresponding to the read word lines RWLi that are not selected by the column address signal are turned off. Hence, the unselected read word lines RWLi are set in a floating state while maintaining the precharge potential.

The read word lines RWLi and read bit lines RBLi are precharged in advance to increase the speed of read operation.

That is, in the present invention, to block the current path from one bit line to another bit line in the read operation, the bias potential is applied to all the read bit lines RBL4(n−1)+1, RBL4(n−1)+2, RBL4(n−1)+3, and RBL4(n−1)+4 connected to the selected read word line RWLi through TMR elements MTJ.

At this time, not only the read bit lines RBL4(n−1)+1, RBL4(n−1)+2, RBL4(n−1)+3, and RBL4(n−1)+4 but also unselected read word lines RWLi (in the floating state) are charged.

To set all the read bit lines RBL4(n−1)+1, RBL4(n−1)+2, RBL4(n−1)+3, and RBL4(n−1)+4 at the bias potential, all the read bit lines RBL4(n−1)+1, RBL4(n−1)+2, RBL4(n−1)+3, and RBL4(n−1)+4 and unselected read word lines RWLi must be charged. This charging takes a very long time.

To prevent this, in this example, the read word lines RWLi and read bit lines RBLi are precharged in advance to shorten the charge time, thereby increasing the speed of read operation.

In this example, the precharge potential equals the bias potential. However, the precharge potential may be different from the bias potential. In this example, both the read word lines RWLi and read bit lines RBLi are precharged. However, only the read word lines RWLi or read bit lines RBLi may be precharged.

Additionally, in this example, sense amplifiers are connected to all the read bit lines RBL4(n−1)+1, RBL4(n−1)+2, RBL4(n−1)+3, and RBL4(n−1)+4 connected to the selected read word line RWLi through the TMR elements MTJ.

That is, in the read operation, the resistance values (data) of all the TMR elements MTJ connected to the selected read word line RWLi are read at once.

Sense amplifiers may be connected to all the read bit lines RBL4(n−1)+1, RBL4(n−1)+2, RBL4(n−1)+3, and RBL4(n−1)+4 connected to the selected read word line RWLi through the TMR elements MTJ, as in this example. Alternatively, a sense amplifier may be connected to only the selected read bit line.

As described above, according to the magnetic random access memory of the present invention, the read word lines RWLi and read bit lines RBLi are precharged in advance.

In the read operation, the selected read word line RWLi is set at a predetermined potential (unselected read word lines are set in the floating state). In addition, all the read bit lines RBL4(n−1)+1, RBL4(n−1)+2, RBL4(n−1)+3, and RBL4(n−1)+4 connected to the selected read word line RWLi through the TMR elements are set at the bias potential.

Hence, in the read operation, no many current paths of the read current are formed. For this reason, any decrease in read signal amount of the selected TMR element can be prevented. In addition, the charge time required to set the read bit lines RBL4(n−1)+1, RBL4(n−1)+2, RBL4(n−1)+3, and RBL4(n−1)+4 connected to the selected read word line RWLi through the TMR elements is shortened. Hence, the speed of read operation can be increased.

Referring to FIG. 38, the row select switches RSW2 and RSW3 and column select switch CSW are formed from MOS transistors. However, these switches are not limited to MOS transistors. For example, bipolar transistors, MIS transistors, MES transistors, or junction transistors may be used.

(4) Application Example 3

Figure 39:
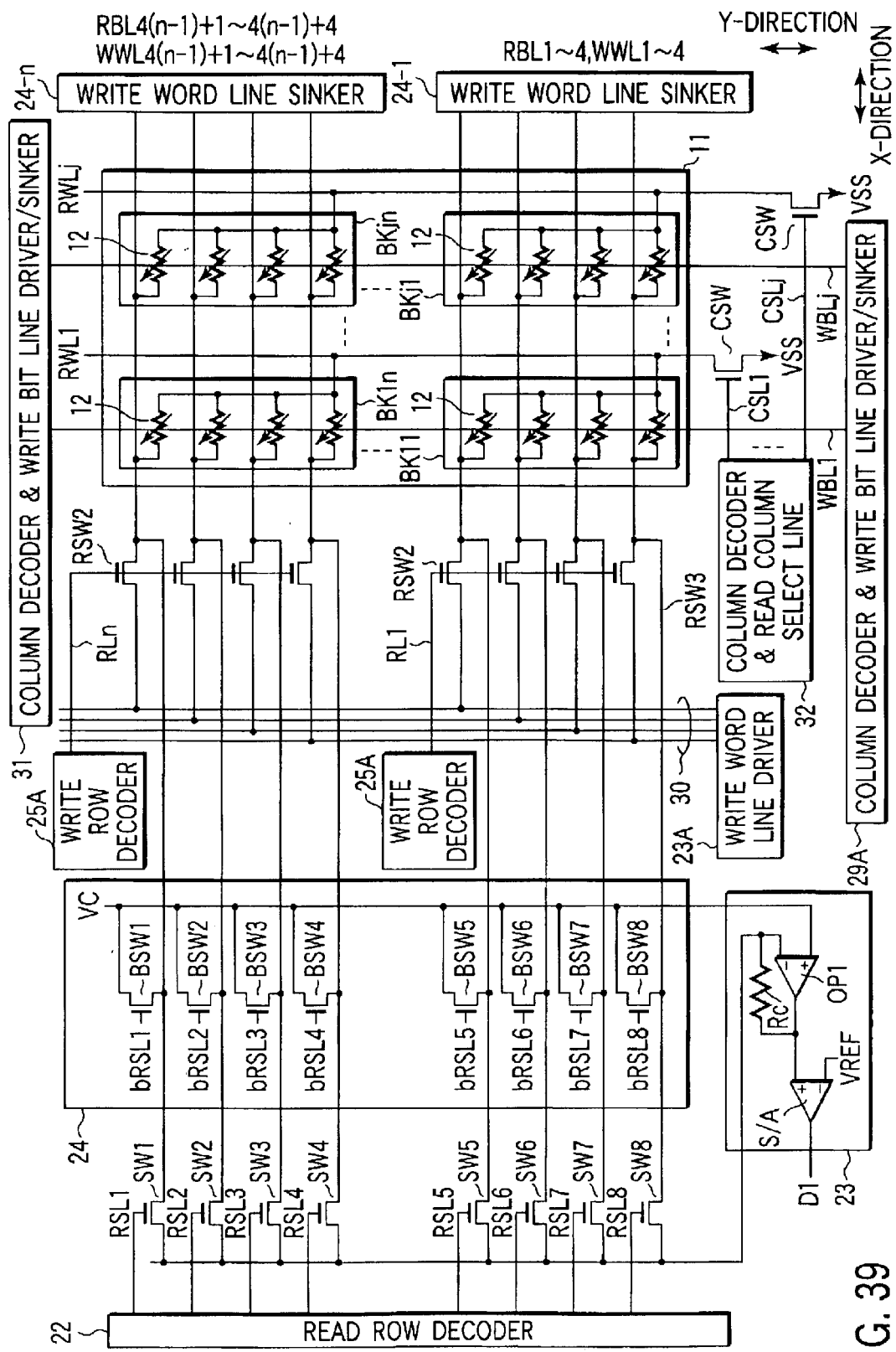
FIG. 39 is a view showing an application example 3 of a magnetic random access memory of the present invention.

FIG. 39 shows the circuit structure of a magnetic random access memory according to Application Example 3 of the present invention.

The circuit structure shown in FIG. 39 is a modification to Detailed Example 1 (FIG. 34) of Application Example 1.

As its characteristic feature, a read circuit (including a sense amplifier) is connected only to the selected row instead of connecting the read circuit to all read bit lines RBL4(n−1)+1, RBL4(n−1)+2, RBL4(n−1)+3, and RBL4(n−1)+4.

In Application Example 3, almost the same effect as that of Application Example 1 can be obtained by arranging switches BSW1, BSW2, . . . , BSW8, as will be described later.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, . . . , j, k=1, . . . , n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, . . . , j). The read word line RWLi runs in the Y-direction. For example, one read word line RWLi is arranged in one column.

The TMR elements 12 in the blocks BKik arranged in one column are directly connected to the read word line RWLi (i=1, . . . , j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a read circuit 23 through a corresponding one of row select switches (MOS transistors) SW1 to SW8.

In read operation, the row select switches SW1 to SW8 are controlled by output signals from a read row decoder 22, i.e., signals CSL1 to CSL8 obtained by decoding row address signals.

Hence, a row select switch SWi corresponding to a read bit line RBLi selected by a row address signal is turned on. One end of the selected read bit line RBLi is connected to the read circuit 23.

In addition, the row select switches SWi corresponding to the read bit lines RBLi that are not selected by the row address signal are turned off. Hence, the unselected read bit lines RBLi are not connected to the read circuit 23.

As the row select switches RSW2, SW1 to SW8, and column select switch CSW, e.g., MOS transistors can be employed, as shown in FIG. 39.

However, the row select switches RSW2, SW1 to SW8, and column select switch CSW are not limited to MOS transistors. For example, bipolar transistors, MIS transistors, MES transistors, or junction transistors may be used.

In this example, a bit line bias circuit 24 is connected to the read bit lines RBL4(n−1)+1, RBL4(n−1)+2, RBL4(n−1)+3, and RBL4(n−1)+4. The bit line bias circuit 24 is constructed by bias switches BSWi or BSW8 each having one terminal connected to a corresponding one of the read bit lines RBL4(n−1)+1, RBL4(n−1)+2, RBL4(n−1)+3, and RBL4(n−1)+4. A clamp potential (bias potential) VC is applied to the other terminal of each of the bias switches BSW1 to BSW8.

The clamp potential VC is the same as the clamp potential VC input to the positive input terminal of an operational amplifier OP1 in the read circuit 23.

Each of the bias switches BSW1 to BSW8 is formed from, e.g., an NMOS transistor. The bias switches BSW1 to BSW8 are controlled by signals bRSL1 to bRSL8 obtained by inverting output signals RSL1 to RSL8 from the read row decoder 22.

In the read operation, the bit line bias circuit 24 applies the bias potential to the unselected read bit lines RBLi to equalize the potentials of all the read bit lines RBL4(n−1)+1, RBL4(n−1)+2, RBL4(n−1)+3, and RBL4(n−1)+4 connected to the selected read word line RWLi through the TMR elements MTJ.

For example, assume that a row select line signal RSL3 changes to "H", and remaining row select line signals RSL1, RSL2, and RSL4 to RSL8 change to "L". A read bit line RBL3 is electrically connected to the read circuit 23 through a row select switch SW3. In addition, the bias switches BSW1, BSW2, and BSW4 to BSW8 are turned on. The clamp potential (bias potential) VC is applied to the read bit lines RBL1, RBL2, and RBL4 to RBL8.

As described above, according to the magnetic random access memory of the present invention, the selected read word line RWLi is set at a predetermined potential (in this example, the ground potential) to flow the read current. Unselected read word lines are set in the floating state.

All the read bit lines RBL4(n−1)+1, RBL4(n−1)+2, RBL4(n−1)+3, and RBL4(n−1)+4 connected to the selected read word line RWLi through the TMR elements are set at a predetermined bias potential (e.g., a positive potential).

In the read operation, as an equivalent circuit of the cell array structure of the magnetic random access memory according to the present invention, only the selected TMR element is connected between the selected read word line and the selected read bit line. Hence, the read signal amount of the selected TMR element does not decrease.

As the read circuit (sense amplifier & bit line bias circuit) 23, not the circuit shown in FIG. 39 but the circuit shown in FIGS. 8 to 11 may be used.

(5) Application Example 4

FIG. 40 shows the circuit structure of a magnetic random access memory according to Application Example 4 of the present invention.

The circuit structure shown in FIG. 40 is an application example of Application Example 3. This circuit structure shows a reference potential generating circuit which generates a reference potential VREF in the circuit structure of Application Example 3 in detail.

Application Example 4 proposes a circuit which generates the reference potential VREF using TMR elements which store "0" data and TMR elements which store "1" data.

The reference potential VREF is generated by a reference potential generating circuit 19. The reference potential generating circuit 19 has TMR elements (reference cells) which store "0" data, TMR elements (reference cells) which store "1" data, and bit lines rBL"0" and rBL"1" that run in the Y-direction.

At the intersections between read word lines RWL1 to RWLj and the bit line rBL"0", the TMR elements MTJ connected between these read word lines RWL1 to RWLj and the bit line rBL"0" are arranged. All the TMR elements MTJ arranged at the intersections between the read word lines RWL1 to RWLj and the bit line rBL"0" store "0" data.

At the intersections between the read word lines RWL1 to RWLj and the bit line rBL"1", the TMR elements MTJ connected between these read word lines RWL1 to RWLj and the bit line rBL"1" are arranged. All the TMR elements MTJ arranged at the intersections between the read word lines RWL1 to RWLj and the bit line rBL"1" store "1" data.

According to this arrangement, in read operation, "0" data is read to the bit line rBL"0", and "1" data is read to the bit line rBL"1" always independently of the selected one of the read word lines RWL1 to RWLj.

In the read operation, when a read signal READ changes to "H" (bREAD changes to "L"), the bit lines rBL"0" and rBL"1" are short-circuited to each other.

Both of the bit lines rBL"0" and rBL"1" are connected to the negative input terminals of operational amplifiers OP2 whose circuit is same as the operational amplifier OP1. Like an operational amplifier OP1 in the read circuit 23 shown in FIG. 39, a clamp potential VC is input to the positive input terminal of the operational amplifier OP2. Additionally, a resistive element Rc is connected between the output terminal and the negative input terminal.

As a result, the reference potential VREF is output from the output terminal of the operational amplifier OP2.

According to the magnetic random access memory of this example, in the read operation, only the selected TMR element MTJ is connected between the selected read word line RWLi and the selected read bit line RBLi. Hence, the read signal amount of the selected TMR element MTJ does not decrease.

Furthermore, in the read operation, the reference potential VREF is generated using TMR elements which store "0" data and TMR elements which store "1" data. For this reason, the reference potential VREF has an intermediate value between the potential that appears at the positive input terminal of the sense amplifier S/A in reading "0" data and the potential that appears at the positive input terminal of the sense amplifier S/A in reading "1" data.

Hence, the margin of read data in the read operation can be improved.

(6) Application Example 5

① Circuit Structure

FIG. 41 shows the circuit structure of a magnetic random access memory according to Application Example 5 of the present invention.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, . . . j, k=1, . . . , n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected to, e.g., a source line SLi (i=1, . . . , j) through a read select switch RSW1 formed from, e.g., a MOS transistor. The source line SLi runs in the Y-direction. For example, one source line SLi is arranged in one column.

The source line SLi is connected to a ground point VSS through a column select switch CSW formed from, e.g., a MOS transistor.

In read operation, in a selected row, the read select switch RSW1 in the read block BKik is turned on. In a selected column, since the column select switch CSW is turned on, the potential of the source line SLi changes to the ground potential VSS. That is, a read current flows only to the TMR elements 12 in the read block BKik located at the intersection between the selected row and the selected column.

In the read mode, since the read select switch RSW1 in an unselected row is OFF, the other terminal of each of the TMR elements 12 in the read block BKik of the unselected row is short-circuited.

In this case, when read bit lines RBL4(n−1)+1, RBL4(n−1)+2, RBL4(n−1)+3, and RBL4(n−1)+4 in the unselected row have different potentials, it may adversely affect the read operation. To prevent this, the read bit lines RBL4(n−1)+1, RBL4(n−1)+2, RBL4(n−1)+3, and RBL4(n−1)+4 in the unselected column are set at an equipotential level (e.g., the ground potential).

In the read operation, since the column select switch CSW in an unselected column is OFF, the other terminal of each of the TMR elements 12 in the read block BKik of the unselected column is also short-circuited.

The other terminal of each of the four TMR elements 12 in the read block BKik is independently connected to a corresponding one of the read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a common data line 30 through a row select switch (MOS transistor) RSW2. The common data line 30 is connected to a read circuit (including, e.g., a sense amplifier, selector, and output buffer) 29B.

A row select line signal RLi (i=1, . . . , n) is input to the row select switch RSW2. Row decoders 25-1, . . . , 25-n output the row select line signals RLi.

In the read operation, the read circuit 29B supplies a bias potential to the read bit lines RBL4(n−1)+1, RBL4(n−1)+2, RBL4(n−1)+3, and RBL4(n−1)+4 in a row selected by the row select line signal RLi.

Figure 51:
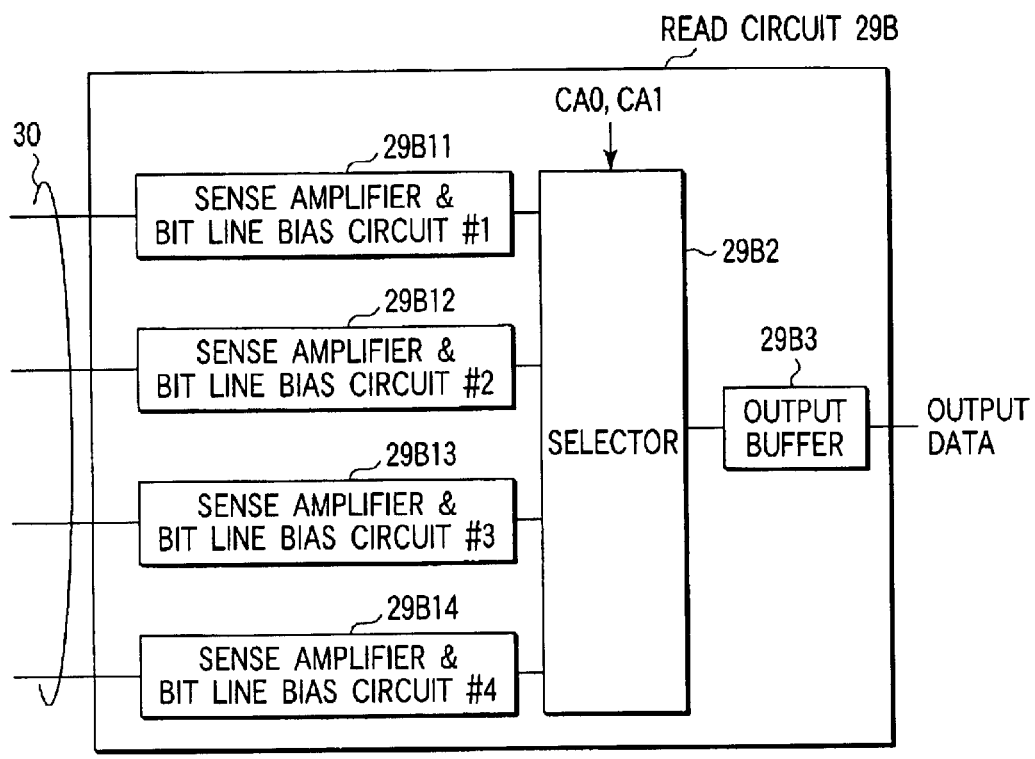
FIG. 51 is a view showing a example of a read circuit.
Figure 52:
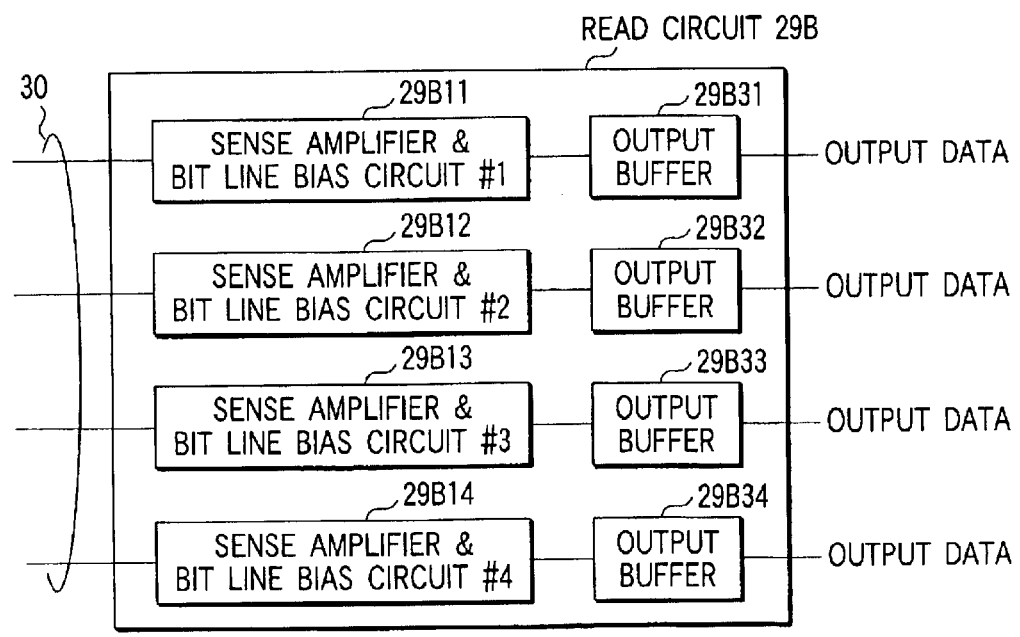
FIG. 52 is a view showing a example of a read circuit.
Figure 54:
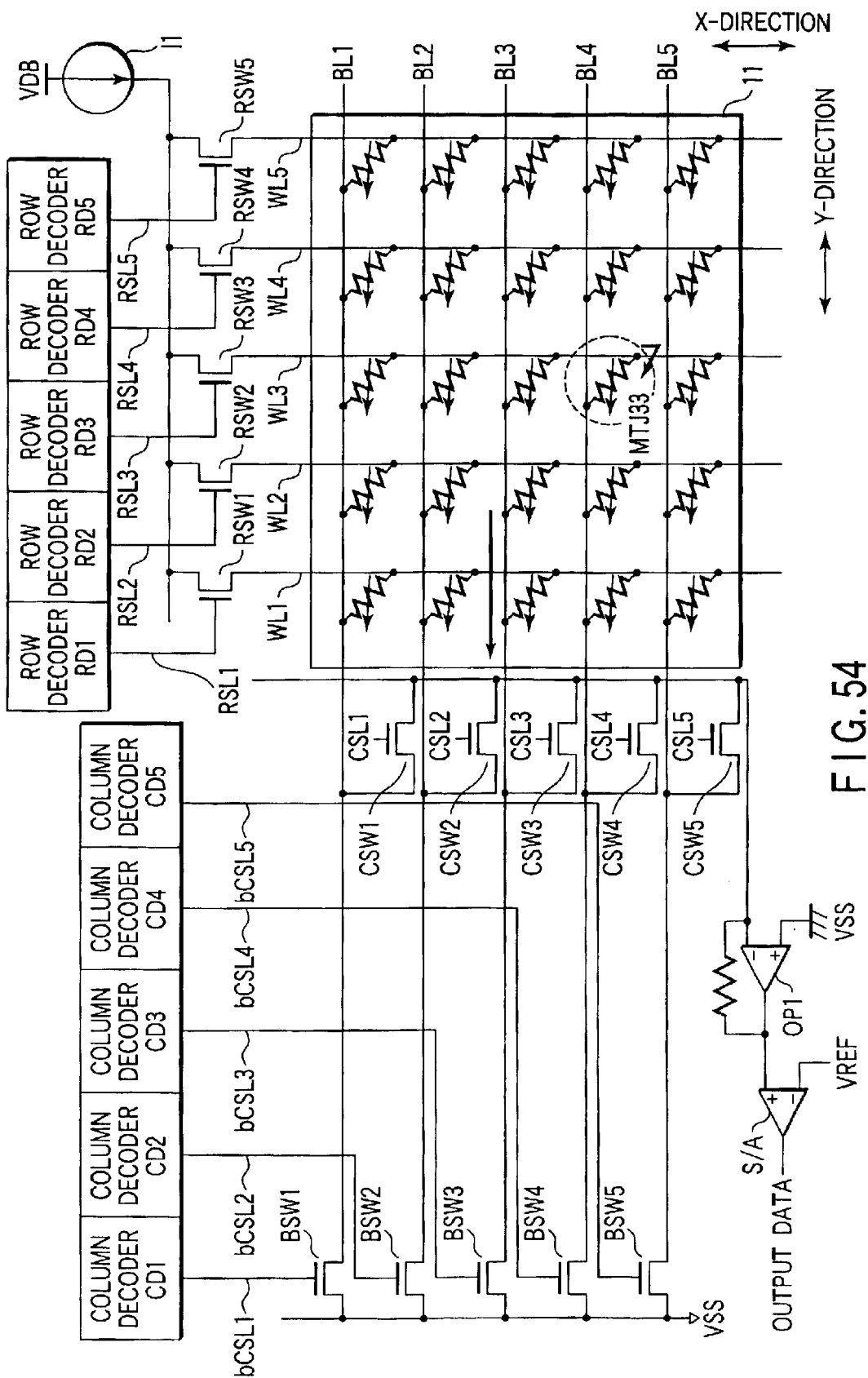
FIG. 54 is a view showing the circuit structure of another conventional magnetic random access memory.

When 1-bit data should be output from a memory chip (or block), the read circuit 29B can employ a circuit shown in FIG. 51. When a plurality of data bits should be simultaneously output from a memory chip (or block), a circuit shown in FIG. 52 can be employed.

The read bit lines RBL4(n−1)+1, RBL4(n−1)+2, RBL4(n−1)+3, and RBL4(n−1)+4 run in the X-direction (row direction) and also function as write word lines WWL4(n−1)+1, WWL4(n−1)+2, WWL4(n−1)+3, and WWL4(n−1)+4.

One end of each of the write word lines WWL4(n−1)+1, WWL4(n−1)+2, WWL4(n−1)+3, and WWL4(n−1)+4 is connected to a write word line driver 23A through the row select switch RSW2 and common data line 30. The other end is connected to a corresponding one of write word line sinkers 24-1, . . . , 24-n.

Near the four TMR elements 12 of the read block BKik, one write bit line WBLi (i=1 . . . , j) that is shared by the four TMR elements and runs in the Y-direction is arranged. One write bit line WBLi is arranged in one column.

One end of the write bit line WBLi is connected to a circuit block 29A including column decoders & write bit line drivers/sinkers. The other end is connected to a circuit block 31 including column decoders & write bit line drivers/sinkers.

In the write operation, the circuit blocks 29A and 31 are set in an operative state. A write current flows to the write bit line WBLi in a direction toward the circuit block 29A or 31 in accordance with write data.

The gate of the read select switch (MOS transistor) RSW1 is connected to a read word line RWLn (n=1, 2, . . . ) One read word line RWLn is arranged in one row and shared by a plurality of blocks BKjk arranged in the X-direction.

For example, when one column is formed from four blocks, the number of read word lines RWLn is four. The read word lines RWLn run in the X-direction. One end of each read word line RWLn is connected to a circuit block 23B-n including a row decoder and read word line driver.

In write operation, the row decoder 25-$n$ selects one of the plurality of rows on the basis of a row address signal. The write word line driver 23A supplies a write current to the write word lines WWL4(n−1)+1, WWL4(n−1)+2, WWL4(n−1)+3, and WWL4(n−1)+4 in the selected row. The write current is absorbed by the write word line sinker 24-$n$.

In the read operation, the row decoder 25-$n$ selects one of the plurality of rows on the basis of a row address signal. The circuit block 23B-$n$ including a row decoder and read word line driver supplies a read voltage (="H") to the read word line RWLn in the selected row.

In the read operation, a column decoder 32 selects one of the plurality of columns on the basis of column address signals CSL1, . . . , CSLj and turns on the column select switch CSW arranged in the selected column.

In the magnetic random access memory of this example, one terminal of each of the plurality of TMR elements in a read block is commonly connected. The other terminal of each of the TMR elements is connected to a corresponding one of the different read bit lines RBL4(n−1)+1, RBL4(n−1)+2, RBL4(n−1)+3, and RBL4(n−1)+4.

In this case, in the read operation, the read circuit 29B supplies a bias potential to all the read bit lines RBL4(n−1)+1, RBL4(n−1)+2, RBL4(n−1)+3, and RBL4(n−1)+4 in the row selected by the row select line signal RLi.

Hence, in the read operation, the read current (read signal amount) can be stabilized.

② Device Structure

[1] Sectional Structure

Figure 42:
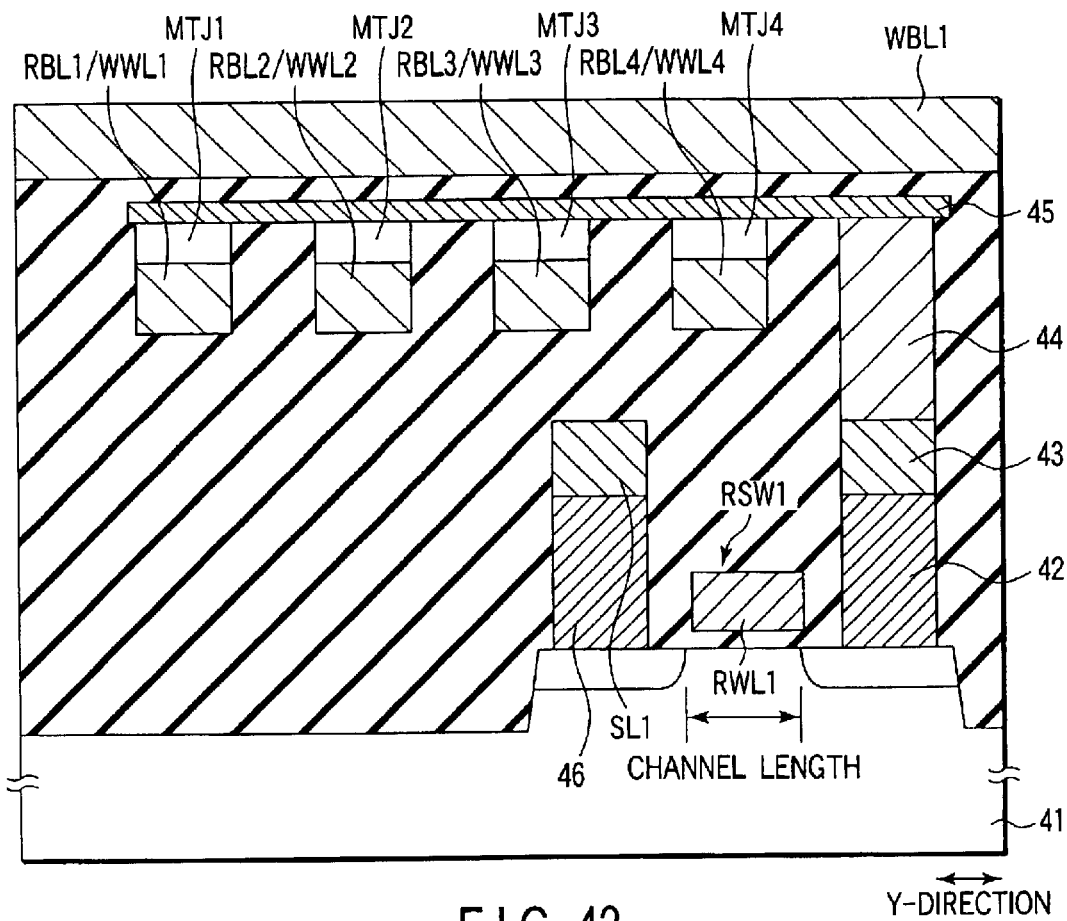
FIG. 42 is a sectional view showing an example of a Structure of a memory of FIG. 41.

FIG. 42 shows the device structure of one block of the magnetic random access memory as Application Example 5 of the present invention.

The same reference numerals as in FIG. 41 denote the same elements in FIG. 42 to show the correspondence between the elements.

The read select switch (MOS transistor) RSW1 is arranged in the surface region of a semiconductor substrate 41. The source of the read select switch RSW1 is connected to a source line SL1 through a contact plug 46. The source line SL1 runs straight in, e.g., the Y-direction (column direction) and is connected to the ground point VSS through a column select switch at the peripheral portion of the memory cell array region.

The gate of the read select switch (MOS transistor) RSW1 serves as the read word line RWL1. The read word line RWL1 runs in the X-direction. Four TMR elements (MTJ (Magnetic Tunnel Junction) elements) MTJ1, MTJ2, MTJ3, and MTJ4 arrayed in the Y-direction are arranged on the read select switch RSW1.

One terminal (the upper end in this example) of each of the TMR elements MTJ1, MTJ2, MTJ3, and MTJ4 is commonly connected to an upper electrode 45. Contact plugs 42 and 44 and intermediate layer 43 electrically connect the upper electrode 45 and the drain of the read select switch RSW1.

The other terminal (the lower end in this example) of each of the TMR elements MTJ1, MTJ2, MTJ3, and MTJ4 is electrically connected to a corresponding one of read bit lines RBL1, RBL2, RBL3, and RBL4 (write word lines WWL1, WWL2, WWL3, and WWL4). The read bit lines RBL1, RBL2, RBL3, and RBL4 run in the X-direction (row direction).

The TMR elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four TMR elements MTJ1, MTJ2, MTJ3, and MTJ4.

A write bit line WBL1 is arranged above and near the TMR elements MTJ1, MTJ2, MTJ3, and MTJ4. The write bit line WBL1 runs in the Y-direction (column direction).

In this example, one write bit line WBL1 is arranged in correspondence with the four TMR elements MTJ1, MTJ2, MTJ3, and MTJ4 of a read block. Instead, for example, the four TMR elements MTJ1, MTJ2, MTJ3, and MTJ4 may be stacked, and four write bit lines may be arranged in correspondence with the four TMR elements MTJ1, MTJ2, MTJ3, and MTJ4.

In this example, a write bit line BL1 that runs in the Y-direction is arranged above the TMR elements MTJ1, MTJ2, MTJ3, and MTJ4. The read bit lines RBL1, RBL2, RBL3, and RBL4 that run in the X-direction are arranged under the TMR elements MTJ1, MTJ2, MTJ3, and MTJ4.

However, the positional relationship between the write bit line BL1 and the read bit lines RBL1, RBL2, RBL3, and RBL4 with respect to the TMR elements MTJ1, MTJ2, MTJ3, and MTJ4 is not limited to this.

For example, the write bit line WBL1 that runs in the Y-direction may be arranged under the TMR elements MTJ1, MTJ2, MTJ3, and MTJ4, and the read bit lines RBL1, RBL2, RBL3, and RBL4 that run in the X-direction may be arranged above the TMR elements MTJ1, MTJ2, MTJ3, and MTJ4.

[2] Planar Structure

Figure 43:
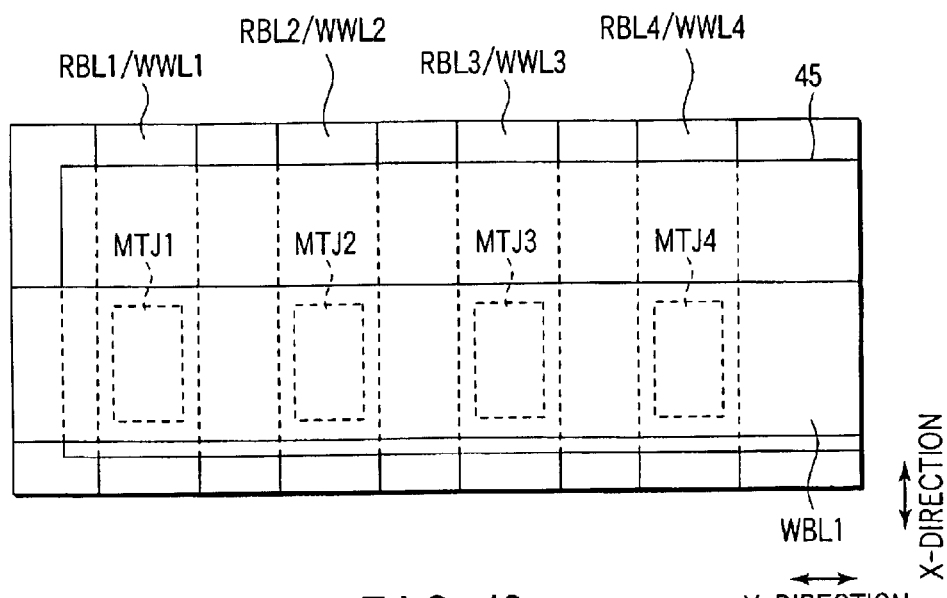
FIG. 43 is a plane view showing an example of a Structure of a memory of FIG. 41.

FIG. 43 shows the positional relationship between the TMR elements, the write word lines, and the read bit lines in the device structure shown in FIG. 42.

The upper electrode 45 of the TMR elements MTJ1, MTJ2, MTJ3, and MTJ4 has, e.g., a rectangular pattern. A contact region for a contact plug is formed at part of the upper electrode 45.

The TMR elements MTJ1, MTJ2, MTJ3, and MTJ4 are arranged in the Y-direction. Their axes of easy magnetization are directed to the X-direction. That is, each of the TMR elements MTJ1, MTJ2, MTJ3, and MTJ4 has a rectangular shape long in the X-direction.

The TMR elements MTJ1, MTJ2, MTJ3, and MTJ4 are arranged at intersections between the write bit line WBL1 and the read bit lines RBL1, RBL2, RBL3, and RBL4 (write word lines WWL1, WWL2, WWL3, and WWL4).

(7) Application Example 6

① Circuit Structure

Figure 44:
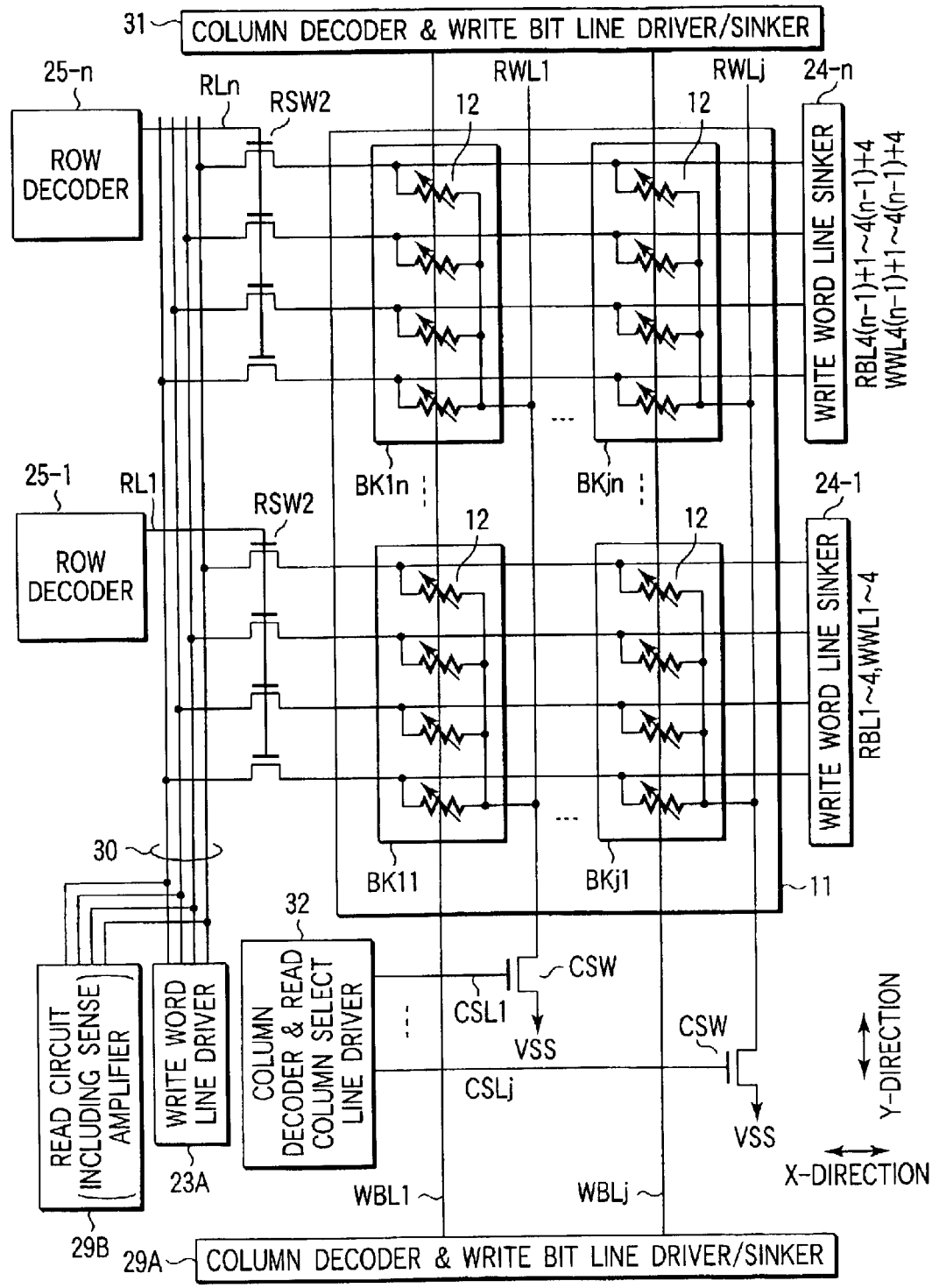
FIG. 44 is a view showing an application example 6 of a magnetic random access memory of the present invention.

FIG. 44 shows the circuit structure of a magnetic random access memory according to Application Example 6 of the present invention.

A memory cell array 11 has a plurality of TMR elements 12 arranged in an array in the X- and Y-directions. For example, j TMR elements 12 are arranged in the X-direction, and 4×n TMR elements 12 are arranged in the Y-direction.

The four TMR elements 12 arranged in the Y-direction form one read block BKik (i=1, . . . , j, k=1, . . . , n). The j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected. The connection point is connected to, e.g., a read word line RWLi (i=1, . . . , j). The read word line RWLi runs in the Y-direction. For example, one read word line RWLi is arranged in one column.

The TMR elements 12 in the blocks BKik arranged in one column are directly connected to the read word line RWLi (i=1, . . . , j) without intervening any read select switch (MOS transistor). One end of the read word line RWLi is connected to a ground point VSS through a column select switch CSW formed from, e.g., a MOS transistor.

Since the column select switch CSW is arranged outside the memory cell array 11, no switch element (MOS transistor) is arranged in the memory cell array 11.

The other terminal of each of the four TMR elements 12 in the read block BKik is independently connected to a corresponding one of read bit lines RBL4(n−1)+1, RBL4(n−1)+2, RBL4(n−1)+3, and RBL4(n−1)+4. That is, four read bit lines RBL4(n−1)+1, RBL4(n−1)+2, RBL4(n−1)+3, and RBL4(n−1)+4 are arranged in correspondence with four TMR elements 12 in one read block BKik.

The read bit lines RBL4(n−1)+1, RBL4(n−1)+2, RBL4(n−1)+3, and RBL4(n−1)+4 run in the X-direction. One end of each of the read bit lines RBL4(n−1)+1, RBL4(n−1)+2, RBL4(n−1)+3, and RBL4(n−1)+4 is connected to a common data line 30 through a row select switch (MOS transistor) RSW2. The common data line 30 is connected to a read circuit (including, e.g., a sense amplifier, selector, and output buffer) 29B.

A row select line signal RLi (i=1, . . . , n) is input to the row select switch RSW2. Row decoders 25-1, . . . , 25-n output the row select line signals RLi.

In the read operation, the read circuit 29B supplies a bias potential to the read bit lines RBL4(n−1)+1, RBL4(n−1)+2, RBL4(n−1)+3, and RBL4(n−1)+4 in a row selected by the row select line signal RLi.

When 1-bit data should be output from a memory chip (or block), the read circuit 29B can employ a circuit shown in FIG. 51. When a plurality of data bits should be simultaneously output from a memory chip (or block), a circuit shown in FIG. 52 can be employed.

The read bit lines RBL4(n−1)+1, RBL4(n−1)+2, RBL4(n−1)+3, and RBL4(n−1)+4 run in the X-direction (row direction) and also function as write word lines WWL4(n−1)+1, WWL4(n−1)+2, WWL4(n−1)+3, and WWL4(n−1)+4.

One end of each of the write word lines WWL4(n−1)+1, WWL4(n−1)+2, WWL4(n−1)+3, and WWL4(n−1)+4 is connected to a write word line driver 23A through the row select switch RSW2 and common data line 30. The other end is connected to a corresponding one of write word line sinkers 24-1, . . . , 24-n.

Near the four TMR elements 12 of the read block BKik, one write bit line WBLi (i=1 . . . , j) that is shared by the four TMR elements and runs in the Y-direction is arranged. One write bit line WBLi is arranged in one column.

One end of the write bit line WBLi is connected to a circuit block 29A including column decoders & write bit line drivers/sinkers. The other end is connected to a circuit block 31 including column decoders & write bit line drivers/sinkers.

In the write operation, the circuit blocks 29A and 31 are set in an operative state. A write current flows to the write bit line WBLi in a direction toward the circuit block 29A or 31 in accordance with write data.

In write operation, the row decoder 25-n selects one of the plurality of rows on the basis of a row address signal. The write word line driver 23A supplies a write current to the write word lines WWL4(n−1)+1, WWL4(n−1)+2, WWL4(n−1)+3, and WWL4(n−1)+4 in the selected row. The write current is absorbed by the write word line sinker 24-n.

In the read operation, the row decoder 25-n selects one of the plurality of rows on the basis of a row address signal. In the read operation, a column decoder 32 selects one of the plurality of columns on the basis of column address signals CSL1, . . . , CSLj and turns on the column select switch CSW arranged in the selected column.

In the magnetic random access memory of this example, one terminal of each of the plurality of TMR elements in a read block is commonly connected. The other terminal of each of the TMR elements is connected to a corresponding one of the different read bit lines RBL4(n−1)+1, RBL4(n−1)+2, RBL4(n−1)+3, and RBL4(n−1)+4.

In this case, in the read operation, the read circuit 29B supplies a bias potential to all the read bit lines RBL4(n−1)+1, RBL4(n−1)+2, RBL4(n−1)+3, and RBL4(n−1)+4 in the row selected by the row select line signal RLi.

Hence, in the read operation, the read current (read signal amount) can be stabilized.

② Device Structure

[1] Sectional Structure

Figure 45:
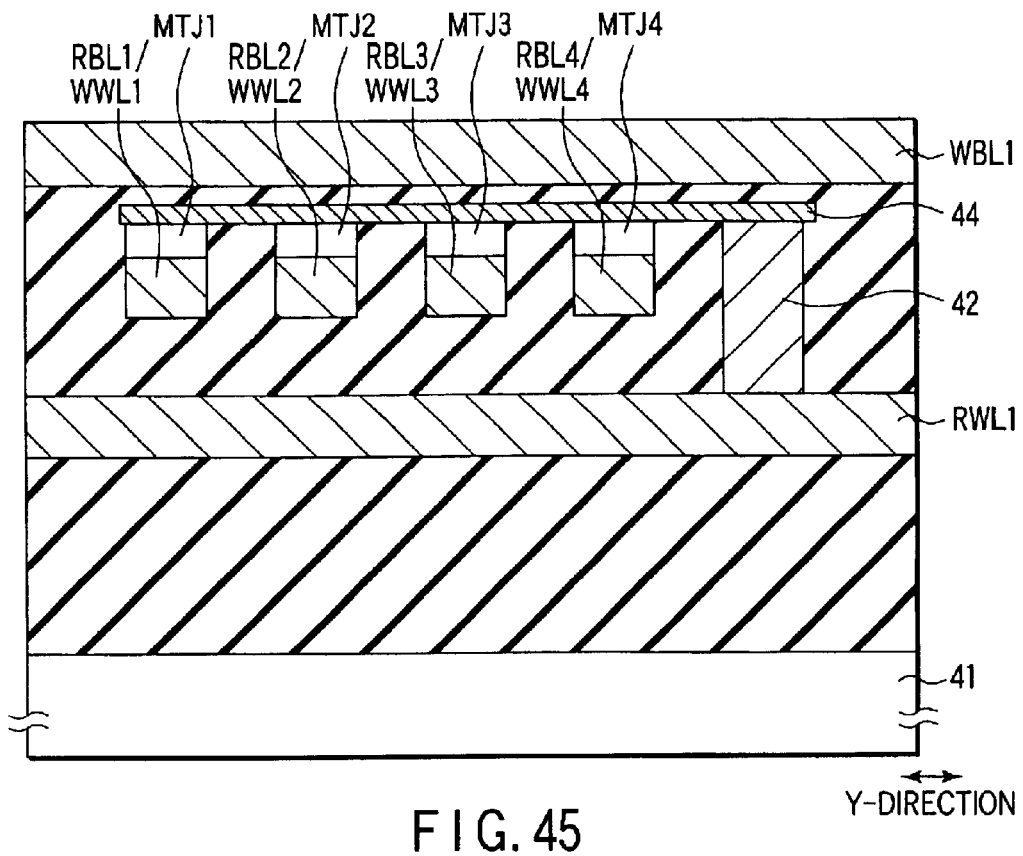
FIG. 45 is a sectional view showing an example of a Structure of a memory of FIG. 44.

FIG. 45 shows the device structure of one block of the magnetic random access memory as Application Example 6 of the present invention.

The same reference numerals as in FIG. 44 denote the same elements in FIG. 45 to show the correspondence between the elements.

A read word line RWL1 that runs in the Y-direction is arranged on a semiconductor substrate 41. No switch element is arranged under the read word line RWL1. Four TMR elements (MTJ (Magnetic Tunnel Junction) elements) MTJ1, MTJ2, MTJ3, and MTJ4 arrayed in the Y-direction are arranged on the read word line RWL1.

One terminal (the upper end in this example) of each of the TMR elements MTJ1, MTJ2, MTJ3, and MTJ4 is commonly connected to an upper electrode 44. A contact plug 42 electrically connects the upper electrode 44 and read word line RWL1.

The other terminal (the lower end in this example) of each of the TMR elements MTJ1, MTJ2, MTJ3, and MTJ4 is electrically connected to a corresponding one of read bit lines RBL1, RBL2, RBL3, and RBL4 (write word lines WWL1, WWL2, WWL3, and WWL4). The read bit lines RBL1, RBL2, RBL3, and RBL4 run in the X-direction (row direction).

The TMR elements MTJ1, MTJ2, MTJ3, and MTJ4 are independently connected to the read bit lines RBL1, RBL2, RBL3, and RBL4, respectively. That is, the four read bit lines RBL1, RBL2, RBL3, and RBL4 are arranged in correspondence with the four TMR elements MTJ1, MTJ2, MTJ3, and MTJ4.

A write bit line WBL1 is arranged above and near the TMR elements MTJ1, MTJ2, MTJ3, and MTJ4. The write bit line WBL1 runs in the Y-direction (column direction).

In this example, one write bit line WBL1 is arranged in correspondence with the four TMR elements MTJ1, MTJ2, MTJ3, and MTJ4 of a read block. Instead, for example, the four TMR elements MTJ1, MTJ2, MTJ3, and MTJ4 may be stacked, and four write bit lines may be arranged in correspondence with the four TMR elements MTJ1, MTJ2, MTJ3, and MTJ4.

In this example, a write bit line BL1 that runs in the Y-direction is arranged above the TMR elements MTJ1, MTJ2, MTJ3, and MTJ4. The read bit lines RBL1, RBL2, RBL3, and RBL4 that run in the X-direction are arranged under the TMR elements MTJ1, MTJ2, MTJ3, and MTJ4.

However, the positional relationship between the write bit line BL1 and the read bit lines RBL1, RBL2, RBL3, and RBL4 with respect to the TMR elements MTJ1, MTJ2, MTJ3, and MTJ4 is not limited to this.

For example, the write bit line WBL1 that runs in the Y-direction may be arranged under the TMR elements MTJ1, MTJ2, MTJ3, and MTJ4, and the read bit lines RBL1, RBL2, RBL3, and RBL4 that run in the X-direction may be arranged above the TMR elements MTJ1, MTJ2, MTJ3, and MTJ4.

[2] Planar Structure

Figure 46:
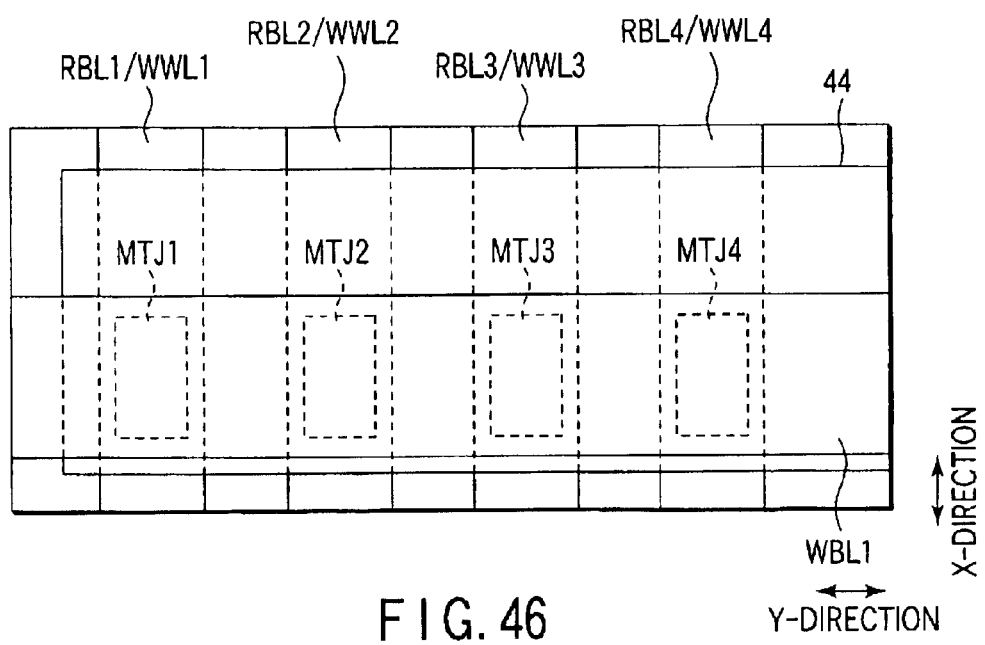
FIG. 46 is a plane view showing an example of a Structure of a memory of FIG. 44.

FIG. 46 shows the positional relationship between the TMR elements, the read bit lines (write word lines), and the write bit line in the device structure shown in FIG. 45.

The upper electrode 44 of the TMR elements MTJ1, MTJ2, MTJ3, and MTJ4 has, e.g., a rectangular pattern. A contact region for a contact plug is formed at part of the upper electrode 44.

The TMR elements MTJ1, MTJ2, MTJ3, and MTJ4 are arranged in the Y-direction. Their axes of easy magnetization (a direction parallel to the long side of each TMR element) are directed to the X-direction. That is, each of the TMR elements MTJ1, MTJ2, MTJ3, and MTJ4 has a rectangular shape long in the X-direction.

The TMR elements MTJ1, MTJ2, MTJ3, and MTJ4 are arranged in a region where the write bit line WBL1 crosses the read bit lines RBL1, RBL2, RBL3, and RBL4 (write word lines WWL1, WWL2, WWL3, and WWL4).

(8) Application Example 7

① Circuit Structure

Figure 48:
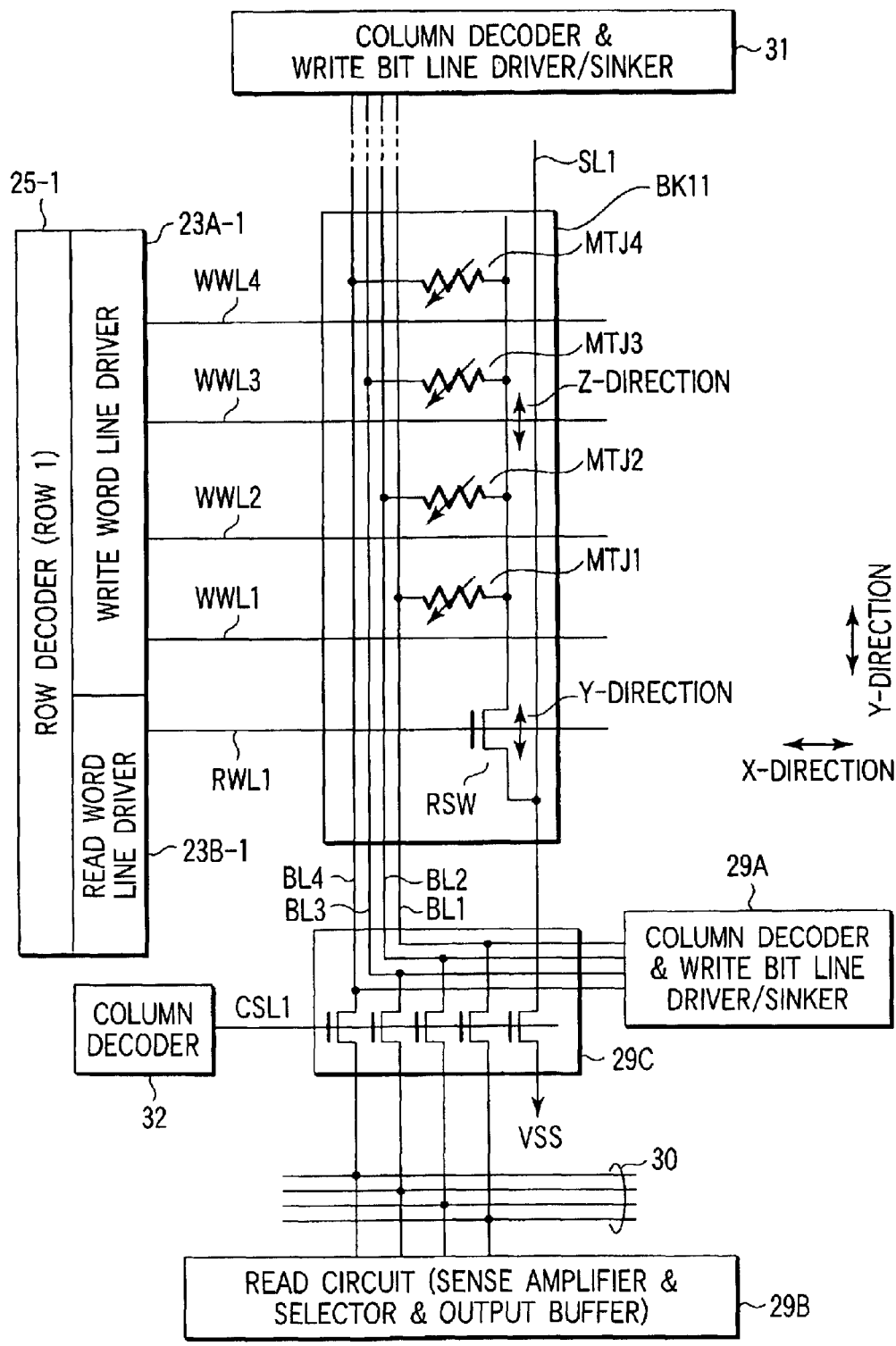
FIG. 48 is a view showing a column select switch of a memory of FIG. 47.

FIG. 47 shows the circuit structure of a magnetic random access memory according to Application Example 7 of the present invention. FIG. 48 shows an example of a column select switch shown in FIG. 47.

A memory cell array 11 has a plurality of TMR elements 12 arranged in an array in the X-, Y-, and Z-directions. The Z-direction means a direction perpendicular to the the surface of the drawing sheet, perpendicular to the X- and Y-directions.

In this example, the memory cell array 11 has a cell array structure formed from j TMR elements 12 arranged in the X-direction, n TMR elements 12 arranged in the Y-direction, and four TMR elements (MTJ1, MTJ2, MTJ3, and MTJ4) 12 stacked in the Z-direction.

The number of TMR elements 12 stacked in the Z-direction is four in this example. However, the number of TMR elements is not particularly limited as long as two or more TMR elements are used.

The four TMR elements 12 stacked in the Z-direction form one read block BKik (i=1, 2, . . . , j, k=1, 2, . . . , n).

The four TMR elements 12 in the read block BKik are actually stacked one another in a direction (Z-direction) perpendicular to the the surface of the drawing sheet.

In this example, j read blocks BKik arranged in the X-direction form one row. The memory cell array 11 has n rows. In addition, n read blocks BKik arranged in the Y-direction form one column. The memory cell array 11 has j columns.

One terminal of each of the four TMR elements 12 in the block BKik is commonly connected to, e.g., a source line SLi (i=1, 2, . . . , j) through a read select switch (block select switch or row select switch) RSW formed from, e.g., a MOS transistor. The source line SLi runs in the Y-direction. For example, one source line SLi is arranged in one column.

The source line SLi is connected to a ground point VSS through a column select switch 29C formed from, e.g., a MOS transistor.

In read operation, in a selected row, the read select switch RSW in the read block BKik is turned on. In a selected column, since the column select switch 29C is turned on, the potential of the source line SLi changes to the ground potential VSS. That is, a read current flows only to the TMR elements 12 in the read block BKik located at the intersection between the selected row and the selected column.

In the read mode, since the column select switch 29C in an unselected column is OFF, the other terminal of each of the TMR elements 12 in the read block BKik of the unselected column is short-circuited.

In this case, when read bit lines BL4(j−1)+1, BL4(j−1)+2, BL4(j−1)+3, and BL4(j−1)+4 in the unselected column have different potentials, it may adversely affect the read operation. To prevent this, the read bit lines BL4(j−1)+1, BL4(j−1)+2, BL4(j−1)+3, and BL4(j−1)+4 in the unselected column are set at an equipotential level (e.g., the ground potential).

In the read operation, since the block select switch RSW in an unselected row is OFF, the other terminal of each of the TMR elements 12 in the read block BKik of the unselected row is also short-circuited.

The other terminal of each of the four TMR elements 12 in the read block BKik is independently connected to a corresponding one of the read bit lines BL4(j−1)+1, BL4(j−1)+2, BL4(j−1)+3, and BL4(j−1)+4. That is, four read bit lines BL4(j−1)+1, BL4(j−1)+2, BL4(j−1)+3, and BL4(j−1)+4 are arranged in one column in correspondence with four TMR elements 12 in one read block BKik.

The read bit lines BL4(j−1)+1, BL4(j−1)+2, BL4(j−1)+3, and BL4(j−1)+4 run in the Y-direction. One end of each of the read bit lines BL4(j−1)+1, BL4(j−1)+2, BL4(j−1)+3, and BL4(j−1)+4 is connected to a common data line 30 through a column select switch (MOS transistor) 29C. The common data line 30 is connected to a read circuit (including, e.g., a sense amplifier, selector, and output buffer) 29B.

A column select line signal CSLi (i=0, 1, . . . , j) is input to the column select switch 29C. A column decoder 32 outputs the column select line signal CSLi.

In the read operation, the read circuit 29B supplies a bias potential to the read bit lines BL4(j−1)+1, BL4(j−1)+2, BL4(j−1)+3, and BL4(j−1)+4 in a column selected by the column select line signal CSLi.

When 1-bit data should be output from a memory chip (or block), the read circuit 29B can employ a circuit shown in FIG. 51. When a plurality of data bits should be simultaneously output from a memory chip (or block), a circuit shown in FIG. 52 can be employed.

In this example, the read bit lines BL4(j−1)+1, BL4(j−1)+2, BL4(j−1)+3, and BL4(j−1)+4 also function as write bit lines.

That is, one end of each of the read/write bit lines BL4(j−1)+1, BL4(j−1)+2, BL4(j−1)+3, and BL4(j−1)+4 is connected to a circuit block 29A including column decoders & write bit line drivers/sinkers. The other end is connected to a circuit block 31 including column decoders & write bit line drivers/sinkers.

In the write operation, the circuit blocks 29A and 31 are set in an operative state. A write current flows to the read/write bit lines BL4(j−1)+1, BL4(j−1)+2, BL4(j−1)+3, and BL4(j−1)+4 in a direction toward the circuit block 29A or 31 in accordance with write data.

Near the four TMR elements 12 of the read block BKik, a plurality of (in this example, four) write word lines WWL4(n−1)+1, WWL4(n−1)+2, WWL4(n−1)+3, and WWL4(n−1)+4 stacked in the Z-direction are arranged. In this case, n is a row number, and n=1, 2, . . . .

In this example, for a write word line that runs in the X-direction, one write word line is arranged at one stage in one row. That is, one write word line corresponds to one TMR element in a selected read block BKik. In this case, the number of write word lines in one row that runs in the X-direction equals the number of stages of TMR elements 12.

For the write word line, one write word line may be shared by a plurality of TMR elements (upper and lower TMR elements) in consideration of planarizing the insulating film immediately under the TMR elements 12 and reducing the manufacturing cost.

A detailed structure of TMR elements in a block and near the TMR elements will be described in detail in the paragraph for the device structure.

One end of each of the write word lines WWL4(n−1)+1, WWL4(n−1)+2, WWL4(n−1)+3, and WWL4(n−1)+4 is connected to a write word line driver 23A-n. The other end is connected to the write word line sinker 24-n.

The gate of the read select switch (MOS transistor) RSW is connected to a read word line RWLn (n=1, 2, . . . . ) One read word line RWLn is arranged in one row and shared by a plurality of blocks BKjk arranged in the X-direction.

For example, when one column is formed from four blocks, the number of read word lines RWLn is four. The read word lines RWLn run in the X-direction. One end of each read word line RWLn is connected to a read word line driver 23B-n.

In write operation, the row decoder 25-n selects one of the plurality of rows on the basis of a row address signal. The write word line driver 23A-n supplies a write current to the write word lines WWL4(n−1)+1, WWL4(n−1)+2, WWL4(n−1)+3, and WWL4(n−1)+4 in the selected row. The write current is absorbed by the write word line sinker 24-n.

In the read operation, the row decoder 25-n selects one of the plurality of rows on the basis of a row address signal. The read word line driver 23B-n supplies a read voltage (="H") to the read word line RWLn in the selected row.

In the magnetic random access memory of this example, one terminal of each of the plurality of TMR elements in a read block is commonly connected. The other terminal of each of the TMR elements is connected to a corresponding one of the different read/write bit lines BL4(j−1)+1, BL4(j−1)+2, BL4(j−1)+3, and BL4(j−1)+4.

In this case, in the read operation, the read circuit 29B supplies a bias potential to all the read/write bit lines BL4(j−1)+1, BL4(j−1)+2, BL4(j−1)+3, and BL4(j−1)+4 in the column selected by the column select line signal CSLi.

Hence, in the read operation, the read current (read signal amount) can be stabilized.

② Device Structure

Figure 49:
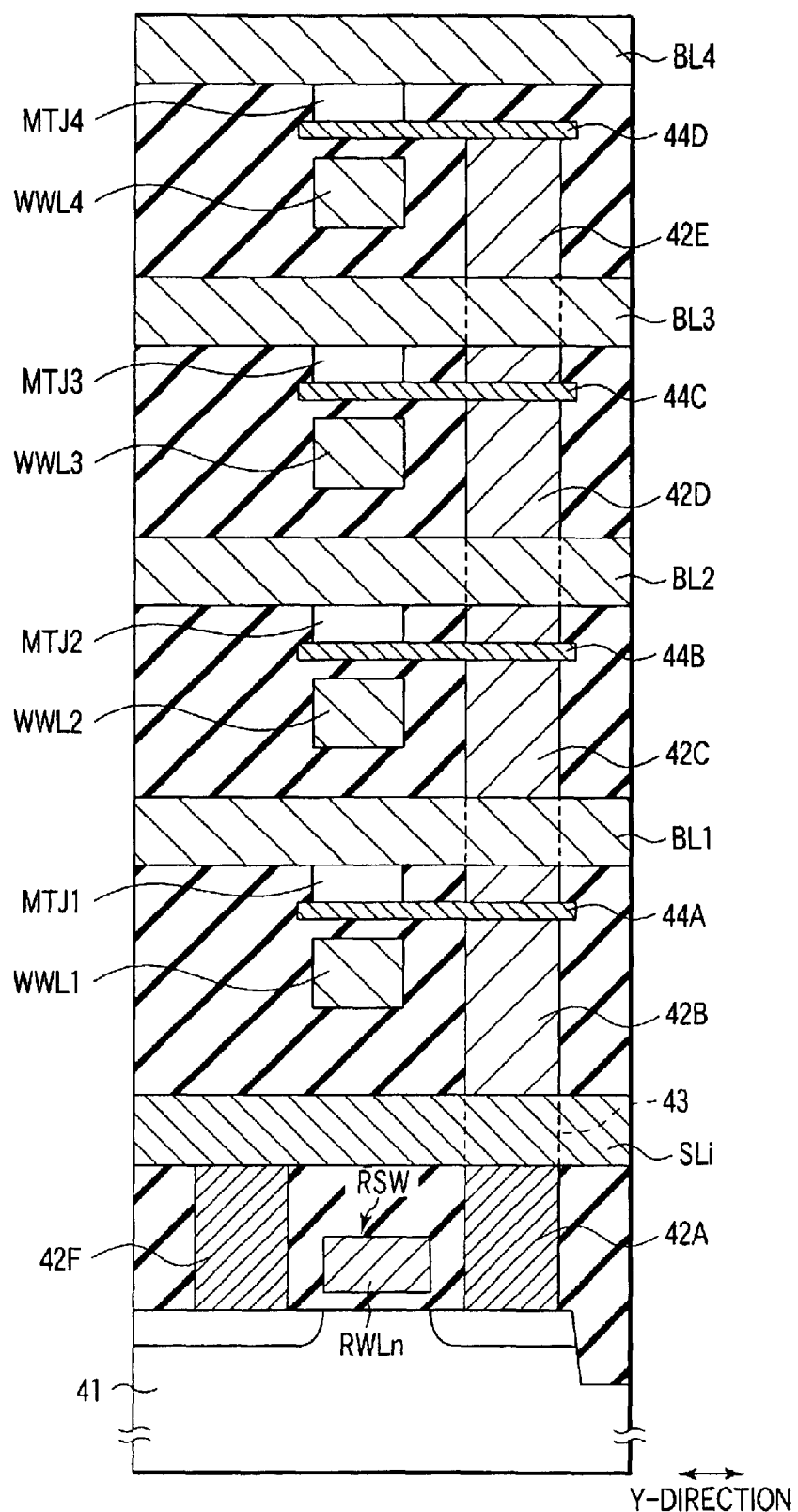
FIG. 49 is a sectional view showing an example of a Structure of a memory of FIG. 47.
Figure 50:
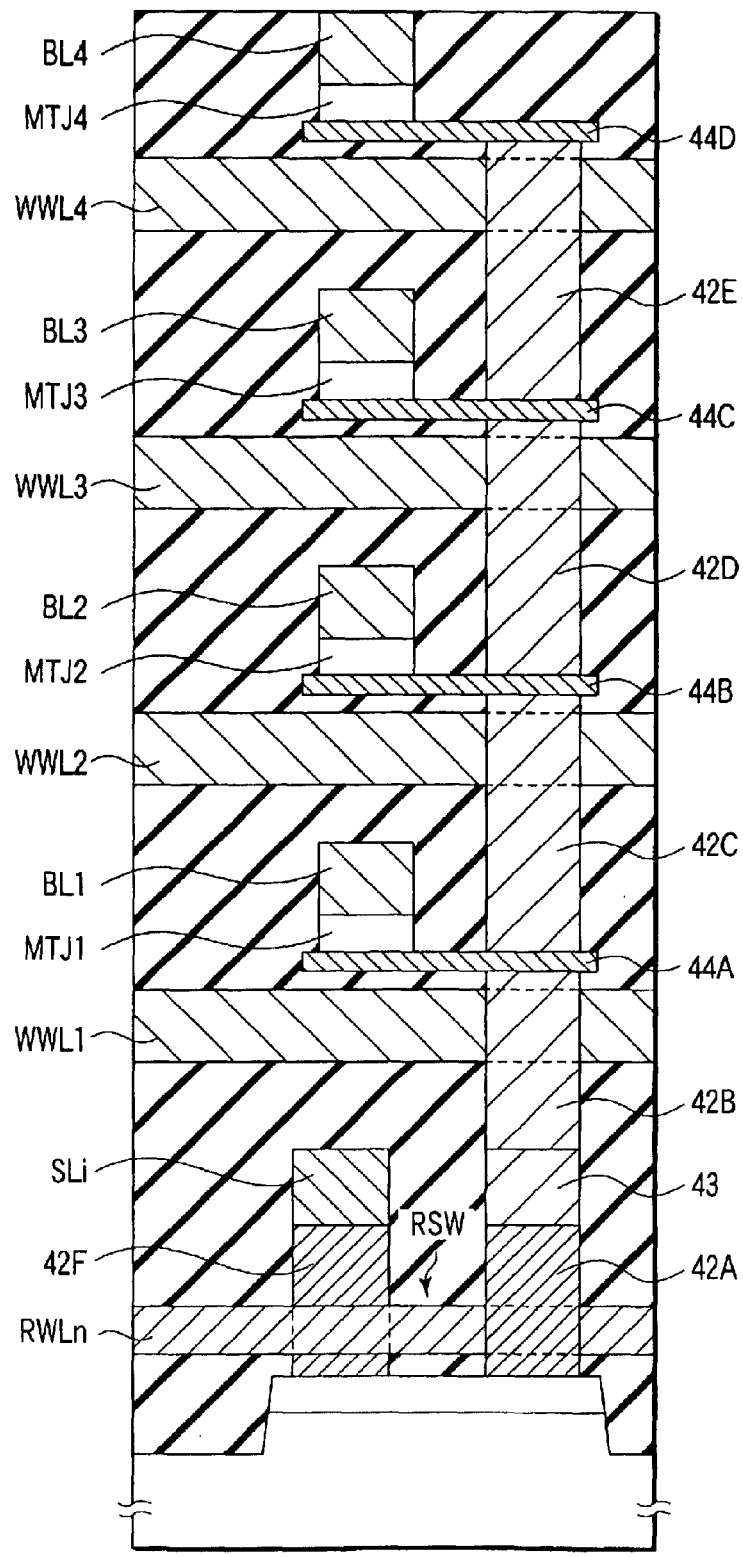
FIG. 50 is a plane view showing an example of a Structure of a memory of FIG. 47.

FIGS. 49 and 50 show the device structure of one block of the magnetic random access memory as Application Example 7 of the present invention.

FIG. 49 shows a Y-direction section of one block of the magnetic random access memory. FIG. 50 shows an X-direction section of one block of the magnetic random access memory. The same reference numerals as in FIGS. 47 and 48 denote the same elements in FIGS. 49 and 50 to show the correspondence between the elements.

The read select switch (MOS transistor) RSW is arranged in the surface region of a semiconductor substrate 41. The source of the read select switch RSW is connected to a source line SLi through a contact plug 42F. The source line SLi runs straight in, e.g., the Y-direction (column direction) and is connected to the ground point through a column select switch at the peripheral portion of the memory cell array region.

The gate of the read select switch (MOS transistor) RSW serves as the read word line RWLn. The read word line RWLn runs in the X-direction. Four TMR elements (MTJ (Magnetic Tunnel Junction) elements) MTJ1, MTJ2, MTJ3, and MTJ4 are stacked at a plurality of stages on the read select switch RSW.

One terminal (the lower end in this example) of each of the TMR elements MTJ1, MTJ2, MTJ3, and MTJ4 is connected to a corresponding one of lower electrodes 44A, 44B, 44C, and 44D. Contact plugs 42A, 42B, 42C, 42D, and 42E and intermediate layer 43 electrically connect the lower electrodes 44A, 44B, 44C, and 44D and also electrically connect the lower electrodes 44A, 44B, 44C, and 44D to the drain of the read select switch RSW.

The other terminal (the upper end in this example) of each of the TMR elements MTJ1, MTJ2, MTJ3, and MTJ4 is electrically connected to a corresponding one of read/write bit lines BL1, BL2, BL3, and BL4. The read/write bit lines BL1, BL2, BL3, and BL4 run in the Y-direction (column direction).

The TMR elements MTJ1, MTJ2, MTJ3, and MTJ4 are independently connected to the read/write bit lines BL1, BL2, BL3, and BL4, respectively. That is, the four read/write bit lines BL1, BL2, BL3, and BL4 are arranged in correspondence with the four TMR elements MTJ1, MTJ2, MTJ3, and MTJ4.

The write word lines WWL1, WWL2, WWL3, and WWL4 are arranged immediately under and near the TMR elements MTJ1, MTJ2, MTJ3, and MTJ4. The write word lines WWL1, WWL2, WWL3, and WWL4 run in the X-direction (row direction).

In this example, four write word lines WWL1, WWL2, WWL3, and WWL4 are arranged in correspondence with the four TMR elements MTJ1, MTJ2, MTJ3, and MTJ4.

In this example, the read/write bit lines BL1, BL2, BL3, and BL4 that run in the Y-direction are arranged above the TMR elements MTJ1, MTJ2, MTJ3, and MTJ4, respectively. The write word lines WWL1, WWL2, WWL3, and WWL4 that run in the X-direction are arranged under the TMR elements MTJ1, MTJ2, MTJ3, and MTJ4, respectively.

However, the positional relationship between the read/write bit lines BL1, BL2, BL3, and BL4 and the write word lines WWL1, WWL2, WWL3, and WWL4 with respect to the TMR elements is not limited to this.

For example, the read/write bit lines BL1, BL2, BL3, and BL4 that run in the Y-direction may be arranged under the TMR elements MTJ1, MTJ2, MTJ3, and MTJ4, respectively. The write word lines WWL1, WWL2, WWL3, and WWL4 that run in the X-direction may be arranged above the TMR elements MTJ1, MTJ2, MTJ3, and MTJ4, respectively.

For the write word lines, one write word line may be shared by a plurality of TMR elements (upper and lower TMR elements) in consideration of planarizing the insulating film immediately under the TMR elements 12 and reducing the manufacturing cost.

5 Others

In the above description, a TMR element is used as a memory cell of the magnetic random access memory. However, even when the memory cell is formed from a GMR (Giant MagnetoResistance) element, the present invention can be applied.

The structure of a TMR element or GMR element and the materials thereof are not particularly limited in applying the present invention.

As a switch used in the magnetic random access memory of the present invention, not only a MOS transistor but also a bipolar transistor, MIS (Metal Insulator Semiconductor) transistor (including a MOSFET), MES (Metal Semiconductor) transistor, or junction transistor can be used.

As has been described above, according to the present invention, any decrease in read signal amount can be suppressed even in a cross-point cell array structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   first interconnections;
   second interconnections which cross said first interconnections;
   memory cells which are arranged between said first interconnections and said second interconnections;
   a decoder configured to set a predetermined potential to a selected first interconnection, and to set a floating state to the first interconnections other than the selected first interconnection, when a read current is supplied between the selected first interconnection and a selected second interconnection;
   a bias circuit configured to apply a bias potential to non-selected second interconnections electrically connected to the selected first interconnection by respective memory cells, when the read current is supplied between the selected first interconnection and the selected second interconnection;
   a first precharge circuit configured to apply a first precharge potential to the first interconnections before setting the predetermined potential to the selected first interconnection, and setting the floating state to the first interconnections other than the selected first interconnection; and
   a second precharge circuit configured to apply a second precharge potential to the second interconnections before applying the bias potential to the non-selected second interconnections.

2. A memory according to claim 1, wherein the first precharge potential equals the second precharge potential.

3. A memory according to claim 1, wherein the second precharge potential equals the bias potential.

4. A memory according to claim 1, further comprising:
   read circuits connected to the second interconnections electrically connected to the selected first interconnection by the respective memory cells.

5. A memory according to claim 4, further comprising:
   a selector which selects one of said read circuits; and
   a buffer which outputs data detected by the selected read circuit.

6. A memory according to claim 4, further comprising:
   buffers which simultaneously output data detected by said read circuits.

7. A memory according to claim 4, wherein each of said read circuits has a sense amplifier, said sense amplifier comprising a first operational amplifier which equalizes a potential of one of said second interconnections with the bias potential and a differential amplifier which compares an output signal from said first operational amplifier with a reference potential.

8. A memory according to claim 7, wherein the reference potential is generated based on read data of at least one of a reference cell which has the same structure as that of said memory cells and is set in a first state and a reference cell which has the same structure as that of said memory cells and is set in a second state different from the first state.

9. A memory according to claim 7, further comprising:
   a reference potential generating circuit formed from a second operational amplifier which compares the bias potential with read data of a reference cell which has the same structure as that of said memory cells and is set in the first state and outputs the reference potential.

10. A memory according to claim 9, wherein
    a feedback resistance of said first operational amplifier is formed from k (k is an even number) resistive elements each having the same structure as that of said memory cells and set in the first state, and
    a feedback resistance of said second operational amplifier is formed from k/2 resistive elements each having the same structure as that of said memory cells and set in the first state, and from k/2 resistive elements each having the same structure as that of said memory cells and set in the second state different from the first state.

11. A memory according to claim 1, further comprising:
    a read circuit which is selectively connected to one of the second interconnections electrically connected to the selected first interconnection by the respective memory cells.

12. A memory according to claim 11, further comprising:
    a column select switch arranged between said read circuit and the second interconnections electrically connected to the selected first interconnection by the respective memory cells.

13. A memory according to claim 11, wherein said read circuit has a sense amplifier, said sense amplifier comprising a first operational amplifier which equalizes a potential of one of said second interconnections with the bias potential and a differential amplifier which compares an output signal from said first operational amplifier with a reference potential.

14. A memory according to claim 13, further comprising:
    a bias switch which applies the bias potential to second interconnections, which are not electrically connected to said read circuit, in the second interconnections electrically connected to the selected first interconnection by the respective memory cells.

15. A memory according to claim 13, wherein the reference potential is generated based on read data of at least one of a reference cell which has the same structure as that of said memory cells and is set in a first state and a reference cell which has the same structure as that of said memory cells and is set in a second state different from the first state.

16. A memory according to claim 13, further comprising:
a reference potential generating circuit formed from a second operational amplifier which compares the bias potential with read data of a reference cell which has the same structure as that of said memory cells and is set in the first state and outputs the reference potential.

17. A memory according to claim 16, wherein
a feedback resistance of said first operational amplifier is formed from k (k is an even number) resistive elements each having the same structure as that of said memory cells and set in the second state different from the first state, and
a feedback resistance of said second operational amplifier is formed from k/2 resistive elements each having the same structure as that of said memory cells and set in the first state, and from k/2 resistive elements each having the same structure as that of said memory cells and set in the second state.

18. A memory according to claim 1, wherein the read current flows from the selected second interconnection to the selected first interconnection.

19. A memory according to claim 1, wherein the read current flows from the selected first interconnection to the selected second interconnection.

20. A memory according to claim 1, wherein
each of said first interconnections is a word line, and
each of said second interconnections is a bit line.

21. A memory according to claim 1, wherein each of said memory cells is in direct contact with one of said first interconnections and one of said second interconnections.

22. A memory according to claim 1, wherein both of said first interconnections and said second interconnections function as write lines and read lines.

23. A memory according to claim 1, further comprising:
a driver/sinker which supplies a write current to one of said first interconnections.

24. A memory according to claim 1, further comprising:
a driver/sinker which supplies a write current having a direction corresponding to a value of write data to one of said second interconnections.

25. A memory according to claim 1, wherein the first precharge potential applies to the first interconnections electrically connected to the selected second interconnection by the respective memory cells, and the second precharge potential applies to the second interconnections electrically connected to the selected first interconnection by the respective memory cells.

26. A memory according to claim 1, wherein the first precharge potential applies to all of the first interconnections, and the second precharge potential applies to all of the second interconnections.

27. A magnetic random access memory comprising:
first interconnections;
second interconnections which cross said first interconnections;
memory cells which are arranged between said first interconnections and said second interconnections;
a decoder configured to set a predetermined potential to a selected first interconnection, and to set a floating state to the first interconnections other than the selected first interconnection, when a read current is supplied between the selected first interconnection and a selected second interconnection;
a bias circuit configured to apply a bias potential to non-selected second interconnections electrically connected to the selected first interconnection by respective memory cells, when the read current is supplied between the selected first interconnection and the selected second interconnection;
a first precharge circuit configured to apply a first precharge potential to the first interconnections before setting the predetermined potential to the selected first interconnection, and setting the floating state to the first interconnections other than the selected first interconnection;
a second precharge circuit configured to apply a second precharge potential to the second interconnections before applying the bias potential to the non-selected second interconnections; and
read circuits connected to the second interconnections electrically connected to the selected first interconnection by the respective memory cells, and each of said read circuits has a sense amplifier, said sense amplifier comprising a first operational amplifier which equalizes a potential of one of said second interconnections with the bias potential and a differential amplifier which compares an output signal from said first operational amplifier with a reference potential,
wherein the reference potential is generated based on read data of at least one of a reference cell which has the same structure as that of said memory cells and is set in a first state and a reference cell which has the same structure as that of said memory cells and is set in a second state different from the first state.

28. A memory according to claim 27, wherein the first precharge potential equals the second precharge potential.

29. A memory according to claim 27, wherein the second precharge potential equals the bias potential.

30. A memory according to claim 27, further comprising:
a selector which selects one of said read circuits; and
a buffer which outputs data detected by the selected read circuit.

31. A memory according to claim 27, further comprising:
buffers which simultaneously output data detected by said read circuits.

32. A memory according to claim 27, further comprising:
a reference potential generating circuit formed from a second operational amplifier which compares the bias potential with the read data of the reference cell which has the same structure as that of said memory cells and is set in the first state and outputs the reference potential.

33. A memory according to claim 32, wherein
a feedback resistance of said first operational amplifier is formed from k (k is an even number) resistive elements each having the same structure as that of said memory cells and set in the first state, and
a feedback resistance of said second operational amplifier is formed from k/2 resistive elements each having the same structure as that of said memory cells and set in the first state, and from k/2 resistive elements each having the same structure as that of said memory cells and set in the second state different from the first state.

34. A memory according to claim 27, wherein the read current flows from the selected second interconnection to the selected first interconnection.

35. A memory according to claim 27, wherein the read current flows from the selected first interconnection to the selected second interconnection.

36. A memory according to claim 27, wherein each of said first interconnections is a word line, and each of said second interconnections is a bit line.

37. A memory according to claim 27, wherein each of said memory cells is in direct contact with one of said first interconnections and one of said second interconnections.

38. A memory according to claim 27, wherein both of said first interconnections and said second interconnections function as write lines and read lines.

39. A memory according to claim 27, further comprising:

a driver/sinker which supplies a write current to one of said first interconnections.

40. A memory according to claim 27, further comprising:

a driver/sinker which supplies a write current having a direction corresponding to a value of write data to one of said second interconnections.

41. A memory according to claim 27, wherein the first precharge potential applies to the first interconnections electrically connected to the selected second interconnection by the respective memory cells, and the second precharge potential applies to the second interconnections electrically connected to the selected first interconnection by the respective memory cells.

42. A memory according to claim 27, wherein the first precharge potential applies to all of the first interconnections, and the second precharge potential applies to all of the second interconnections.

43. A magnetic random access memory comprising:

first interconnections;

second interconnections which cross said first interconnections;

memory cells which are arranged between said first interconnections and said second interconnections;

a decoder configured to set a predetermined potential to a selected first interconnection, and to set a floating state to the first interconnections other than the selected first interconnection, when a read current is supplied between the selected first interconnection and a selected second interconnection;

a bias circuit configured to apply a bias potential to non-selected second interconnections electrically connected to the selected first interconnection by respective memory cells, when the read current is supplied between the selected first interconnection and the selected second interconnection;

a first precharge circuit configured to apply a first precharge potential to the first interconnections before setting the predetermined potential to the selected first interconnection, and setting the floating state to the first interconnections other than the selected first interconnection;

a second precharge circuit configured to apply a second precharge potential to the second interconnections before applying the bias potential to the non-selected second interconnections; and a read circuit which is selectively connected to one of the second interconnections electrically connected to the selected first interconnection by the respective memory cells, and said read circuit has a sense amplifier, said sense amplifier comprising a first operational amplifier which equalizes a potential of one of said second interconnections with the bias potential and a differential amplifier which compares an output signal from said first operational amplifier with a reference potential, wherein the reference potential is generated based on read data of at least one of a reference cell which has the same structure as that of said memory cells and is set in a first state and a reference cell which has the same structure as that of said memory cells and is set in a second state different from the first state.

44. A memory according to claim 43, further comprising:

a column select switch arranged between said read circuit and the second interconnections electrically connected to the selected first interconnection by the respective memory cells.

45. A memory according to claim 43, further comprising:

a bias switch which applies the bias potential to second interconnections, which are not electrically connected to said read circuit, in the second interconnections electrically connected to the selected first interconnection by the respective memory cells.

46. A memory according to claim 43, further comprising:

a reference potential generating circuit formed from a second operational amplifier which compares the bias potential with the read data of the reference cell which has the same structure as that of said memory cells and is set in the first state and outputs the reference potential.

47. A memory according to claim 46, wherein a feedback resistance of said first operational amplifier is formed from k (k is an even number) resistive elements each having the same structure as that of said memory cells and set in the second state different from the first state, and a feedback resistance of said second operational amplifier is formed from k/2 resistive elements each having the same structure as that of said memory cells and set in the first state, and from k/2 resistive elements each having the same structure as that of said memory cells and set in the second state.

48. A memory according to claim 43, wherein the first precharge potential applies to the first interconnections electrically connected to the selected second interconnection by the respective memory cells, and the second precharge potential applies to the second interconnections electrically connected to the selected first interconnection by the respective memory cells.

49. A memory according to claim 43, wherein the first precharge potential applies to all of the first interconnections, and the second precharge potential applies to all of the second interconnections.

50. A magnetic random access memory comprising:

first interconnections;

second interconnections which cross said first interconnections;

memory cells which are arranged between said first interconnections and said second interconnections;

a decoder configured to set a predetermined potential to a selected first interconnection, and to a set floating state to the first interconnections other than the selected first interconnection, when a read current is supplied between the selected first interconnection and a selected second interconnection;

a bias circuit configured to apply a bias potential to non-selected second interconnections electrically connected to the selected first interconnection by respective memory cells, when the read current is supplied between the selected first interconnection and the selected second interconnection;

a first precharge circuit configured to apply a first precharge potential to the first interconnections before setting the predetermined potential to the selected first interconnection, and setting the floating state to the first interconnections other than the selected first interconnection;

a second precharge circuit configured to apply a second precharge potential to the second interconnections before applying the bias potential to the non-selected second interconnections;

read circuits connected to the second interconnections electrically connected to the selected first interconnection by the respective memory cells, and each of said read circuits has a sense amplifier, said sense amplifier comprising a first operational amplifier which equalizes a potential of one of said second interconnections with the bias potential and a differential amplifier which compares an output signal from said first operational amplifier with a reference potential; and a reference potential generating circuit formed from a second operational amplifier which compares the bias potential with read data of a reference cell which has the same structure as that of said memory cells and is set in the first state and outputs the reference potential.

51. A memory according to claim 50, wherein the first precharge potential equals the second precharge potential.

52. A memory according to claim 50, wherein the second precharge potential equals the bias potential.

53. A memory according to claim 50, further comprising:
a selector which selects one of said read circuits, and
a buffer which outputs data detected by the selected read circuit.

54. A memory according to claim 50, further comprising:
buffers which simultaneously output data detected by said read circuits.

55. A memory according to claim 50, wherein the reference potential is generated based on read data of at least one of a reference cell which has the same structure as that of said memory cells and is set in a first state and a reference cell which has the same structure as that of said memory cells and is set in a second state different from the first state.

56. A memory according to claim 50, wherein
a feedback resistance of said first operational amplifier is formed from k (k is an even number) resistive elements each having the same structure as that of said memory cells and set in the first state, and
a feedback resistance of said second operational amplifier is formed from k/2 resistive elements each having the same structure as that of said memory cells and set in the first state, and from k/2 resistive elements each having the same structure as that of said memory cells and set in the second state different from the first state.

57. A memory according to claim 50, wherein the read current flows from the selected second interconnection to the selected first interconnection.

58. A memory according to claim 50, wherein the read current flows from the selected first interconnection to the selected second interconnection.

59. A memory according to claim 50, wherein
the selected first interconnection is set at a predetermined potential, and
first interconnections other than the selected first interconnection are set in a floating state.

60. A memory according to claim 50, wherein
each of said first interconnections is a word line, and
each of said second interconnections is a bit line.

61. A memory according to claim 50, wherein each of said memory cells is in direct contact with one of said first interconnections and one of said second interconnections.

62. A memory according to claim 50, wherein both of said first interconnections and said second interconnections function as write lines and read lines.

63. A memory according to claim 50, further comprising:
a driver/sinker which supplies a write current to one of said first interconnections.

64. A memory according to claim 50, further comprising:
a driver/sinker which supplies a write current having a direction corresponding to a value of write data to one of said second interconnections.

65. A memory according to claim 50, wherein the first precharge potential applies to the first interconnections electrically connected to the selected second interconnection by the respective memory cells, and the second precharge potential applies to the second interconnections electrically connected to the selected first interconnection by the respective memory cells.

66. A memory according to claim 50, wherein the first precharge potential applies to all of the first interconnections, and the second precharge potential applies to all of the second interconnections.

67. A magnetic random access memory comprising:
first interconnections;
second interconnections which cross said first interconnections;
memory cells which are arranged between said first interconnections and said second interconnections;
a decoder configured to set a predetermined potential to a selected first interconnection, and to a set floating state to the first interconnections other than the selected first interconnection, when a read current is supplied between the selected first interconnection and a selected second interconnection;
a bias circuit configured to apply a bias potential to non-selected second interconnections electrically connected to the selected first interconnection by the respective memory cells, when the read current is supplied between the selected first interconnection and the selected second interconnection;
a first precharge circuit configured to apply a first precharge potential to the first interconnections before setting the predetermined potential to the selected first interconnection, and setting the floating state to the first interconnections other than the selected first interconnection;
a second precharge circuit configured to apply a second precharge potential to the second interconnections before applying the bias potential to the non-selected second interconnections;
a read circuit which is selectively connected to one of the second interconnections electrically connected to the selected first interconnection by the respective memory cells, and said read circuit has a sense amplifier, said sense amplifier comprising a first operational amplifier which equalizes a potential of one of said second interconnections with the bias potential and a differential amplifier which compares an output signal from said first operational amplifier with a reference potential; and a reference potential generating circuit formed from a second operational amplifier which compares the bias potential with read data of a reference cell which has the same structure as that of said memory cells and is set in the first state and outputs the reference potential.

68. A memory according to claim 67, further comprising:
a column select switch arranged between said read circuit and the second interconnections electrically connected to the selected first interconnection by the respective memory cells.

69. A memory according to claim 67, further comprising:
a bias switch which applies the bias potential to second interconnections, which are not electrically connected to said read circuit, in the second interconnections electrically connected to the selected first interconnection by the respective memory cells.

70. A memory according to claim 67, wherein the reference potential is generated based on read data of at least one of a reference cell which has the same structure as that of said memory cells and is set in a first state and a reference cell which has the same structure as that of said memory cells and is set in a second state different from the first state.

71. A memory according to claim 67, wherein
a feedback resistance of said first operational amplifier is formed from k (k is an even number) resistive elements each having the same structure as that of said memory cells and set in the second state different from the first state, and
a feedback resistance of said second operational amplifier is formed from k/2 resistive elements each having the same structure as that of said memory cells and set in the first state, and from k/2 resistive elements each having the same structure as that of said memory cells and set in the second state.

72. A memory according to claim 67, wherein the first precharge potential applies to the first interconnections electrically connected to the selected second interconnection by the respective memory cells, and the second precharge potential applies to the second interconnections electrically connected to the selected first interconnection by the respective memory cells.

73. A memory according to claim 67, wherein the first precharge potential applies to all of the first interconnections, and the second precharge potential applies to all of the second interconnections.

74. A magnetic random access memory comprising:
first interconnections;
second interconnections which cross said first interconnections;
memory cells which are arranged between said first interconnections and said second interconnections, and are connected to at least one of said first interconnections and said second interconnections;
a decoder configured to set a predetermined potential to a selected first interconnection, and to set a floating state to the first interconnections other than the selected first interconnection, when a read current is supplied between the selected first interconnection and a selected second interconnection;
a bias circuit configured to apply a bias potential to non-selected second interconnections electrically connected to the selected first interconnection by respective memory cells, when the read current is supplied between the selected first interconnection and the selected second interconnection;
a first precharge circuit configured to apply a first precharge potential to the first interconnections before setting the predetermined potential to the selected first interconnection, and setting the floating state to the first interconnections other than the selected first interconnection; and
a second precharge circuit configured to apply a second precharge potential to the second interconnections before applying the bias potential to the non-selected second interconnections.

75. A memory according to claim 74, wherein the first precharge potential equals the second precharge potential.

76. A memory according to claim 74, wherein the second precharge potential equals the bias potential.

77. A memory according to claim 74, further comprising:
read circuits connected to the second interconnections electrically connected to the selected first interconnection by the respective memory cells.

78. A memory according to claim 77, further comprising:
a selector which selects one of said read circuits, and
a buffer which outputs data detected by the selected read circuit.

79. A memory according to claim 77, further comprising:
buffers which simultaneously output data detected by said read circuits.

80. A memory according to claim 77, wherein each of said read circuits has a sense amplifier, said sense amplifier comprising a first operational amplifier which equalizes a potential of one of said second interconnections with the bias potential and a differential amplifier which compares an output signal from said first operational amplifier with a reference potential.

81. A memory according to claim 80, wherein the reference potential is generated based on read data of at least one of a reference cell which has the same structure as that of said memory cells and is set in a first state and a reference cell which has the same structure as that of said memory cells and is set in a second state different from the first state.

82. A memory according to claim 80, further comprising:
a reference potential generating circuit formed from a second operational amplifier which compares the bias potential with read data of a reference cell which has the same structure as that of said memory cells and is set in the first state and outputs the reference potential.

83. A memory according to claim 82, wherein
a feedback resistance of said first operational amplifier is formed from k (k is an even number) resistive elements each having the same structure as that of said memory cells and set in the first state, and
a feedback resistance of said second operational amplifier is formed from k/2 resistive elements each having the same structure as that of said memory cells and set in the first state, and from k/2 resistive elements each having the same structure as that of said memory cells and set in the second state different from the first state.

84. A memory according to claim 74, further comprising:
a read circuit which is selectively connected to one of the second interconnections electrically connected to the selected first interconnection by the respective memory cells.

85. A memory according to claim 84, further comprising:
a column select switch arranged between said read circuit and the second interconnections electrically connected to the selected first interconnection by the respective memory cells.

86. A memory according to claim 84, wherein said read circuit has a sense amplifier, said sense amplifier comprising a first operational amplifier which equalizes a potential of one of said second interconnections with the bias potential and a differential amplifier which compares an output signal from said first operational amplifier with a reference potential.

87. A memory according to claim 86, further comprising:
a bias switch which applies the bias potential to second interconnections, which are not electrically connected to said read circuit, in the second interconnections electrically connected to the selected first interconnection by the respective memory cells.

88. A memory according to claim 86, wherein the reference potential is generated based on read data of at least one of a reference cell which has the same structure as that of said memory cells and is set in a first state and a reference cell which has the same structure as that of said memory cells and is set in a second state different from the first state.

89. A memory according to claim 86, further comprising:
a reference potential generating circuit formed from a second operational amplifier which compares the bias potential with the read data of the reference cell which has the same structure as that of said memory cells and is set in the first state and outputs the reference potential.

90. A memory according to claim 89, wherein
a feedback resistance of said first operational amplifier is formed from k (k is an even number) resistive elements each having the same structure as that of said memory cells and set in the second state different from the first state, and
a feedback resistance of said second operational amplifier is formed from k/2 resistive elements each having the same structure as that of said memory cells and set in the first state, and from k/2 resistive elements each having the same structure as that of said memory cells and set in the second state.

91. A memory according to claim 74, wherein the read current flows from the selected second interconnection to the selected first interconnection.

92. A memory according to claim 74, wherein the read current flows from the selected first interconnection to the selected second interconnection.

93. A memory according to claim 74, wherein
each of said first interconnections is a word line, and
each of said second interconnections is a bit line.

94. A memory according to claim 74, wherein each of said memory cells is in direct contact with one of said first interconnections and one of said second interconnections.

95. A memory according to claim 74, wherein both of said first interconnections and said second interconnections function as write lines and read lines.

96. A memory according to claim 74, further comprising:
a driver/sinker which supplies a write current to one of said first interconnections.

97. A memory according to claim 74, further comprising:
a driver/sinker which supplies a write current having a direction corresponding to a value of write data to one of said second interconnections.

98. A memory according to claim 74, wherein the first precharge potential applies to the first interconnections electrically connected to the selected second interconnection by the respective memory cells, and the second precharge potential applies to the second interconnections electrically connected to the selected first interconnection by the respective memory cells.

99. A memory according to claim 74, wherein the first precharge potential applies to all of the first interconnections, and the second precharge potential applies to all of the second interconnections.

100. A read method of a magnetic random access memory by using a magnetoresistive effect, comprising:
executing a read operation for memory cells which are arranged between first interconnections and second interconnections crossing the first interconnections;
applying a first precharge potential to the first interconnections and a second precharge potential to the second interconnections;
setting a selected first interconnection at a predetermined potential, and setting the first interconnections other than the selected first interconnection in a floating state; and
applying a bias potential to non-selected second interconnections electrically connected to the selected first interconnection by respective memory cells, when a read current is supplied between the selected first interconnection and a selected second interconnection.

101. A method according to claim 100, wherein the first precharge potential equals the second precharge potential.

102. A method according to claim 100, wherein the second precharge potential equals the bias potential.

103. A method according to claim 100, wherein the read current is supplied from the selected second interconnection to the selected first interconnection.

104. A method according to claim 100, wherein the read current is supplied from the selected first interconnection to the selected second interconnection.

105. A method according to claim 100, wherein the first precharge potential applies to the first interconnections electrically connected to the selected second interconnection by the respective memory cells, and the second precharge potential applies to the second interconnections electrically connected to the selected first interconnection by the respective memory cells.

106. A method according to claim 100, wherein the first precharge potential applies to all of the first interconnections, and the second precharge potential applies to all of the second interconnections.

* * * * *